United States Patent
Endo

(10) Patent No.: US 9,196,639 B2
(45) Date of Patent: Nov. 24, 2015

(54) SEMICONDUCTOR DEVICE AND MANUFACTURING METHOD OF THE SAME

(71) Applicant: Semiconductor Energy Laboratory Co., Ltd., Atsugi-shi, Kanagawa-ken (JP)

(72) Inventor: Yuta Endo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/134,371

(22) Filed: Dec. 19, 2013

(65) Prior Publication Data

US 2014/0183523 A1 Jul. 3, 2014

(30) Foreign Application Priority Data

Dec. 28, 2012 (JP) ................................ 2012-288968
Mar. 12, 2013 (JP) ................................ 2013-049065

(51) Int. Cl.
*H01L 27/12* (2006.01)
*H01L 29/786* (2006.01)

(52) U.S. Cl.
CPC ........ *H01L 27/1255* (2013.01); *H01L 27/1225* (2013.01); *H01L 27/1259* (2013.01); *H01L 29/7869* (2013.01); *H01L 29/78603* (2013.01); *H01L 29/78606* (2013.01)

(58) Field of Classification Search
CPC ......................... H01L 27/1255; H01L 27/1225
USPC .............................................. 257/43, E29.296
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Yu-Hsi D Sun
*Assistant Examiner* — Ankush Singal
(74) *Attorney, Agent, or Firm* — Eric J. Robinson; Robinson Intellectual Property Law Office, P.C.

(57) ABSTRACT

A semiconductor device with high aperture ratio is provided. The semiconductor device includes a nitride insulating film, a transistor over the nitride insulating film, and a capacitor including a pair of electrodes over the nitride insulating film. An oxide semiconductor layer is used for a channel formation region of the transistor and one of the electrodes of the capacitor. A transparent conductive film is used for the other electrode of the capacitor. One electrode of the capacitor is in contact with the nitride insulating film, and the other electrode of the capacitor is electrically connected to one of a source electrode and a drain electrode of the transistor.

20 Claims, 39 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,102,476 B2 | 1/2012 | Son et al. |
| 8,202,365 B2 | 6/2012 | Umeda et al. |
| 8,253,135 B2 | 8/2012 | Uochi et al. |
| 8,274,078 B2 | 9/2012 | Itagaki et al. |
| 8,476,625 B2 | 7/2013 | Kimura |
| 8,558,960 B2 | 10/2013 | Yamazaki et al. |
| 8,728,883 B2 | 5/2014 | Yamazaki et al. |
| 8,883,556 B2 | 11/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0265254 A1 | 10/2008 | Nishiura |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072468 A1* | 3/2010 | Yamazaki et al. .............. 257/43 |
| 2010/0092800 A1 | 4/2010 | Itagaki et al. |
| 2010/0109002 A1 | 5/2010 | Itagaki et al. |
| 2010/0140613 A1 | 6/2010 | Kimura |
| 2010/0163874 A1 | 7/2010 | Koyama et al. |
| 2010/0244021 A1 | 9/2010 | Uochi et al. |
| 2010/0320458 A1 | 12/2010 | Umeda et al. |
| 2010/0320459 A1 | 12/2010 | Umeda et al. |
| 2011/0032435 A1 | 2/2011 | Kimura |
| 2011/0057918 A1 | 3/2011 | Kimura et al. |
| 2011/0085104 A1* | 4/2011 | Arasawa et al. ............... 349/43 |
| 2012/0058598 A1* | 3/2012 | Yamazaki ..................... 438/104 |
| 2012/0061664 A1* | 3/2012 | Yamazaki et al. .............. 257/43 |
| 2012/0061673 A1* | 3/2012 | Yamazaki et al. .............. 257/59 |
| 2012/0062811 A1 | 3/2012 | Miyake |
| 2012/0064650 A1* | 3/2012 | Yamazaki et al. .............. 438/30 |
| 2012/0146035 A1* | 6/2012 | Kuwabara ..................... 257/59 |
| 2012/0305914 A1 | 12/2012 | Uochi et al. |
| 2013/0280858 A1 | 10/2013 | Kimura |
| 2014/0017834 A1 | 1/2014 | Yamazaki et al. |
| 2014/0042443 A1 | 2/2014 | Yamazaki |
| 2014/0061654 A1* | 3/2014 | Yamazaki et al. .............. 257/59 |
| 2014/0132643 A1 | 5/2014 | Yamazaki et al. |
| 2014/0152685 A1 | 6/2014 | Iwaki |
| 2014/0175433 A1* | 6/2014 | Yamazaki et al. .............. 257/43 |
| 2014/0183528 A1* | 7/2014 | Endo .............................. 257/43 |
| 2014/0239298 A1 | 8/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-241687 A | 8/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-123861 A | 5/2007 |
| JP | 2012-083738 A | 4/2012 |

(56) References Cited

FOREIGN PATENT DOCUMENTS

| JP | 2012-084865 A | 4/2012 |
|----|---------------|--------|
| JP | 2012-134467 A | 7/2012 |
| JP | 2012-151461 A | 8/2012 |
| JP | 2012-191025 A | 10/2012 |
| WO | WO-2004/114391 | 12/2004 |
| WO | WO-2012/073918 | 6/2012 |
| WO | WO-2012/090973 | 7/2012 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, andYb2Fe3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T at al., "Full-Functional System Liquid Crystal Display Using CG-Silicon Technology", SID Digest '04 : SID International Symposium Digest of Technical Papers, 2004, vol. 35, pp. 860-863.

Nomura.K at al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hoson.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M "SUFTLA Flexible Microelectronics On Their Way To Business", SID Digest '07 : SID International Symposium Digest Of Technical Papers, 2007, vol. 38, pp. 1673-1676.

Kurokawa.Y et al., "UHF RFCPUS on Flexible And Glass Substrates for Secure RFID Systems", Journal Of Solid-State Circuits , 2008, vol. 43, No. 1, pp. 292-299.

Jeong.J et al., "3.1 Distinguished Paper: 12-1 Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel using IgZO Oxide TFT", SID Digest '08 : SID International Symposium Digest of Technical Papers, May 20, 2008, vol. 39, pp. 625-628.

Park. J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IgZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display with Driver Circuit Using Amorphous In—Ga—Zn—Oxide TFTs", IDW'09 : Proceedings of the 16th International Display workshops, 2009, pp. 689-692.

Asaoka.Y et al., "229.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D. et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Sized AMOLED Displays", IDW'08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

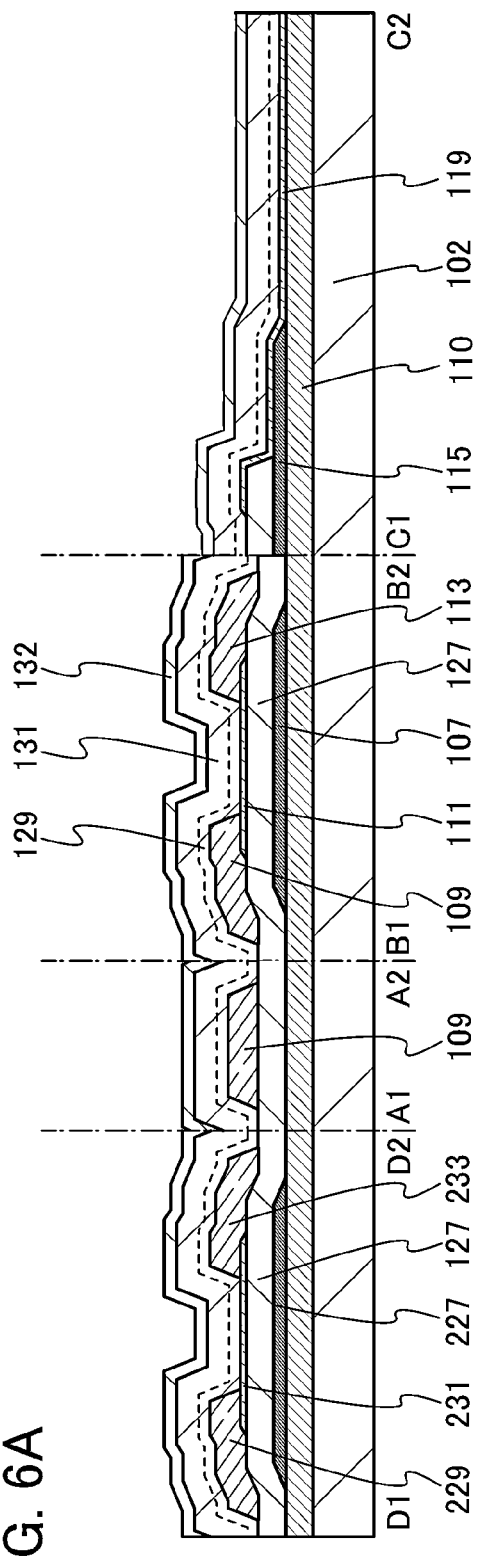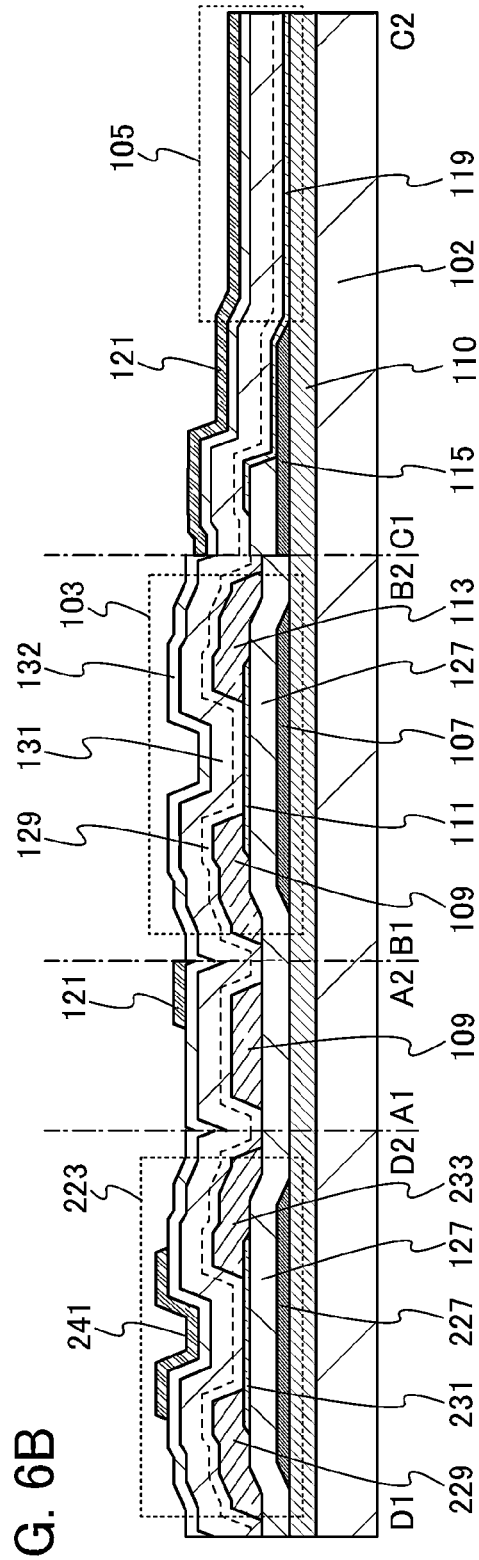

Point 1

Point 2

Point 3

Point 4

FIG. 33A1
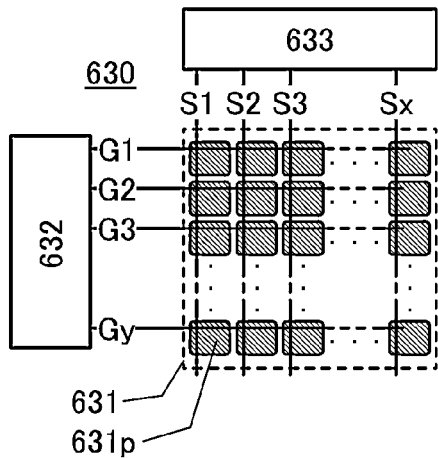
FIG. 33A2
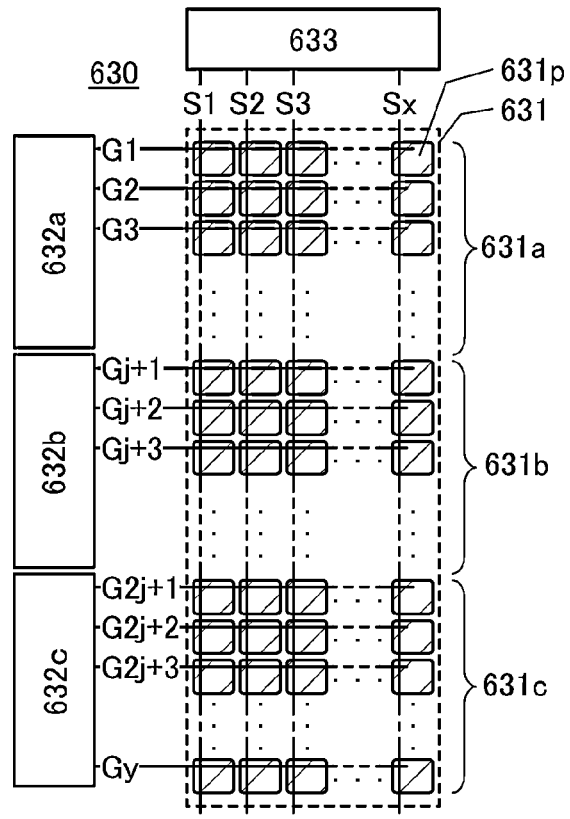
FIG. 33B1
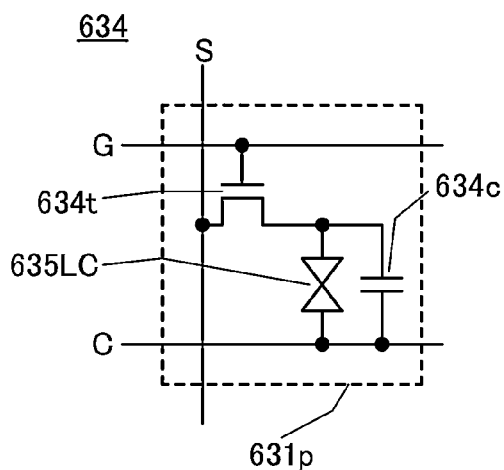
FIG. 33B2
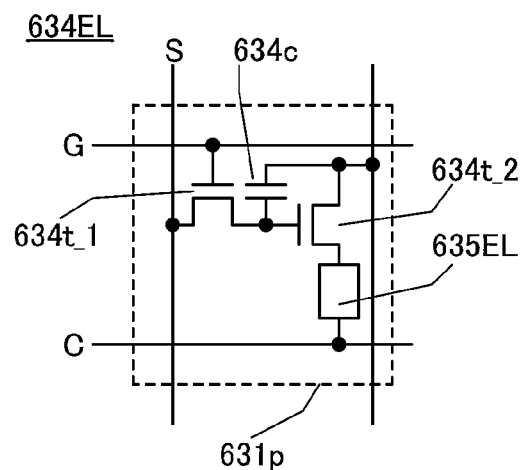

FIG. 35A1
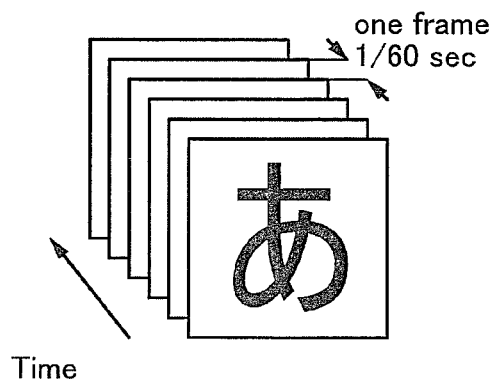
Time
FIG. 35A2
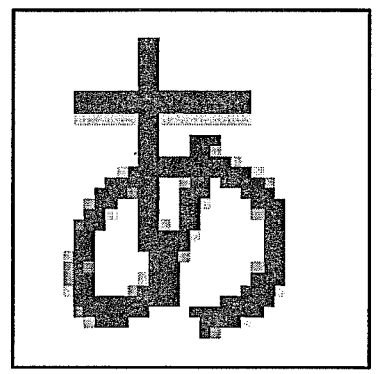
FIG. 35B1
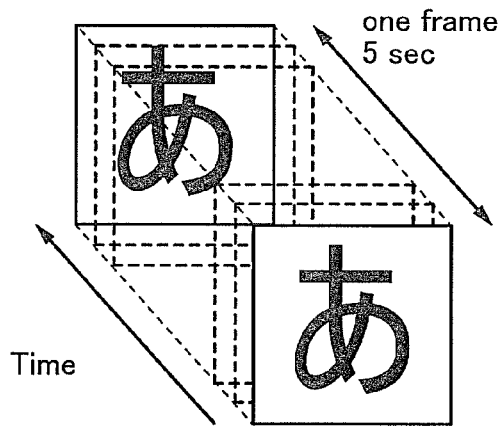
Time
FIG. 35B2
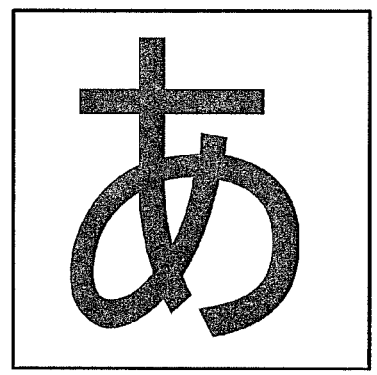

SEMICONDUCTOR DEVICE AND MANUFACTURING METHOD OF THE SAME

BACKGROUND OF THE INVENTION

1. Field of the Invention

The present invention relates to an object, a method, a manufacturing method, a process, a machine, manufacture, or a composition of matter. In particular, the present invention relates to, for example, a semiconductor device, a display device, a light-emitting device, a driving method thereof, or a manufacturing method thereof. In particular, the present invention relates to, for example, a semiconductor device, a display device, or a light-emitting device each including an oxide semiconductor, and a manufacturing method thereof.

2. Description of the Related Art

In recent years, flat panel displays such as liquid crystal displays (LCDs) have been widespread. In a display device such as a flat panel display, pixels are arranged in the row direction and the column direction, and each pixel includes a transistor serving as a switching element, a liquid crystal element electrically connected to the transistor, and a capacitor connected to the liquid crystal element in parallel.

A semiconductor film of the transistor is generally formed using a silicon semiconductor such as amorphous silicon or polysilicon (polycrystalline silicon).

Metal oxides having semiconductor characteristics (hereinafter referred to as oxide semiconductors) can also be used for semiconductor films of transistors. For example, techniques for forming transistors including zinc oxide or an In—Ga—Zn-based oxide semiconductor are disclosed (see Patent Documents 1 and 2).

REFERENCES

Patent Documents

[Patent Document 1] Japanese Published Patent Application No. 2007-123861
[Patent Document 2] Japanese Published Patent Application No. 2007-96055

SUMMARY OF THE INVENTION

In a capacitor, a dielectric film is provided between a pair of electrodes at least one of which is formed of the same material as a gate electrode, a source electrode, a drain electrode, or the like of a transistor in many cases, and thus formed using a light-blocking film such as a metal film.

With an increase in the capacitance value of a capacitor, the alignment of liquid crystal molecules of a liquid crystal element can be kept constant for a longer period in the state where an electric field is applied. When the period can be made longer in a display device capable of displaying still images, the number of times of rewriting image data can be reduced, leading to a reduction in power consumption.

One of the methods for increasing the charge capacity of a capacitor is to increase the area occupied by the capacitor in a pixel, specifically, to increase the area of a region where a pair of electrodes overlap with each other. However, when the area of the light-blocking conductive film is increased in the display device in order to increase the area of the region where the pair of electrodes overlap with each other, the aperture ratio of the pixel decreases, causing degradation of display quality of an image.

Thus, in view of the above problems, an object of one embodiment of the present invention is to provide a semiconductor device or the like with high aperture ratio. Another object of one embodiment of the present invention is to provide a semiconductor device or the like including a capacitor whose charge capacity can be increased. Another object of one embodiment of the present invention is to provide a semiconductor device or the like that can be manufactured with a smaller number of masks in a photolithography step. Another object of one embodiment of the present invention is to provide a semiconductor device or the like with low off-state current. Another object of one embodiment of the present invention is to provide a semiconductor device or the like consuming less power. Another object of one embodiment of the present invention is to provide a semiconductor device or the like using a transparent semiconductor layer. Another object of one embodiment of the present invention is to provide a semiconductor device or the like with high reliability. Another object of one embodiment of the present invention is to provide an eye-friendly semiconductor device or the like. Another object of one embodiment of the present invention is to provide a novel semiconductor device or the like. Another object of one embodiment of the present invention is to provide a method for manufacturing a novel semiconductor device or the like.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention relates to a semiconductor device including a light-transmitting capacitor one electrode of which is an oxide semiconductor layer and the other electrode of which is a light-transmitting conductive film.

One embodiment of the present invention is a semiconductor device including a transistor. The semiconductor device includes a gate electrode layer, a first wiring, and a first oxide semiconductor layer electrically connected to the first wiring, which are over a first insulating film; a second insulating film over the gate electrode layer and the first wiring; a second oxide semiconductor layer which is over the second insulating film and overlaps with the gate electrode layer; a source electrode layer and a drain electrode layer which are electrically connected to the second oxide semiconductor layer; a third insulating film over the first oxide semiconductor layer, the second oxide semiconductor layer, the second insulating film, the source electrode layer, and the drain electrode layer; a fourth insulating film over the third insulating film; and a transparent conductive film which is over the fourth insulating film and overlaps with the first oxide semiconductor layer. The semiconductor device also includes a capacitor one electrode of which is the first oxide semiconductor layer, a dielectric of which is the third insulating film and the fourth insulating film, and the other electrode of which is the transparent conductive film.

The first oxide semiconductor layer and the second oxide semiconductor layer are preferably formed using the same material.

The first oxide semiconductor layer and the second oxide semiconductor layer preferably have an energy gap of 2.0 eV or more.

The first insulating film preferably has a single-layer structure or a layered structure including a nitride insulating material selected from silicon nitride oxide, silicon nitride, aluminum nitride, and aluminum nitride oxide.

The third insulating film preferably has a single-layer structure or a layered structure including an oxide insulating material selected from silicon oxide, silicon oxynitride, aluminum oxide, hafnium oxide, gallium oxide, and a Ga—Zn-based metal oxide.

The fourth insulating film preferably has a single-layer structure or a layered structure including a nitride insulating material selected from silicon nitride oxide, silicon nitride, aluminum nitride, and aluminum nitride oxide.

The gate electrode layer and the first wiring are preferably formed using the same material.

The transparent conductive film may be electrically connected to one of the source electrode and the drain electrode.

The first wiring and the first oxide semiconductor layer may be in direct contact with each other so as to be electrically connected to each other.

The first wiring and the first oxide semiconductor layer may be electrically connected to each other through the second wiring provided therebetween.

Another embodiment of the present invention is a method for manufacturing a semiconductor device, including the steps of forming a gate electrode layer and a first wiring over a first insulating film; forming a second insulating film over the first insulating film, the gate electrode layer, and the first wiring; selectively etching the second insulating film so as to expose part of the first wiring and part of the first insulating film; forming a first oxide semiconductor layer over the exposed part of the first wiring and the exposed part of the first insulating film, and forming a second oxide semiconductor layer over the second insulating film so as to overlap with the gate electrode layer; forming a source electrode layer and a drain electrode layer which are electrically connected to the second oxide semiconductor layer; forming a third insulating film over the first oxide semiconductor layer, the second oxide semiconductor layer, the second insulating film, the source electrode layer, and the drain electrode layer; forming a fourth insulating film over the third insulating film; forming an opening in the third insulating film and the fourth insulating film so as to reach the source electrode layer or the drain electrode layer; and forming a transparent conductive film over the fourth insulating film so as to be electrically connected to the source electrode layer or the drain electrode layer through the opening and to overlap with the first oxide semiconductor layer, whereby forming a transistor, and forming a capacitor one electrode of which is the first oxide semiconductor layer, a dielectric of which is the third insulating film and the fourth insulating film, and the other electrode of which is the transparent conductive film.

The first oxide semiconductor layer and the second oxide semiconductor layer are preferably formed using the same material.

The first oxide semiconductor layer and the second oxide semiconductor layer preferably have an energy gap of 2.0 eV or more.

The first insulating film preferably has a single-layer structure or a layered structure including a nitride insulating material selected from silicon nitride oxide, silicon nitride, aluminum nitride, and aluminum nitride oxide.

The third insulating film preferably has a single-layer structure or a layered structure including an oxide insulating material selected from silicon oxide, silicon oxynitride, aluminum oxide, hafnium oxide, gallium oxide, and a Ga—Zn-based metal oxide.

The fourth insulating film preferably has a single-layer structure or a layered structure including a nitride insulating material selected from silicon nitride oxide, silicon nitride, aluminum nitride, and aluminum nitride oxide.

The gate electrode layer and the first wiring are preferably formed using the same material.

The first wiring and the first oxide semiconductor layer may be in direct contact with each other so as to be electrically connected to each other.

The first wiring and the first oxide semiconductor layer may be electrically connected to each other through the second wiring provided therebetween.

One embodiment of the present invention provides a semiconductor device or the like with high aperture ratio. One embodiment of the present invention provides a semiconductor device or the like including a capacitor whose charge capacity can be increased. One embodiment of the present invention provides a semiconductor device or the like that can be manufactured with a smaller number of masks in a photolithography step. One embodiment of the present invention provides a semiconductor device or the like with low off-state current. One embodiment of the present invention provides a semiconductor device or the like consuming less power. One embodiment of the present invention provides a semiconductor device or the like using a transparent semiconductor layer. One embodiment of the present invention provides a semiconductor device or the like with high reliability. One embodiment of the present invention is to provide an eye-friendly semiconductor device. One embodiment of the present invention provides a method for manufacturing a semiconductor device.

BRIEF DESCRIPTION OF THE DRAWINGS

In the accompanying drawings:

FIGS. 6A and 6B show cross-sectional views illustrating a method for manufacturing a semiconductor device;

FIGS. 33A-1 and 33A-2 show block diagrams and FIGS. 33B-1 and 33B-2 show circuit diagrams illustrating structures of a display portion of the information processor;

FIGS. 35A-1 and 35A-2 and FIGS. 35B-1 and 35B-2 show the effect of an information processor;

DETAILED DESCRIPTION OF THE INVENTION

Figure 1:
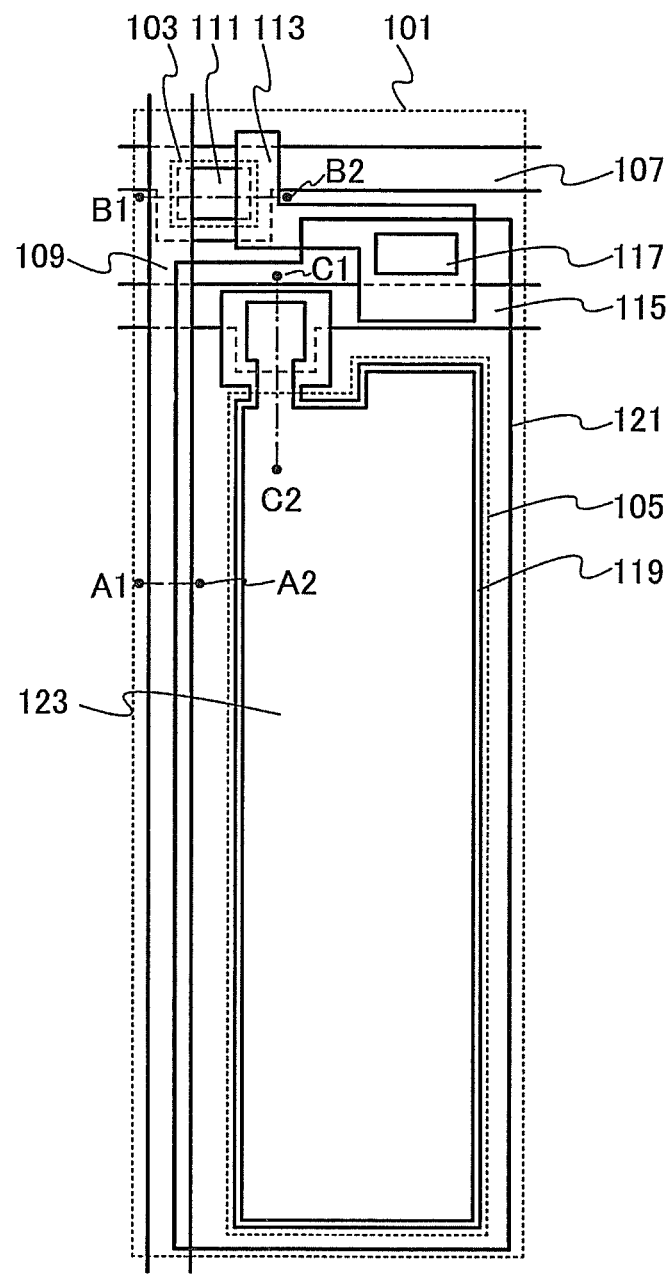
FIG. 1 shows a top view illustrating a semiconductor device.

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments below.

In the structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

In each drawing described in this specification, the size, the film thickness, or the region of each component is exaggerated for clarity in some cases. Therefore, embodiments of the present invention are not limited to such scales.

The ordinal numbers such as "first" and "second in this specification and the like are used for convenience and do not indicate the order of steps or the stacking order of layers. In addition, the ordinal numbers in this specification do not denote particular names which specify the present invention.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or voltage, and a potential and a voltage are used as synonymous words in many cases. Thus, in this specification, a potential may be rephrased as a voltage and a voltage may be rephrased as a potential unless otherwise specified.

In this specification, in the case where etching treatment is performed after a photolithography process, a mask formed by the photolithography process is removed.

Embodiment 1

In this embodiment, a semiconductor device that is one embodiment of the present invention will be described with reference to drawings. Note that in this embodiment, a liquid crystal display device will be described as an example of the semiconductor device of one embodiment of the present invention. Note that the semiconductor device of one embodiment of the present invention can be used for other display devices.

Figure 3:
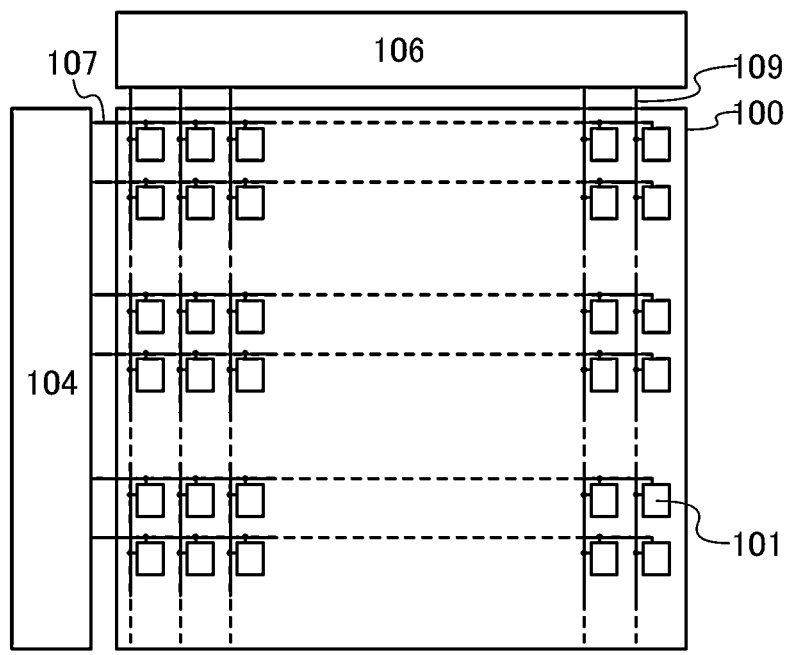
FIG. 3 shows a diagram illustrating a semiconductor device.

FIG. 3 illustrates an example of the semiconductor device of one embodiment of the present invention. The semiconductor device illustrated in FIG. 3 includes a pixel portion 100; a first driver circuit 104; a second driver circuit 106; m scan lines 107 which are arranged in parallel or almost in parallel to each other and whose potentials are controlled by the first driver circuit 104; and n signal lines 109 which are arranged in parallel or almost in parallel to each other and whose potentials are controlled by the second driver circuit 106. The pixel portion 100 includes a plurality of pixels 101 arranged in a matrix. The semiconductor device also includes capacitor lines 115 (not illustrated in FIG. 3). The capacitor lines 115 are arranged in parallel or almost in parallel to the scan lines 107 or the signal lines 109.

Each scan line 107 is electrically connected to the n pixels 101 in the corresponding row among the pixels 101 arranged in m rows and n columns in the pixel portion 100. Each signal line 109 is electrically connected to the m pixels 101 in the corresponding column among the pixels 101 arranged in m rows and n columns. Note that m and n are each an integer of 1 or more. Each capacitor line 115 is electrically connected to the n pixels 101 in the corresponding row among the pixels 101 arranged in m rows and n columns. Note that in the case where the capacitor lines 115 are arranged in parallel or almost in parallel to the signal lines 109, each capacitor line 115 is electrically connected to the m pixels 101 in the corresponding column among the pixels 101 arranged in m rows and n columns.

Note that the first driver circuit 104 may have a function of supplying a signal for switching a transistor connected to the scan line 107; for example, may serve as a scan line driver circuit. Further, the second driver circuit 106 may have a function of supplying an image signal to a transistor connected to the signal line 109; for example, may serve as a signal line driver circuit. Note that the first driver circuit 104 and the second driver circuit 106 may supply another signal without limitation to the above.

Since the liquid crystal display device is described as an example in this embodiment, the wirings connected to the first driver circuit 104 are referred to as the scan line 107 and the capacitor line 115 and the wiring connected to the second driver circuit 106 is referred to as the signal line 109 for convenience; however, the functions of the wirings are not limited by the names.

FIG. 1 shows a top view illustrating an example of a structure of the pixel 101 included in the above semiconductor device. Note that in FIG. 1, a liquid crystal element and one of a pair of electrodes connected to the liquid crystal element are omitted.

In the pixel 101 illustrated in FIG. 1, the scan line 107 extends in the direction substantially perpendicular to the signal line 109 (in the horizontal direction in the drawing). The signal line 109 extends in the direction substantially perpendicular to the scan line 107 (in the vertical direction in the drawing). The capacitor line 115 extends in the direction parallel to the scan line 107. Note that the scan line 107 is electrically connected to the first driver circuit 104 (see FIG. 3) and the scan line 109 is electrically connected to the second driver circuit 106 (see FIG. 3).

The transistor 103 is provided in the vicinity of a region where the scan line 107 intersects the signal line 109. The transistor 103 includes at least an oxide semiconductor film 111 including a channel formation region, a gate electrode, a gate insulating film (not illustrated in FIG. 1), a source electrode, and a drain electrode. A portion of the scan line 107 which overlaps with the oxide semiconductor film 111 functions as the gate electrode of the transistor 103. A portion of the signal line 109 which overlaps with the oxide semiconductor film 111 functions as one of the source electrode and the drain electrode of the transistor 103. A portion of a conductive film 113 which overlaps with the oxide semiconductor film 111 functions as the other of the source electrode and the drain electrode of the transistor 103. Thus, the gate electrode, the source electrode, and the drain electrode are referred to as the scan line 107, the signal line 109, and the conductive film 113, respectively, in some cases. Further, in FIG. 1, an edge of the scan line 107 is on the outer side of an edge of the oxide semiconductor film 111 when seen from above. Thus, the scan line 107 functions as a light-blocking film for blocking light from a light source such as a backlight. For this reason, the oxide semiconductor film 111 included in the transistor is not irradiated with light, so that variation in the electrical characteristics of the transistor can be reduced.

In one embodiment of the present invention, an oxide semiconductor is preferably used for the oxide semiconductor film 111. When a transistor is manufactured using an oxide semiconductor under the optimum conditions, the off-state current of the transistor can be significantly reduced, leading to a reduction in the power consumption of the semiconductor device.

Note that the transistor including an oxide semiconductor used in one embodiment of the present invention is an n-channel transistor. Oxygen vacancies in an oxide semiconductor might generate carriers, which might cause to degrade the electrical characteristics and reliability of the transistor. For example, in some cases, the threshold voltage of the transistor shifts in the negative direction, and drain current flows when gate voltage is 0 V. A transistor in which drain current flows when gate voltage is 0 V is referred to as a normally-on transistor, whereas a transistor in which substantially no drain current flows when gate voltage is 0 V is referred to as a normally-off transistor.

Accordingly, when an oxide semiconductor is used for the oxide semiconductor film 111, it is preferable that defects (typically oxygen vacancies) in the oxide semiconductor film 111 be reduced as much as possible. For example, it is preferable that the spin density of the oxide semiconductor film (the density of defects in the oxide semiconductor film) at a g-value of 1.93 in electron spin resonance spectroscopy in which a magnetic field is applied in parallel to the film surface be reduced to lower than or equal to the lower detection limit of measurement equipment. When the defects in the oxide semiconductor film are reduced as much as possible, the transistor 103 can be prevented from being normally on, leading to an improvement in the electrical characteristics and reliability of the semiconductor device.

The shift of the threshold voltage of a transistor in the negative direction is caused in some cases by hydrogen (including a hydrogen compound such as water) contained in an oxide semiconductor as well as by oxygen vacancies. Part of hydrogen contained in the oxide semiconductor contributes to the formation of donor levels to generate electrons serving as carriers. Thus, a transistor including an oxide semiconductor that contains hydrogen is likely to be normally on.

In view of the above, when an oxide semiconductor is used for the oxide semiconductor film 111, it is preferable that hydrogen in the oxide semiconductor film 111 be reduced as much as possible. Specifically, the oxide semiconductor film 111 is formed so as to have a region where the concentration of hydrogen measured by secondary ion mass spectrometry (SIMS) is lower than $5\times10^{18}$ atoms/cm$^3$, preferably lower than or equal to $1\times10^{18}$ atoms/cm$^3$, more preferably lower than or equal to $5\times10^{17}$ atoms/cm$^3$, and still more preferably lower than or equal to $1\times10^{16}$ atoms/cm$^3$.

Furthermore, the oxide semiconductor film 111 is preferably formed so as to have a region where the concentration of alkali metals or alkaline earth metals which is measured by secondary ion mass spectrometry (SIMS) is lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistor 103 might be increased.

Further, when nitrogen is contained in the oxide semiconductor film 111, electrons serving as carriers are generated and the carrier density increases, so that the semiconductor film easily becomes n-type. Thus, a transistor including an oxide semiconductor which contains nitrogen is likely to be normally on. For this reason, nitrogen in the oxide semiconductor film 111 is preferably reduced as much as possible; for example, the oxide semiconductor film 111 is preferably formed so as to have a region where the concentration of nitrogen is lower than or equal to $5\times10^{18}$ atoms/cm$^3$.

When such an oxide semiconductor film highly purified by reducing impurities (such as hydrogen, nitrogen, an alkali metal, and an alkaline earth metal) as much as possible is used as the oxide semiconductor film 111, the transistor 103 can be prevented from being normally on, so that the off-state current of the transistor 103 can be significantly reduced. Accordingly, a semiconductor device having good electrical characteristics can be manufactured. Further, a semiconductor device with improved reliability can be manufactured.

Various experiments can prove the low off-state current of a transistor including a highly purified oxide semiconductor film. For example, even when an element has a channel width of $1\times10^6$ μm and a channel length (L) of 10 μm, the off-state current can be made less than or equal to the measurement limit of a semiconductor parameter analyzer, i.e., less than or equal to $1\times10^{-13}$ A, at a voltage (drain voltage) between the source electrode and the drain electrode of 1 V to 10 V. In this case, it can be found that the off-state current corresponding to a value obtained by dividing the off-state current by the channel width of the transistor is lower than or equal to 100 zA/mm Further, the off-state current was measured with the use of a circuit in which a capacitor and a transistor are connected to each other and charge that flows in or out from the capacitor is controlled by the transistor. In the measurement, a highly purified oxide semiconductor film was used for a channel formation region of the transistor, and the off-state current of the transistor was measured from a change in the amount of charge of the capacitor per unit time. As a result, it was found that in the case where the voltage between the source electrode and the drain electrode of the transistor was 3 V, an extremely low off-state current of several tens of yoctoamperes per micrometer (yA/μm) was able to be obtained. Thus, it can be said that the transistor including the highly purified oxide semiconductor film has a significantly low off-state current.

In FIG. 1, the conductive film 113 is electrically connected to a pixel electrode 121 through an opening 117. The pixel electrode 121 is one of a pair of electrodes of the liquid crystal element which is formed using a light-transmitting conductive film.

A capacitor 105 is formed using the following: a semiconductor film 119 made of a light-transmitting oxide semiconductor which is used as one electrode, the light-transmitting pixel electrode 121 used as the other electrode, and a light-transmitting insulating film (not illustrated in FIG. 1) included in the transistor 103 which is used as a dielectric film. That is, the capacitor 105 transmits light. Further, the semiconductor film 119 used as one electrode of the capacitor 105 is electrically connected to the capacitor line 115 through an opening 123.

Since the capacitor 105 transmits light as described above, light can pass through a region where the liquid crystal element overlaps with the capacitor 105. Hence, a high aperture ratio of, for example, 55% or more, or 60% or more is achieved even when the capacitor 105 occupies a large area in the pixel 101. In addition, it is possible to obtain a semiconductor device with increased charge capacity of the capacitor.

For example, in a liquid crystal display device with high resolution, the area of a pixel itself is reduced, though there is a limitation on a reduction in the pixel area because a capacitor needs to keep charge capacity. This causes a reduction in aperture ratio in a liquid crystal display device with high resolution. On the other hand, the capacitor 105 shown in this embodiment transmits light; therefore, in each pixel including the capacitor 105, the aperture ratio can be increased while enough charge capacity is maintained. It is typically preferable that the capacitor 105 be used for a high-resolution liquid crystal display device with a pixel density of 200 ppi or more or 300 ppi or more. Moreover, one embodiment of the present invention which enables an increase in aperture ratio leads to an efficient use of light from a light source such as a backlight, and a reduction in the power consumption of the display device.

Figure 2:
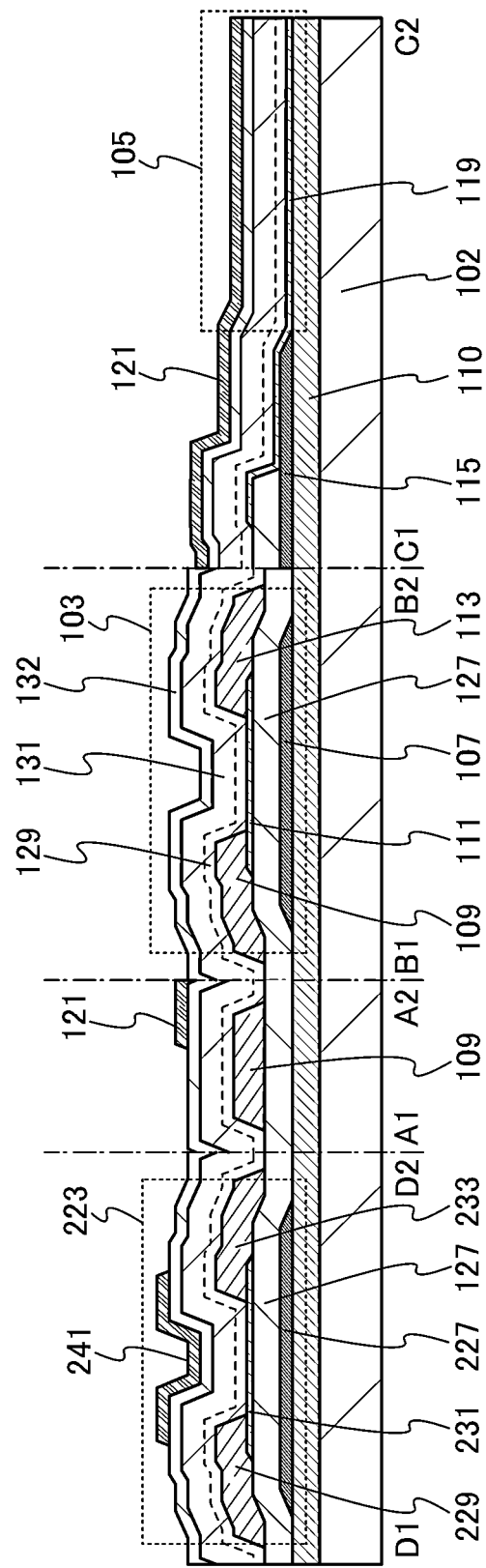
FIG. 2 shows a cross-sectional view illustrating a semiconductor device.

FIG. 2 illustrates a cross section along dashed-dotted lines A1-A2, B1-B2, and C1-C2 in FIG. 1 and a cross section of a transistor used for the first driver circuit 104 in FIG. 3. Note that the top view of the first driver circuit 104 is omitted, and the cross section of the first driver circuit 104 is denoted by D1-D2 in FIG. 2. The transistor used for the first driver circuit 104 can also be used for the second driver circuit 106.

First, description will be made on the cross-sectional structure of the pixel 101 along dashed-dotted lines A1-A2, B1-B2, and C1-C2.

A nitride insulating film 110 is provided over a substrate 102, and the scan line 107 including the gate electrode of the transistor 103, and the capacitor line 115 on the same surface as the scan line 107 are provided over the nitride insulating film 110. A gate insulating film 127 is provided over the scan line 107 and the capacitor line 115, and the oxide semiconductor film 111 is provided over the scan line 107 with the gate insulating film 127 interposed therebetween. The signal line 109 including one of the source electrode and the drain electrode of the transistor 103, and the conductive film 113 including the other of the source electrode and the drain electrode of the transistor 103 are provided over the oxide semiconductor film 111 and the gate insulating film 127. The gate insulating film 127 includes the opening 123 (see FIG. 1) reaching the capacitor line 115 and the nitride insulating film 110, and the semiconductor film 119 is provided to cover the opening. An insulating film 129, an insulating film 131, and an insulating film 132 which function as protective insulating films of the transistor 103 are provided over the gate insulating film 127, the signal line 109, the oxide semiconductor film 111, the conductive film 113, and the semiconductor film 119. The insulating films 129, 131, and 132 include the opening 117 (see FIG. 1) reaching the conductive film 113, and the pixel electrode 121 (see FIG. 1) is provided to cover the opening.

In this embodiment, one of a pair of electrodes of the capacitor 105 is the semiconductor film 119 that is formed in the same step as the oxide semiconductor film 111, the other of the electrodes is the pixel electrode 121, and a dielectric film between the pair of electrodes is the insulating films 129, 131, and 132.

The semiconductor film 119 is provided to cover the opening 123 and mostly in contact with the nitride insulating film 110. A large amount of nitrogen and hydrogen contained in the nitride insulating film 110 can be diffused into the semiconductor film 119. In the case where an oxide semiconductor is used for the semiconductor film 119, part of nitrogen and hydrogen entering the oxide semiconductor contribute to the formation of donor levels to generate carriers; accordingly, an n-type oxide semiconductor layer is obtained and the conductivity can be increased. That is, the semiconductor film 119 may also be considered as a conductive film and used as one electrode of the capacitor 105. Heat treatment in the manufacturing process further promotes the diffusion of nitrogen and hydrogen contained in the nitride insulating film into the semiconductor film 119.

Note that it is preferable that the semiconductor film 119 serving as a conductive film have a hydrogen concentration higher than that in the oxide semiconductor film 111. In the semiconductor film 119, the hydrogen concentration measured by secondary ion mass spectrometry (SIMS) is greater than or equal to $8\times10^{19}$ atoms/cm$^3$, preferably greater than or equal to $1\times10^{20}$ atoms/cm$^3$, and more preferably greater than or equal to $5\times10^{20}$ atoms/cm$^3$. In the oxide semiconductor film 111, the hydrogen concentration measured by SIMS is less than or equal to $5\times10^{19}$ atoms/cm$^3$, preferably less than or equal to $5\times10^{18}$ atoms/cm$^3$, more preferably less than or equal to $1\times10^{18}$ atoms/cm$^3$, still more preferably less than or equal to $5\times10^{17}$ atoms/cm$^3$, and further preferably less than or equal to $1\times10^{16}$ atoms/cm$^3$.

The resistivity of the semiconductor film 119 serving as a conductive film is lower than that of the oxide semiconductor film 111. The resistivity of the semiconductor film 119 is preferably greater than or equal to $1\times10^{-8}$ times and less than or equal to $1\times10^{-1}$ times the resistivity of the oxide semiconductor film 111. The resistivity of the semiconductor film 119 is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

The nitride insulating film 110 contributes to the formation of the n-type oxide semiconductor layer as described above, and also serves as a base film for preventing the entry of impurities from the substrate 102 to the gate insulating film 127 or the semiconductor film 119.

Note that a nitride insulating film or the like may be selectively formed over the semiconductor film 119 and a region in contact with the nitride insulating film may be selectively provided over the semiconductor film 119. Alternatively, an opening may be provided in the insulating film 131 and a silicon nitride film or the insulating film 132 may be provided over the insulating film 131. In that case, it is preferable that the silicon nitride film be not in direct contact with a channel region of the oxide semiconductor film 111.

Note that a semiconductor film that is formed in the same step as the semiconductor film 119 may be used for forming a resistor. Further, a protective circuit may be formed using the resistor. The protective circuit protects against damage from static electricity or the like.

Next, description will be made on the structure of the transistor provided in the first driver circuit 104.

The nitride insulating film 110 is provided over the substrate 102, and a gate electrode 227 of a transistor 223 is provided over the nitride insulating film. The gate insulating film 127 is provided over the gate electrode 227, and an oxide semiconductor film 231 is provided over the gate electrode 227 with the gate insulating film 127 interposed therebetween. A wiring 229 serving as one of a source electrode and a drain electrode of the transistor 223 and a wiring 233 serving as the other of the source electrode and the drain electrode are provided over the oxide semiconductor film 231 and the gate insulating film 127. The insulating films 129, 131, and 132 which function as protective insulating films of the transistor 223 are provided over the gate insulating film 127, the wiring 229, the oxide semiconductor film 231, and the wiring 233. A conductive film 241 is provided over the insulating film 132. Note that the transistor in the first driver circuit 104 does not necessarily include the conductive film 241.

The transistor 223 includes the conductive film 241 which overlaps with the gate electrode 227 with the oxide semiconductor film 231 interposed therebetween, so that it is possible to reduce variation in the threshold voltage at different drain voltages. It is also possible to control a current flowing between the wiring 229 and the wiring 233 at a surface of the oxide semiconductor film 231 facing the conductive film 241, whereby variation in the electrical characteristics between transistors can be reduced. Further, the conductive film 241 allows the oxide semiconductor film 231 to be less influenced by a change in ambient electric field, leading to an improvement in the reliability of the transistor. Further, when the potential of the conductive film 241 is equal to or almost equal to the minimum potential (Vss; for example, the potential of the wiring 229 in the case where the potential of the wiring 229 is a reference potential), variation in the threshold voltage of the transistor can be reduced and the reliability of the transistor can be improved.

Note that an insulating film different from the nitride insulating film 110 may be provided between the substrate 102 and the nitride insulating film 110. The insulating film provided over the semiconductor films 111, 119, and 231 is not limited to the aforementioned three-layer film, and may have one-, two-, or four- or more layer structure.

Then, the components of the above structure will be described in detail.

There is no particular limitation on the material and the like of the substrate 102 as long as the material has heat resistance enough to withstand at least heat treatment performed in a manufacturing process of the semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless steel alloy substrate may be used, in which case a surface of the substrate is preferably provided with an insulating film. As the substrate 102, any of the following may alternatively be used: a quartz substrate, a sapphire substrate, a single crystal semiconductor substrate, a polycrystalline semiconductor substrate, a compound semiconductor substrate, a silicon on insulator (SOI) substrate, and the like.

The nitride insulating film 110 can be formed using a nitride insulating material such as silicon nitride oxide, silicon nitride, aluminum nitride, or aluminum nitride oxide to have a single-layer structure or a layered structure. Part of the nitride insulating film 110 has a thickness of 30 nm to 500 nm, preferably 150 nm to 400 nm.

The scan line 107, the capacitor line 115, and the gate electrode 227 are preferably formed using a low-resistant metal film in order to reduce resistance loss. The scan line 107, the capacitor line 115, and the gate electrode 227 can be formed to have a single-layer structure or a layered structure using any of metal materials such as molybdenum (Mo), titanium (Ti), tungsten (W), tantalum (Ta), aluminum (Al), copper (Cu), chromium (Cr), neodymium (Nd), and scandium (Sc), or an alloy material which contains any of these materials as its main component.

The scan line 107, the capacitor line 115, and the gate electrode 227 may have, for example, a single-layer structure using aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which copper is stacked over a copper-magnesium-aluminum alloy, and a three-layer structure in which titanium nitride, copper, and tungsten are stacked in this order.

The scan line 107, the capacitor line 115, and the gate electrode 227 are preferably formed using, for example, aluminum or copper which is a low-resistant material. When aluminum or copper is used, signal delay is reduced and the display quality can be improved. Note that aluminum has low heat resistance, which tends to cause defects due to a hillock, a whisker, or migration. In order to prevent migration of aluminum, a metal material having a higher melting point than aluminum, such as molybdenum, titanium, or tungsten, is preferably stacked over aluminum. Also when copper is used, in order to prevent a defect due to migration and diffusion of copper elements, a metal material having a higher melting point than copper, such as molybdenum, titanium, or tungsten, is preferably stacked over copper.

The scan line 107, the capacitor line 115, and the gate electrode 227 can also be formed using a light-transmitting conductive material that can be used for the pixel electrode 121. Note that in the case where the semiconductor device of one embodiment of the present invention is a reflective display device, a non-light-transmitting conductive material can be used for the pixel electrode 121 or the substrate 102.

Further, the scan line 107, the capacitor line 115, and the gate electrode 227 can be partly formed using a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) film. These materials each have a work function higher than or equal to 5 eV (electron volts). In the case where the oxide semiconductor film 111 of the transistor 103 is formed using an oxide semiconductor, the use of a metal oxide containing nitrogen for the scan line 107 (the gate electrode of the transistor 103) allows the threshold voltage of the transistor 103 to shift in the positive direction, i.e., the transistor can have normally-off characteristics. For example, in the case where an In—Ga—Zn-based oxide containing nitrogen is used, it is possible to use an In—Ga—Zn-based oxide having a nitrogen concentration at least higher than that in the oxide semiconductor film 111, specifically an In—Ga—Zn-based oxide having a nitrogen concentration of 7 at. % or higher can be used.

The gate insulating film 127 is formed to have a single-layer structure or a layered structure using, for example, any of insulating materials such as silicon oxide, silicon oxynitride, silicon nitride oxide, silicon nitride, aluminum oxide, hafnium oxide, gallium oxide, and a Ga—Zn-based metal oxide. In order to improve the characteristics of the interface between the gate insulating film 127 and the oxide semiconductor film 111, a region in the gate insulating film 127 which is in contact with at least the oxide semiconductor film 111 is preferably formed using an insulating film containing oxygen.

Further, it is possible to prevent outward diffusion of oxygen from the oxide semiconductor film 111 and entry of hydrogen, water, or the like into the oxide semiconductor film from the outside by using an insulating film having a barrier property against oxygen, hydrogen, water, and the like for the gate insulating film 127. Examples of the insulating film having a bather property against oxygen, hydrogen, water, and the like are an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film.

The gate insulating film 127 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$), hafnium oxide, or yttrium oxide, in which case gate leakage current of the transistor 103 can be reduced.

The gate insulating film 127 preferably has the following layered structure. It is preferable that a silicon nitride film having few defects be provided as a first silicon nitride film, a silicon nitride film from which little hydrogen and ammonia are released be provided as a second silicon nitride film over the first silicon nitride film, and any of the insulating films containing oxygen listed as those used for the gate insulating film 127 be provided over the second silicon nitride film. The second silicon nitride film preferably used is a silicon nitride film which releases hydrogen molecules less than $5\times10^{21}$ molecules/cm$^3$, preferably less than or equal to $3\times10^{21}$ molecules/cm$^3$, and more preferably less than or equal to $1\times10^{21}$ molecules/cm$^3$, and releases ammonia molecules less than $1\times10^{22}$ molecules/cm$^3$, preferably less than or equal to $5\times10^{21}$ molecules/cm$^3$, and more preferably less than or equal to $1\times10^{21}$ molecules/cm$^3$ by thermal desorption spectroscopy. When the first silicon nitride film and the second silicon nitride film are used as part of the gate insulating film 127, the gate insulating film 127 can be a film which has few defects and from which little hydrogen and ammonia are released. Thus, it is possible to reduce the amount of hydrogen and nitrogen contained in the gate insulating film 127 which enter the oxide semiconductor film 111.

In the case where the trap levels (also referred to as interface states) are present at the interface between an oxide semiconductor film and a gate insulating film or in the gate insulating film in a transistor including an oxide semiconductor, a shift of the threshold voltage of the transistor, typically, a negative shift of the threshold voltage is likely to occur. The trap levels also cause an increase in the subthreshold swing (S value) showing a gate voltage needed for changing the drain current by an order of magnitude when the transistor is turned on. There is also a problem in that the electrical characteristics do not vary uniformly but are different among transistors. Therefore, when a silicon nitride film having few defects is used as a gate insulating film and an insulating film containing oxygen is provided in contact with the oxide semiconductor film 111, a negative shift of the threshold voltage can be reduced and an increase in S value can be minimized.

The thickness of the gate insulating film 127 is greater than or equal to 5 nm and less than or equal to 400 nm, preferably greater than or equal to 10 nm and less than or equal to 300 nm, and more preferably greater than or equal to 50 nm and less than or equal to 250 nm.

It is preferable that an oxide semiconductor film be used as the oxide semiconductor film 111, the semiconductor film 119, and the oxide semiconductor film 231. The oxide semiconductor film can be amorphous, single-crystalline, or polycrystalline. The thickness of part of the oxide semiconductor film 111 is greater than or equal to 1 nm and less than or equal to 100 nm, preferably greater than or equal to 1 nm and less than or equal to 50 nm, more preferably greater than or equal to 1 nm and less than or equal to 30 nm, and still more preferably greater than or equal to 3 nm and less than or equal to 20 nm.

The oxide semiconductor that can be used for the semiconductor films 111, 119, and 231 has an energy gap of 2 eV or more, preferably 2.5 eV or more, and more preferably 3 eV or more, and less than 3.9 eV, preferably less than 3.7 eV, and more preferably less than 3.5 eV. The use of such an oxide semiconductor having a wide energy gap can reduce the off-state current of the transistor 103. In addition, such an oxide semiconductor has high visible-light transmittance and can be used for one electrode of the capacitor 105, so that the capacitor 105 transmits light, resulting in an increase in the aperture ratio of a pixel in a liquid crystal display device or the like.

When the oxide semiconductor film has n-type conductivity, the optical band gap of the oxide semiconductor film can be greater than or equal to 2.4 eV and less than or equal to 3.1 eV, or greater than or equal to 2.6 eV and less than or equal to 3.0 eV. In the case where an oxide semiconductor film used as the semiconductor film 119 is, for example, an In—Ga—Zn-based metal oxide film with an atomic ratio of In: Ga: Zn=1: 1:1, the oxide semiconductor film has an optical band gap of 3.15 eV. Further, an indium tin oxide used for the pixel electrode 121 or the like has an optical band gap of 3.7 eV to 3.9 eV. Accordingly, the highest energy visible light and ultraviolet light which pass through the pixel electrode 121 can be absorbed in the semiconductor film 119. Since damage of the highest energy visible light and ultraviolet light on eyes has been concerned, it can be said that the semiconductor device including the light-transmitting capacitor 105 in the pixel 101 is an eye-friendly device. Note that the capacitor 105 does not need to overlap with all the area of the pixel 101. The highest energy visible light and ultraviolet light can be absorbed when the capacitor 105 overlaps with at least part of the pixel 101.

The oxide semiconductor used for the semiconductor films 111, 119, and 231 preferably contains at least indium (In) or zinc (Zn). Alternatively, the oxide semiconductor preferably contains both In and Zn. In order to reduce variation in the electrical characteristics of the transistors including the oxide semiconductor, the oxide semiconductor preferably contains one or more stabilizers in addition to one of or both In and Zn.

Examples of the stabilizers are gallium (Ga), tin (Sn), hafnium (Hf), aluminum (Al), and zirconium (Zr). Other examples of the stabilizers are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For the oxide semiconductor that can be used for the semiconductor films 111, 119, and 231, the following can be used for example: an indium oxide; a tin oxide; a zinc oxide; an oxide containing two kinds of metals, such as an In—Zn-based oxide, a Sn—Zn-based oxide, an Al—Zn-based oxide, a Zn—Mg-based oxide, a Sn-Mg-based oxide, an In—Mg-based oxide, or an In—Ga-based oxide; an oxide containing three kinds of metals, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or an oxide containing four kinds of metals, such as an In—Sn—Ga—Zn-based oxide, an In—Hf—Ga—Zn-based oxide, an In—Al-Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. Further, the In—Ga—Zn-based oxide may contain a metal element other than In, Ga, and Zn.

Alternatively, a material represented by $InMO_3(ZnO)_m$ (m>0) may be used as an oxide semiconductor. Note that M represents one or more metal elements selected from Ga, Fe, Mn, and Co, or the above element as a stabilizer.

For example, an In—Ga—Zn-based metal oxide with an atomic ratio of In: Ga: Zn=1:1:1 (=1/3:1/3:1/3), In: Ga: Zn=2:2:1 (=2/5:2/5:1/5), or In:Ga:Zn=3:1:2 (=1/2:1/6:1/3). Alternatively, an In—Sn—Zn-based metal oxide with an atomic ratio of In: Sn: Zn=1:1:1 (=1/3:1/3:1/3), In: Sn: Zn=2:1:3 (=1/3:1/6:1/2), or In: Sn: Zn=2:1:5 (=1/4:1/8:5/8) may be used. Note that the proportion of each atom in the atomic ratio of the metal oxide varies within a range of ±20% as an error.

Note that without limitation to the materials given above, a material with an appropriate atomic ratio depending on semiconductor characteristics and electrical characteristics (field-effect mobility, threshold voltage, and the like) may be used. Further, it is preferable to appropriately set the carrier density, the impurity concentration, the defect density, the atomic ratio of a metal element and oxygen, the interatomic distance, the density, or the like in order to obtain necessary semiconductor characteristics. For example, high field-effect mobility is achieved relatively easily in the case of using an In—Sn—Zn oxide. Also in the case of using an In—Ga—Zn-based oxide, field-effect mobility can be increased by reducing the defect density in a bulk.

The signal line 109 including one of the source electrode and the drain electrode of the transistor 103, the conductive film 113 including the other of the source electrode and the drain electrode of the transistor 103, and the wirings 229 and 233 can be formed to have a single-layer structure or a layered structure using any of the materials that can be used for the scan line 107, the capacitor line 115, and the gate electrode 227.

The insulating films 129 and 131 can be formed to have a single-layer structure or a layered structure using, for example, any of oxide insulating materials such as silicon oxide, silicon oxynitride, aluminum oxide, hafnium oxide, gallium oxide, and a Ga—Zn-based metal oxide.

Part of the insulating film 129 has a thickness of 5 nm to 150 nm, preferably 5 nm to 50 nm, and more preferably 10 nm to 30 nm Part of the insulating film 131 has a thickness of 30 nm to 500 nm, preferably 150 nm to 400 nm.

Further, one or both of the insulating films 129 and 131 is preferably an oxide insulating film in which the oxygen content is higher than that in the stoichiometric composition. In that case, oxygen can be prevented from being released from the oxide semiconductor film, and the oxygen contained in an oxygen excess region can be diffused into the oxide semiconductor film to fill oxygen vacancies. For example, the oxygen vacancies in the oxide semiconductor film can be filled by using an oxide insulating film having the following feature: the number of oxygen molecules released from the oxide insulating film by heat treatment at a temperature higher than or equal to 100° C. and lower or equal to 700° C., preferably higher than or equal to 100° C. and lower than or equal to 500° C. is greater than or equal to $1.0 \times 10^{18}$ molecules/cm$^3$ when measured by thermal desorption spectroscopy (hereinafter referred to as TDS). Note that an oxide insulating film partly including a region in which the oxygen content is higher than that in the stoichiometric composition (oxygen excess region) may be used as one or both of the insulating films 129 and 131. When such an oxygen excess region is present in a region overlapping with at least the oxide semiconductor film 111, oxygen is prevented from being released from the oxide semiconductor film and the oxygen contained in the oxygen excess region can be diffused into the oxide semiconductor film to fill oxygen vacancies.

In the case where the insulating film 131 is an oxide insulating film in which the oxygen content is higher than that in the stoichiometric composition, the insulating film 129 is preferably an oxide insulating film through which oxygen penetrates. Oxygen which enters the insulating film 129 from the outside does not completely penetrate through the insulating film 129 to be diffused and part thereof remains in the insulating film 129. Further, there is oxygen which is contained in the insulating film 129 from the first and is diffused from the insulating film 129 to the outside. Thus, the insulating film 129 preferably has a high coefficient of diffusion of oxygen.

Since the insulating film 129 is in contact with the semiconductor films 111 and 231 which are oxide semiconductor films, the insulating film 129 is preferably an oxide insulating film through which oxygen penetrates and which has a low interface state with the semiconductor films 111 and 231. For example, the insulating film 129 is preferably an oxide insulating film having a lower defect density than the insulating film 131. Specifically, the spin density of the oxide insulating film at a g-value of 2.001 (E'-center) measured by electron spin resonance spectroscopy is lower than or equal to $3.0\times10^{17}$ spins/cm$^3$, preferably lower than or equal to $5.0\times10^{16}$ spins/cm$^3$. The spin density at a g-value of 2.001 measured by electron spin resonance spectroscopy is equivalent to the number of dangling bonds in the insulating film 129.

Further, one or both of the insulating films 129 and 131 is preferably an insulating film having a barrier property against nitrogen. For example, a dense oxide insulating film can have a barrier property against nitrogen. Specifically, it is preferable to use an oxide insulating film which can be etched at a rate less than or equal to 10 nm per minute when the temperature is 25° C. and 0.5 wt% of fluoric acid is used.

In the case where an oxide insulating film containing nitrogen, such as a silicon oxynitride film or a silicon nitride oxide film, is used as one or both of the insulating films 129 and 131, the nitrogen-containing oxide insulating film is preferably formed so as to have a region where the nitrogen concentration measured by secondary ion mass spectrometry (SIMS) is higher than or equal to the lower limit of measurement by SIMS and lower than $3\times10^{20}$ atoms/cm$^3$, preferably higher than or equal to $1\times10^{18}$ atoms/cm$^3$ and lower than or equal to $1\times10^{20}$ atoms/cm$^3$. In that case, the amount of nitrogen which enters the oxide semiconductor film 111 included in the transistor 103 can be reduced and the number of defects in the nitrogen-containing oxide insulating film itself can be reduced.

The insulating film 132 can be formed using a nitride insulating material such as silicon nitride oxide, silicon nitride, aluminum nitride, or aluminum nitride oxide to have a single-layer structure or a layered structure.

As the insulating film 132, a nitride insulating film with a low hydrogen content may be provided. The nitride insulating film is as follows, for example: the number of hydrogen molecules released from the nitride insulating film is less than $5.0\times10^{21}$ molecules/cm$^3$, preferably less than $3.0\times10^{21}$ molecules/cm$^3$, and more preferably less than $1.0\times10^{21}$ molecules/cm$^3$ when measured by TDS.

Part of the insulating film 132 preferably has a thickness large enough to prevent entry of impurities such as hydrogen and water from the outside. For example, the thickness of the insulating film 132 is greater than or equal to 50 nm and less than or equal to 200 nm, preferably greater than or equal to 50 nm and less than or equal to 150 nm, and more preferably greater than or equal to 50 nm and less than or equal to 100 nm. When the insulating film 132 is provided, impurities such as carbon are blocked by the insulating film 132 so as to minimize the transfer of impurities to the oxide semiconductor film 111 of the transistor 103 and the oxide semiconductor film 231 of the transistor 223; thus, variation in the electrical characteristics of the transistors can be reduced.

In the case where a one-layer insulating film is provided over the semiconductor films 111, 119, and 231, the insulating film 131 is preferably provided. In the case where a two-layer insulating film is provided, the insulating film 131 and the insulating film 132 are preferably provided in this order from the side of the semiconductor film.

An oxide insulating film formed by a chemical vapor deposition (CVD) method using an organosilane gas, typically a silicon oxide film, may be included in the insulating films formed between the semiconductor films 111, 119, and 231, and the pixel electrode 121, the conductive film 241, and the wirings and the like that can be formed at the same time as the pixel electrode 121 and the conductive film 241.

The silicon oxide film can be formed to a thickness of 300 nm to 600 nm As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like.

When the silicon oxide film is formed by a CVD method using an organosilane gas, the planarity of a surface of an element portion over the substrate 102 can be improved. As a result, without a planarization film formed using an organic resin, alignment disorder of the liquid crystal molecules can be reduced, light leakage can be reduced, and contrast can be enhanced. It is needless to say that an organic resin film may be used instead of the silicon oxide film, or a stack of the silicon oxide film and an organic resin film may be used.

The pixel electrode 121 and the conductive film 241 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Then, the components in the pixel 101 shown in this embodiment will be described in detail.

Figure 4A:
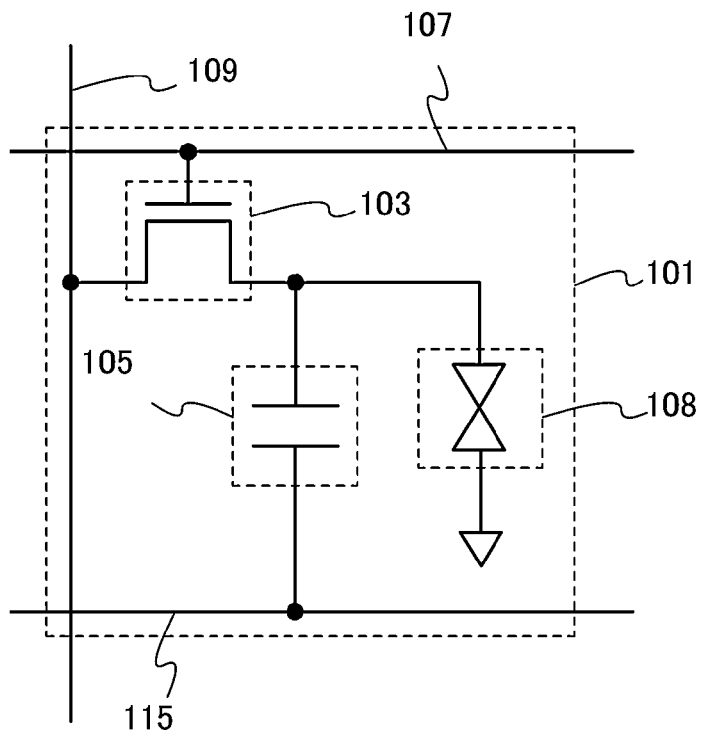
FIGS. 4A and 4B show circuit diagrams each illustrating a pixel of a semiconductor device.

FIG. 4A shows an example of a circuit diagram of the aforementioned pixel 101. The pixel 101 includes the transistor 103, the capacitor 105, and a liquid crystal element 108. The gate electrode of the transistor 103 is electrically connected to the scan line 107, one of the source electrode and the drain electrode of the transistor 103 is electrically connected to the signal line 109, and the other of the source electrode and the drain electrode is electrically connected to one electrode of the capacitor 105 and one electrode (pixel electrode) of the liquid crystal element 108. The other electrode of the capacitor 105 is electrically connected to the capacitor line 115, and the other electrode (counter electrode) of the liquid crystal element 108 is electrically connected to a wiring for supplying a counter potential to the counter electrode.

The liquid crystal element 108 controls transmission or non-transmission of light by an optical modulation action of a liquid crystal which is sandwiched between a substrate provided with the transistor 103 and the pixel electrode and a counter substrate (e.g., a substrate provided with the counter electrode). Note that the optical modulation action of a liquid crystal is controlled by an electric field applied to the liquid crystal (including a vertical electric field, and an oblique electric field). Note that in the case where the pixel electrode and the counter electrode (also referred to as a common electrode) are provided over the same substrate, a horizontal electric field is applied to a liquid crystal.

Figure 4B:
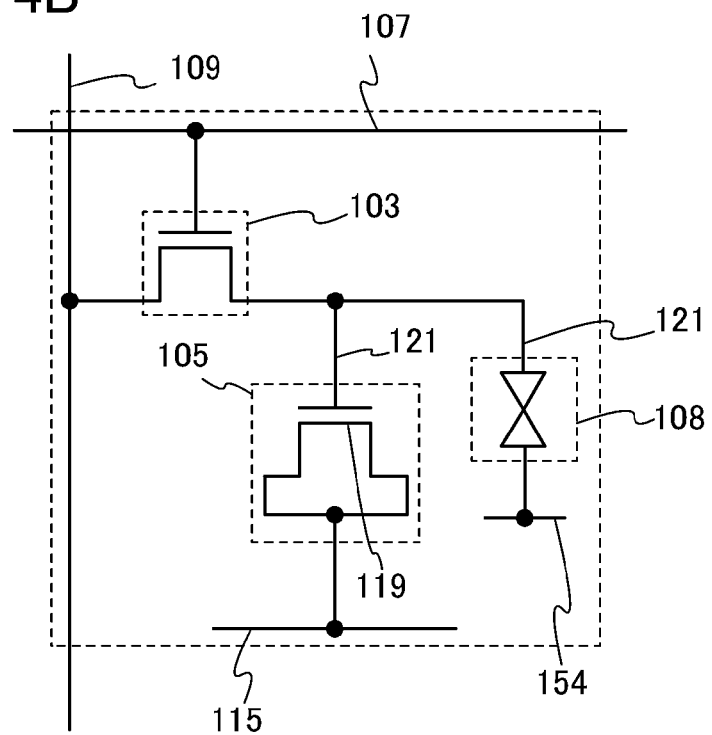

FIG. 4B shows an example of a detailed circuit diagram of the pixel 101. As illustrated in FIG. 4B and FIG. 2, the transistor 103 includes the scan line 107 including the gate electrode, the signal line 109 including one of the source electrode and the drain electrode, and the conductive film 113 including the other of the source electrode and the drain electrode.

The semiconductor film 119 connected to the capacitor line 115 serves as one electrode of the capacitor 105. The pixel electrode 121 connected to the conductive film 113 including the other of the source electrode and the drain electrode serves as the other electrode of the capacitor 105. The insulating films 129, 131, and 132 provided between the semiconductor film 119 and the pixel electrode 121 serve as a dielectric film.

The liquid crystal element 108 includes the pixel electrode 121, a counter electrode 154, and a liquid crystal layer provided between the pixel electrode 121 and the counter electrode 154.

The semiconductor film 119 in the capacitor 105 serves as the electrode of the capacitor 105 although the structure of the semiconductor film 119 is the same as that of the oxide semiconductor film 111. This is because the pixel electrode 121 can function as a gate electrode, the insulating films 129, 131, and 132 can function as gate insulating films, and the capacitor line 115 can function as a source electrode or a drain electrode, so that the capacitor 105 can be operated in a manner similar to that of a transistor and the semiconductor film 119 can be made to be in a conductive state. Accordingly, the semiconductor film 119 is allowed to serve as one electrode of the capacitor 105.

Next, a method for manufacturing the semiconductor device illustrated in FIG. 1 and FIG. 2 will be described with reference to FIGS. 5A and 5B and FIGS. 6A and 6B.

First, the nitride insulating film 110 is formed over the substrate 102. Then, the scan line 107, the capacitor line 115, and the gate electrode 227 are formed over the nitride insulating film 110. Next, the gate insulating film 127 is formed to cover the scan line 107, the capacitor line 115, and the gate electrode 227. After that, the opening 123 (see FIG. 1) is provided in the gate insulating film 127, so that the capacitor line 115 and the nitride insulating film 110 are partly exposed.

Figure 5A:
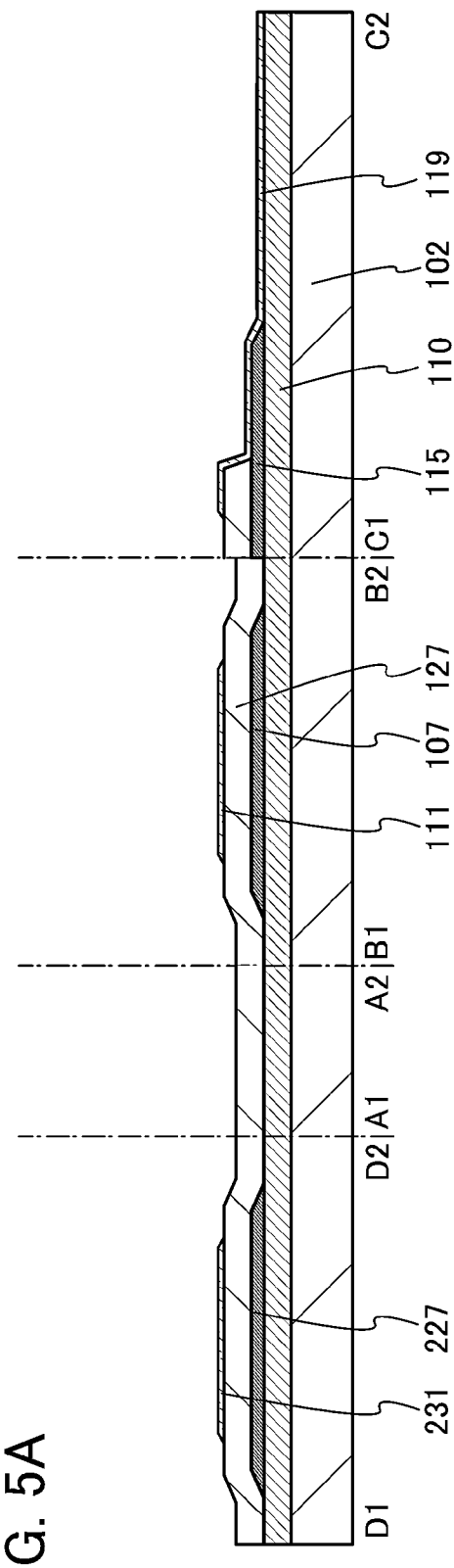
FIGS. 5A and 5B show cross-sectional views illustrating a method for manufacturing a semiconductor device.

Then, the oxide semiconductor film 111 is formed over the scan line 107 with the gate insulating film 127 interposed therebetween, the semiconductor film 119 is formed to cover the opening 123, and the oxide semiconductor film 231 is formed to overlap with the gate electrode 227 (see FIG. 5A).

The nitride insulating film 110 can be formed using any of the aforementioned materials. The nitride insulating film 110 can be formed by any of a variety of deposition methods such as an evaporation method, a CVD method, a sputtering method, and a spin coating method.

The scan line 107, the capacitor line 115, and the gate electrode 227 can be formed in such a manner that a conductive film is formed using any of the aforementioned materials, a mask is formed over the conductive film, and processing is performed using the mask. The conductive film can be formed by any of a variety of deposition methods such as an evaporation method, a CVD method, a sputtering method, and a spin coating method. Note that there is no particular limitation on the thickness of the conductive film, and the thickness of the conductive film can be determined in consideration of time needed for the formation, desired resistivity, or the like. As the mask, a resist mask formed through a photolithography process can be used, for example. The conductive film can be processed by one or both of dry etching and wet etching.

The gate insulating film 127 can be formed using any of the aforementioned materials by any of a variety of deposition methods such as a CVD method and a sputtering method.

In the case where gallium oxide is used for the gate insulating film 127, the gate insulating film 127 can be formed by a metal organic chemical vapor deposition (MOCVD) method.

The opening 123 can be formed as follows: a mask is formed in a predetermined region over the gate insulating film 127, and processing is performed using the mask. Note that the formation of the mask and the processing can be performed in a manner similar to that of the scan line 107, the capacitor line 115, and the gate electrode 227.

The semiconductor films 111, 119, and 231 can be formed as follows: an oxide semiconductor film is formed using any of the aforementioned oxide semiconductors, a mask is formed over the oxide semiconductor film, and processing is performed using the mask. The oxide semiconductor film can be formed by a sputtering method, a coating method, a pulsed laser deposition method, a laser ablation method, or the like. When using a printing method, the semiconductor films 111 and 119 which are separated from each other can be formed directly on the gate insulating film 127. In the case where the oxide semiconductor film is formed by a sputtering method, plasma can be generated with use of a power supply device such as an RF power supply device, an AC power supply device, or a DC power supply device, as appropriate. As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas. Further, a target may be selected in accordance with the composition of the oxide semiconductor film to be formed. As the mask, a resist mask formed through a photolithography process can be used. The oxide semiconductor film can be processed by one or both of dry etching and wet etching. The etching conditions (e.g., an etching gas or an etching solution, etching time, and temperature) are set as appropriate depending on the material so that the oxide semiconductor film can be etched to have a desired shape.

The oxide semiconductor film can be formed by a CVD method. As the CVD method, a metal organic chemical vapor deposition (MOCVD) method or an atomic layer deposition (ALD) method may be employed.

The thermal CVD method is advantageous in that no defect due to plasma damage is generated since it does not utilize plasma for forming a film.

Deposition by the thermal CVD method may be performed in such a manner that a source gas and an oxidizer are supplied to a chamber at a time, the pressure in the chamber is set to an atmospheric pressure or a reduced pressure, and reaction is produced in the vicinity of the substrate or over the substrate.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching the respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then, the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction;

therefore, the ALD method makes it possible to accurately adjust the thickness and thus is suitable for manufacturing a minute transistor.

For example, in the case where an InGaZnO$_x$ $(x>0)$ film is formed, trimethylindium, trimethylgallium, and dimethylzinc are used. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. Without limitation to the above combination, triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

In the case where an In—Ga—Zn—O film is formed by the ALD method, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an In—Ga—O layer, an In—Zn—O layer, a Ga—In—O layer, a Zn—In—O layer or a Ga—Zn—O layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Instead of an In(CH$_3$)$_3$ gas, an In(C$_2$H$_5$)$_3$ may be used. Furthermore, a Zn(CH$_3$)$_2$ gas may be used.

After the formation of the semiconductor films 111, 119, and 231, heat treatment is preferably performed to dehydrate or dehydrogenate the oxide semiconductor films 111, 119, and 231. The temperature of the heat treatment is typically higher than or equal to 150° C. and lower than the strain point of the substrate, preferably higher than or equal to 200° C. and lower than or equal to 450° C., and more preferably higher than or equal to 300° C. and lower than or equal to 450° C. Note that the heat treatment may be performed on the oxide semiconductor film which has not been processed into the semiconductor films 111, 119, and 231.

A heat treatment apparatus used in the heat treatment is not limited to an electric furnace, and may be an apparatus which heats an object using thermal conduction or thermal radiation given by a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed in an atmosphere of nitrogen, oxygen, ultra-dry air (air in which the water content is less than or equal to 20 ppm, preferably less than or equal to 1 ppm, and more preferably less than or equal to 10 ppb), or a rare gas (e.g., argon or helium). The atmosphere of nitrogen, oxygen, ultra-dry air, or a rare gas preferably does not contain hydrogen, water, and the like. Alternatively, heating may be performed in an inert gas atmosphere first, and then in an oxygen atmosphere. The treatment time is 3 minutes to 24 hours.

The heat treatment promotes the diffusion of nitrogen and hydrogen contained in the nitride insulating film 110 into the semiconductor film 119, resulting in a further decrease in the resistance of the semiconductor film 119.

In the case where an insulating film is provided between the substrate 102 and the nitride insulating film 110, the insulating film can be formed using any of the following: silicon oxide, silicon oxynitride, silicon nitride, silicon nitride oxide, gallium oxide, hafnium oxide, yttrium oxide, aluminum oxide, aluminum oxynitride, and the like. The use of silicon nitride, gallium oxide, hafnium oxide, yttrium oxide, aluminum oxide, or the like for the insulating film leads to suppression of diffusion of impurities typified by an alkali metal, water, and hydrogen into the semiconductor films 111, 119, and 231 from the substrate 102. The insulating film can be formed by a sputtering method or a CVD method.

Figure 5B:
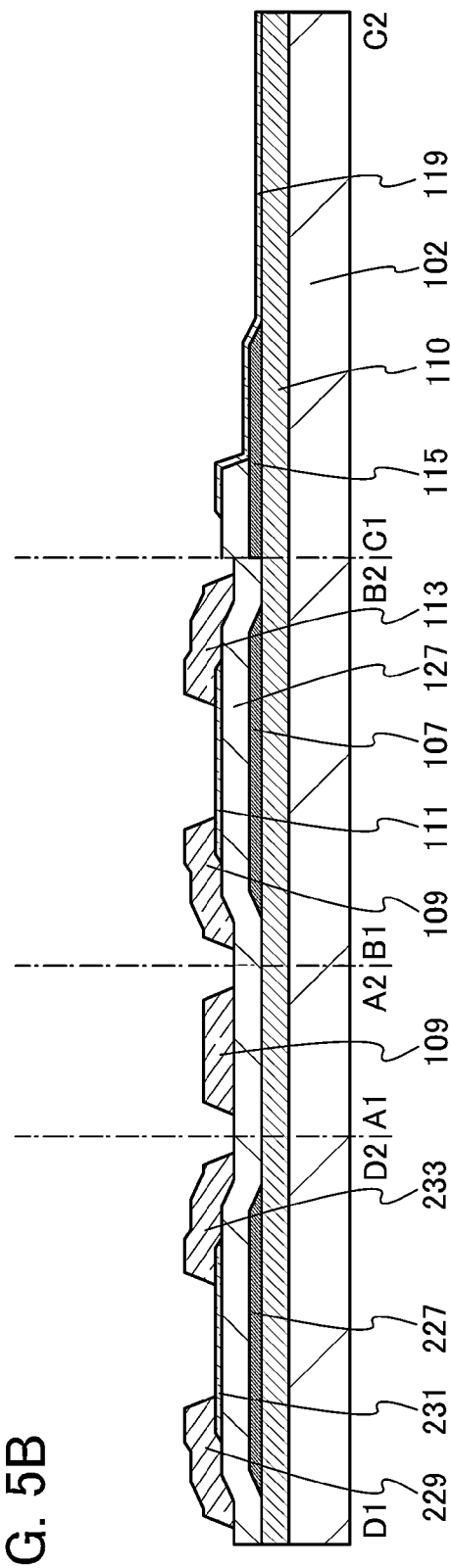

Next, the signal line 109 including one of the source electrode and the drain electrode of the transistor 103, the conductive film 113 including the other of the source electrode and the drain electrode of the transistor 103, and the wirings 229 and 233 are formed (see FIG. 5B).

The signal line 109, the conductive film 113, and the wirings 229 and 233 can be formed as follows: a conductive film is formed using a material which can be used for the signal line 109, the conductive film 113, and the gate electrode 227, a mask is formed over the conductive film, and processing is performed using the mask. The formation of the mask and the processing can be performed in a manner similar to that of the scan line 107, the capacitor line 115, and the gate electrode 227.

Next, the insulating films 129, 131, and 132 are formed over the semiconductor films 111, 119, and 231, the signal line 109, the conductive film 113, the wirings 229 and 233, and the gate insulating film 127 (see FIG. 6A). Note that the insulating films 129, 131, and 132 are preferably formed in succession. The successive formation prevents the entry of impurities into each interface of the insulating films 129, 131, and 132.

The insulating films 129, 131, and 132 can be formed using any of the aforementioned materials by any of a variety of deposition methods such as a CVD method and a sputtering method.

In the case where an oxide insulating film which has a low density of states at the interface with the oxide semiconductor film 111 is used as the insulating film 129, the insulating film 129 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is set to greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon are silane, disilane, trisilane, and silane fluoride. Examples of the oxidizing gas are oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 129 can be reduced and dangling bonds in the insulating film 129 can be reduced. Oxygen released from the insulating film 131 is captured by the dangling bonds in the insulating film 129 in some cases; thus, in the case where the dangling bonds in the insulating film 129 are reduced, oxygen in the insulating film 131 can be efficiently diffused into the semiconductor films 111 and 231 to fill the oxygen vacancies in the oxide semiconductor films 111 and 231. As a result, the amount of hydrogen which enters the oxide semiconductor film can be reduced and oxygen vacancies in the oxide semiconductor film can be reduced.

In the case where the insulating film 131 is the above oxide insulating film which includes an oxygen excess region or the above oxide insulating film in which the oxygen content is higher than that in the stoichiometric composition, the insulating film 131 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to 0.17 W/cm$^2$ and lower than or equal to 0.5 W/cm$^2$, preferably, higher than or equal to 0.25 W/cm$^2$ and lower than or equal to 0.35 W/cm$^2$ is supplied to an electrode provided in the treatment chamber.

As the source gas of the insulating film 131, a source gas which can be used for the insulating film 129 can be used.

Under the formation conditions of the insulating film 131, the high-frequency power having the above power density is supplied to the treatment chamber having the above pressure; accordingly, the decomposition efficiency of the source gas in plasma is increased, oxygen radicals are increased, and oxidation of the source gas proceeds, whereby the oxygen content in the insulating film 131 becomes higher than that in the stoichiometric composition. However, the bonding strength of silicon and oxygen is weak in the above substrate temperature range; therefore, part of oxygen is released by heating. Hence, it is possible to form an oxide insulating film in which the oxygen content is higher than that in the stoichiometric composition and from which part of oxygen is released by heating. The insulating film 129 is provided over the oxide semiconductor film 111. Accordingly, in the process for forming the insulating film 131, the insulating film 129 serves as a protective film of the oxide semiconductor film 111. Thus, even when the insulating film 131 is formed using the high-frequency power having a high power density, the semiconductor films 111 and 231 are not seriously damaged.

By increasing the thickness of the insulating film 131, a larger amount of oxygen is released by heating; thus, the insulating film 131 is preferably formed thicker than the insulating film 129. The insulating film 129 enables favorable coverage to be achieved even when the insulating film 131 is formed thick.

In the case where a nitride insulating film with a low hydrogen content is used as the insulating film 132, the insulating film 132 can be formed under the following formation conditions. Here, as the nitride insulating film, a silicon nitride film is formed. As for the formation conditions, the substrate placed in a treatment chamber of a plasma CVD apparatus, which is vacuum-evacuated, is held at a temperature higher than or equal to 80° C. and lower than or equal to 400° C., preferably higher than or equal to 200° C. and lower than or equal to 370° C., a source gas is introduced into the treatment chamber, the pressure in the treatment chamber is set to greater than or equal to 100 Pa and less than or equal to 250 Pa, preferably greater than or equal to 100 Pa and less than or equal to 200 Pa, and high-frequency power is supplied to an electrode provided in the treatment chamber.

As the source gas of the insulating film 132, a deposition gas containing silicon, a nitrogen gas, and an ammonia gas are preferably used. Typical examples of the deposition gas containing silicon are silane, disilane, trisilane, and silane fluoride. Further, the flow ratio of nitrogen to ammonia is preferably higher than or equal to 5 and lower than or equal to 50, more preferably higher than or equal to 10 and lower than or equal to 50. The use of ammonia as the source gas facilitates decomposition of nitrogen and the deposition gas containing silicon. This is because ammonia is dissociated by plasma energy or heat energy, and energy generated by the dissociation contributes to the decomposition of a bond of the deposition gas molecules containing silicon and a bond of nitrogen molecules. Under the above conditions, it is possible to form a silicon nitride film which has a low hydrogen content and can suppress the entry of impurities such as hydrogen and water from the outside.

It is preferable that heat treatment be performed at least after the formation of the insulating film 131 so that excess oxygen contained in the insulating film 129 or the insulating film 131 is diffused into the oxide semiconductor films 111 and 231 to reduce oxygen vacancies in the oxide semiconductor films 111 and 231. Note that the heat treatment can be performed according to the details of heat treatment for dehydration or dehydrogenation of the semiconductor films 111 and 231.

Next, the opening 117 (see FIG. 1) reaching the conductive film 113 is formed in part of the insulating films 129, 131, and 132 which overlap with the conductive film 113. The opening 117 can be formed in a manner similar to that of the opening 123.

Then, the pixel electrode 121 and the conductive film 241 are formed, whereby the semiconductor device illustrated in FIG. 1 and FIG. 2 can be formed (see FIG. 6B). The pixel electrode 121 is formed in such a manner that a conductive film is formed using any of the aforementioned materials in contact with the conductive film 113 through the opening 117, a mask is formed over the conductive film, and processing is performed using the mask. The formation of the mask and the processing can be performed in a manner similar to that of the scan line 107 and the capacitor line 115.

Figure 7:
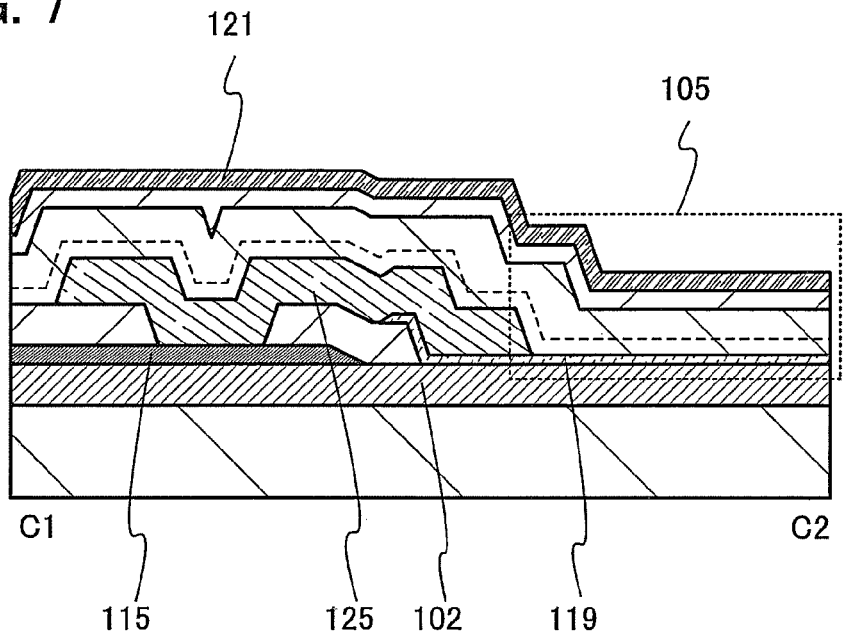
FIG. 7 shows a cross-sectional view illustrating a capacitor of a semiconductor device.

In the semiconductor device of one embodiment of the present invention, the connection between the capacitor line 115 and the semiconductor film 119 serving as one electrode of the capacitor can be changed as appropriate. For example, as illustrated in the cross-sectional view of the capacitor 105 in FIG. 7, the capacitor line 115 may be connected to the semiconductor film 119 through a conductive film 125. In that case, the conductive film 125 can be formed as the same time as the signal line 109 including one of the source electrode and the drain electrode of the transistor 103, the conductive film 113 including the other of the source electrode and the drain electrode of the transistor 103, and the wirings 229 and 233.

In the semiconductor device of one embodiment of the present invention, the shape of a transistor provided in a pixel is not limited to the shape of the transistor illustrated in FIG. 1 and FIG. 2 and can be changed as appropriate. For example, in the transistor, one of the source electrode and the drain electrode included in the signal line 109 may have a U shape (or a C shape, a square-bracket-like shape, or a horseshoe shape) which surrounds the conductive film including the other of the source electrode and the drain electrode. With such a shape, an enough channel width can be ensured even when the area of the transistor is small, and accordingly, the amount of drain current flowing at the time of conduction of the transistor (also referred to as an on-state current) can be increased.

Figure 8:
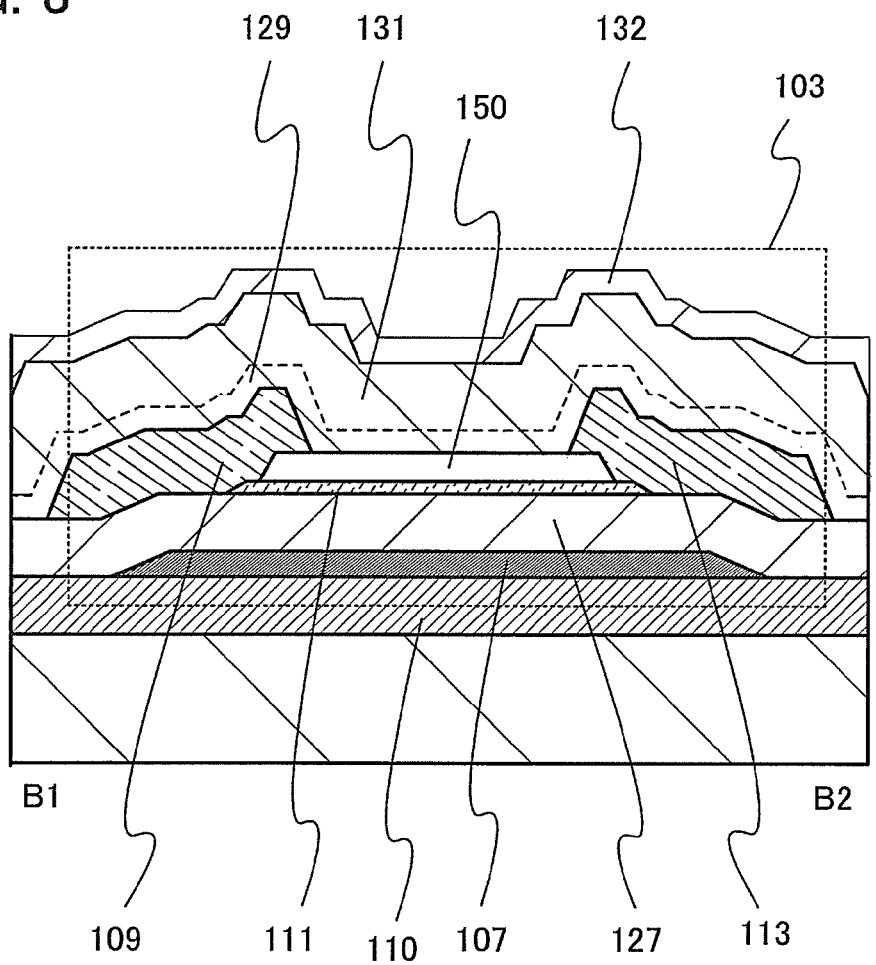
FIG. 8 shows a cross-sectional view illustrating a semiconductor device.

Although the transistor in the aforementioned pixel 101 is a channel-etched transistor, a channel protective transistor illustrated in FIG. 8 can also be used. Since a channel protective film 150 is provided, a surface of the oxide semiconductor film 111 is not exposed to an etchant or an etching gas used in the formation process of the signal line and the conductive film, which allows impurities between the oxide semiconductor film 111 and the channel protective film to be reduced. Accordingly, a leakage current flowing between the source electrode and the drain electrode of the transistor can be reduced. The channel protective transistor can also be used for the first driver circuit 104 and the second driver circuit 106.

Although the transistor in the aforementioned pixel 101 is a transistor having one gate electrode, a transistor having two gate electrodes facing each other with the oxide semiconductor film 111 interposed therebetween can be used. Note that an example of the transistor including two gate electrodes is the transistor illustrated in FIG. 2, which includes the gate electrode 227 and the conductive film 241 and is used for the first driver circuit 104.

In the aforementioned transistor including two gate electrodes, a conductive film is provided over the insulating film 132 of the transistor 103 described in this embodiment. The conductive film overlaps with at least a channel formation region of the oxide semiconductor film 111. It is preferable that the conductive film be provided in a position overlapping with the channel formation region of the oxide semiconductor film 111 so that the potential of the conductive film is equal to the minimum potential of a video signal input to the signal line 109. In that case, it is possible to control a current flowing between the source electrode and the drain electrode at a surface of the oxide semiconductor film 111 facing the conductive film, whereby variation in the electrical characteristics between transistors can be reduced. Further, the conductive film allows the oxide semiconductor film 111 to be less influenced by a change in ambient electric field, leading to an improvement in the reliability of the transistor.

The above conductive film can be formed using a material and a method similar to those of the scan line 107, the signal line 109, the pixel electrode 121, or the like.

As described above, when the semiconductor film formed in the same step as the semiconductor film included in the transistor is used for one electrode of the capacitor, a semiconductor device including the capacitor with increased charge capacity can be manufactured while the aperture ratio is improved. As a result, the semiconductor device with excellent display quality can be obtained.

In addition, since the semiconductor film used as one electrode of the capacitor is formed in contact with the nitride insulating film, impurities can be diffused from the nitride insulating film into the semiconductor film, so that an n-type semiconductor film can be effectively obtained. Moreover, the opening for making the semiconductor film in contact with the nitride insulating film can be formed in the same step as the opening that is formed in the gate insulating film so that the gate electrode is connected to other wirings; hence, there is no increase in the number of masks.

Furthermore, the oxide semiconductor film that is the semiconductor film in the transistor includes reduced oxygen vacancies and impurities such as hydrogen; accordingly, the semiconductor device of one embodiment of the present invention has good electrical characteristics.

Note that this embodiment can be combined with any of the other embodiments shown in this specification.

Embodiment 2

Described in this embodiment is one mode of an oxide semiconductor film which can be used as a semiconductor film in the transistor and the capacitor included in the semiconductor device described in the above embodiment.

An oxide semiconductor may include a non-single-crystal. The non-single-crystal is, for example, structured by at least one of c-axis aligned crystal (CAAC), polycrystal, microcrystal, and an amorphous part.

An oxide semiconductor may include CAAC. Note that an oxide semiconductor including CAAC is referred to as a CAAC-OS (c-axis aligned crystalline oxide semiconductor).

In an image obtained with a transmission electron microscope (TEM), crystal parts can be found in the CAAC-OS in some cases. In most cases, in an image obtained with a TEM, crystal parts in the CAAC-OS each fit inside a cube whose one side is less than 100 nm. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, segregation of an impurity is unlikely to occur. In the CAAC-OS, since a clear boundary does not exist, high density of defect states is unlikely to occur. In the CAAC-OS, since a clear grain boundary does not exist, a reduction in electron mobility is unlikely to occur.

The CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak appears at 2θ of around 31° in some cases. In the case of a crystal of $InGaZnO_4$, the peak at 2θ of around 31° indicates that the crystal of $InGaZnO_4$ has (009) plane alignment. Further, in the CAAC-OS, a peak appears at 2θ of around 31° in some cases. In the case of a crystal of $ZnGa_2O_4$, the peak at 2θ of around 31° indicates that the crystal of $ZnGa_2O_4$ has (222) plane alignment. In the CAAC-OS, it is preferable that the peak appear at 2θ of around 31° and do not appear at 2θ=around 36°.

In the CAAC-OS, among crystal parts, the directions of the a-axis and the b-axis of one crystal part are different from those of another crystal part, in some cases. When the CAAC-OS including a crystal of $InGaZnO_4$ is analyzed with an X-ray diffractometer by an in-plane method in which an X-ray enters a sample in the direction perpendicular to the c-axis, a peak appears at 2θ of around 56° in some cases. The peak at 2θ of around 56° is derived from the (110) plane of the $InGaZnO_4$ crystal. Here, when 2θ is fixed at around 56°, a sample is rotated using a normal vector of a surface of the sample as an axis (φ axis), and analysis (φ scan) is performed; although six peaks having symmetry appear in the case of a single crystal oxide semiconductor in which the directions of an a-axis and a b-axis of one crystal part are the same as those of another crystal part, a peak is not clearly observed in the case of the CAAC-OS.

As described above, in the CAAC-OS, c-axes are aligned, and a-axes and/or b-axes are not macroscopically aligned, in some cases.

Further, spots (luminescent spots) are shown in an electron diffraction pattern of the CAAC-OS in some cases. An electron diffraction pattern obtained with an electron beam having a diameter of 10 nmφ or smaller, or 5 nmφ or smaller, is called a nanobeam electron diffraction pattern.

Figure 10A:
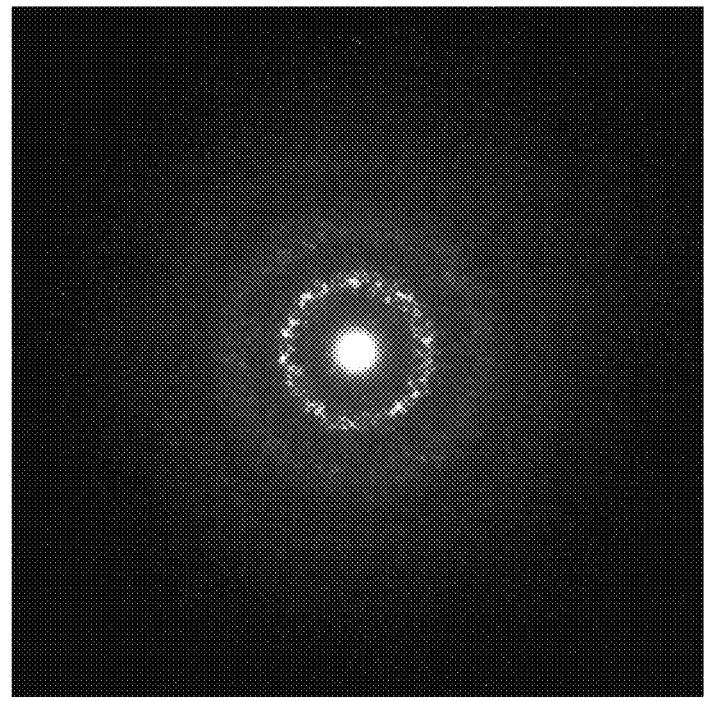
FIGS. 10A and 10B show nanobeam electron diffraction patterns.

FIG. 10A shows an example of a nanobeam electron diffraction pattern of a sample including CAAC-OS. Here, the sample is cut in the direction perpendicular to a surface where the CAAC-OS is formed and the thickness thereof is reduced to about 40 nm Further, an electron beam with a diameter of 1 nmφ enters from the direction perpendicular to the cut surface of the sample. FIG. 10A shows that spots are observed in the nanobeam electron diffraction pattern of the CAAC-OS.

In each of the crystal parts included in the CAAC-OS, a c-axis is aligned in the direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

The CAAC-OS could be obtained by reducing the impurity concentration. The impurity means here an element other than the main components of the oxide semiconductor, such as hydrogen, carbon, silicon, or a transition metal element. In particular, an element such as silicon has a higher strength to bond with oxygen than that of a metal element included in the oxide semiconductor. Therefore, when the element takes oxygen away in the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS, distribution of crystal parts is not necessarily uniform. For example, in the formation process of the CAAC-OS, in the case where crystal growth occurs from a surface side of the oxide semiconductor, the proportion of crystal parts in the vicinity of the surface of the oxide semiconductor is higher than that in the vicinity of the surface where the oxide semiconductor is formed in some cases. Further, when an impurity is mixed into the CAAC-OS, the crystallinity of the crystal part in a region into which the impurity is mixed is lowered in some cases.

Further, the CAAC-OS can be formed by reducing the density of defect states. In an oxide semiconductor, oxygen vacancies form defect states. The oxygen vacancies form trap states or serve as carrier generation sources when hydrogen is captured therein. In order to form the CAAC-OS, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. Charges trapped by the trap states in the oxide semiconductor take a long time to be released and may behave like fixed charges. Thus, the transistor which includes the oxide semiconductor having a high density of trap states in the channel formation region has unstable electrical characteristics in some cases.

A transistor including the highly purified intrinsic or substantially highly purified intrinsic CAAC-OS has a small variation in the electrical characteristics due to irradiation with visible light or ultraviolet light.

The CAAC-OS can be formed by a sputtering method using a DC power source, for example.

The oxide semiconductor may include polycrystal. Note that an oxide semiconductor including polycrystal is referred to as a polycrystalline oxide semiconductor. A polycrystalline oxide semiconductor includes a plurality of crystal grains.

In a TEM image of the polycrystalline oxide semiconductor, crystal grains can be found. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in an image obtained with the TEM. Moreover, in the TEM image, a boundary between crystal grains can be found in the polycrystalline oxide semiconductor in some cases. Also in the TEM image, a grain boundary can be found in the polycrystalline oxide semiconductor in some cases.

The polycrystalline oxide semiconductor may include a plurality of crystal grains, and the alignment of crystals may be different in the plurality of crystal grains. When a polycrystalline oxide semiconductor is analyzed by an out-of-plane method with use of an XRD apparatus, a peak at 2θ of around 31 degrees which shows alignment or a peak showing plural kinds of alignment appears in some cases. Further, spots are observed in a nanobeam electron diffraction pattern of the polycrystalline oxide semiconductor in some cases.

The polycrystalline oxide semiconductor has high crystallinity and thus has high electron mobility in some cases. Accordingly, a transistor using the polycrystalline oxide semiconductor for a channel formation region has high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a carrier trap or a carrier generation source, a transistor using the polycrystalline oxide semiconductor for a channel formation region has larger variation in electrical characteristics and lower reliability than a transistor using a CAAC-OS for a channel formation region in some cases.

The polycrystalline oxide semiconductor can be formed by high-temperature heat treatment or laser light treatment.

The oxide semiconductor may include microcrystal. Note that an oxide semiconductor including microcrystal is referred to as a microcrystalline oxide semiconductor.

In an image obtained with a TEM, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm A microcrystal with a size greater than or equal to 1 nm and less than or equal to 10 nm is specifically referred to as nanocrystal (nc). An oxide semiconductor including nanocrystal is referred to as an nc-OS (nanocrystalline oxide semiconductor). In a TEM image of the nc-OS, since a clear grain boundary does not exist, segregation of an impurity is unlikely to occur. In the nc-OS, since a clear boundary does not exist, high density of defect states is unlikely to occur. In the nc-OS, since a clear grain boundary does not exist, a reduction in electron mobility is unlikely to occur.

In the nc-OS, a microscopic region (for example, a region with a size greater than or equal to 1 nm and less than or equal to 10 nm) has a periodic atomic order occasionally. Further, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, depending on an analysis method. When the nc-OS film is analyzed by an out-of-plane method with an XRD apparatus using an X-ray having a beam diameter larger than that of a crystal part, a peak which shows alignment does not appear in some cases. Further, a halo pattern is shown in some cases in an electron diffraction pattern of the nc-OS obtained by using an electron beam having a diameter larger than that of a crystal part (for example, a beam diameter of 20 nmφ or more, or 50 nmφ or more). Spots are shown in some cases in a nanobeam electron diffraction pattern of the nc-OS obtained by using an electron beam having a diameter smaller than or equal to that of a crystal part (for example, a beam diameter of 10 nmφ or less, or 5 nmφ or less). In a nanobeam electron diffraction pattern of the nc-OS, regions with high luminance in a circular pattern are shown in some cases. In a nanobeam electron diffraction pattern of the nc-OS, a plurality of spots are shown in the region in some cases.

Figure 10B:
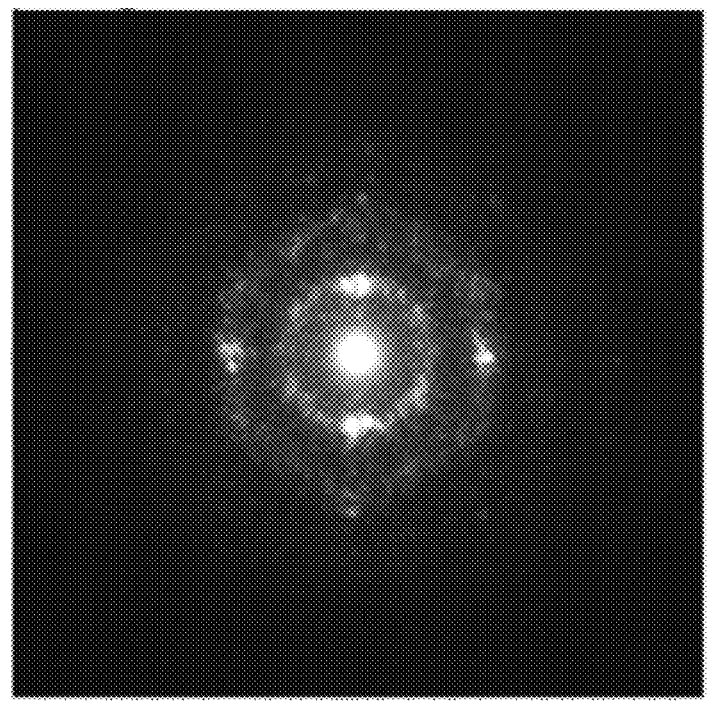

FIG. 10B shows an example of a nanobeam electron diffraction pattern of a sample including nc-OS. Here, the sample is cut in the direction perpendicular to a surface where the nc-OS is formed and the thickness thereof is reduced to about 40 nm Further, an electron beam with a diameter of 1 nmφ enters from the direction perpendicular to the cut surface of the sample. FIG. 10B shows that spots are observed in the nanobeam electron diffraction pattern of the nc-OS.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Accordingly, the nc-OS has higher carrier density than the CAAC-OS in some cases. An oxide semiconductor with a high carrier density tends to have a high electron mobility. Therefore, a transistor using the nc-OS for a channel formation region has a high field-effect mobility in some cases. On the contrary, the nc-OS has higher density of defect states than the CAAC-OS and thus has higher density of trap states in some cases. Therefore, a transistor using the nc-OS for a channel formation region has larger variation in electrical characteristics and lower reliability than a transistor using the CAAC-OS for a channel formation region. Note that the nc-OS can be obtained even when the amount of impurity contained therein is relatively large; thus, the nc-OS is sometimes preferably used depending on the application. Further, the nc-OS may be formed by a deposition method such as a sputtering method using an AC power supply. The sputtering method using an AC power supply allows a film to be formed with high uniformity over a large substrate, so that a semiconductor device including a transistor using the nc-OS for a channel formation region can be manufactured with high productivity.

An oxide semiconductor may include an amorphous part. Note that an oxide semiconductor including an amorphous part is referred to as an amorphous oxide semiconductor. An amorphous oxide semiconductor has disordered atomic arrangement and no crystal part. An amorphous oxide semiconductor does not have a specific shape as in quartz and regularity in atomic arrangement.

In a TEM image of the amorphous oxide semiconductor, crystal parts cannot be found in some cases.

When an amorphous oxide semiconductor is analyzed by an out-of-plane method with an XRD apparatus, a peak which shows alignment does not appear in some cases. Further, a halo pattern is observed in an electron diffraction pattern of the amorphous oxide semiconductor in some cases. In other cases, a halo pattern is observed instead of a spot in a nanobeam electron diffraction pattern of the amorphous oxide semiconductor.

In some cases, the amorphous oxide semiconductor can be formed by introducing a high-concentration impurity such as hydrogen. Hence, the amorphous oxide semiconductor is an oxide semiconductor containing a high-concentration impurity.

When an oxide semiconductor contains a high-concentration impurity, a defect state such as an oxygen vacancy is formed in the oxide semiconductor in some cases.

This means that an amorphous oxide semiconductor with a high-concentration impurity has a high density of defect states. In addition, since the amorphous oxide semiconductor has low crystallinity, the density of defect states of the amorphous oxide semiconductor is higher than that of the CAAC-OS or the nc-OS.

Thus, the amorphous oxide semiconductor has a much higher carrier density than the nc-OS in some cases. Therefore, a transistor using the amorphous oxide semiconductor for a channel formation region tends to be normally on, and sometimes can be preferably used for a transistor which needs to have such electrical characteristics. The amorphous oxide semiconductor has a high density of defect states and thus has a high density of trap states in some cases. Therefore, a transistor using the amorphous oxide semiconductor for a channel formation region has larger variation in electrical characteristics and lower reliability than a transistor using the CAAC-OS or the nc-OS for a channel formation region in some cases. Note that the amorphous oxide semiconductor can be formed by a deposition method in which a relatively large amount of impurity is contained, and thus can be easily obtained and preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor for a channel formation region can be manufactured with high productivity.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a layered structure of two or more of an amorphous oxide semiconductor region, a microcrystalline oxide semiconductor region, a polycrystalline oxide semiconductor region, and a CAAC-OS region in some cases.

An oxide semiconductor may include a single crystal, for example. Note that an oxide semiconductor including a single crystal is referred to as a single crystal oxide semiconductor.

The single crystal oxide semiconductor has, for example, a low impurity concentration and a low density of defect states (a small number of oxygen vacancies), and thus has a low carrier density. Therefore, a transistor using the single crystal oxide semiconductor for a channel formation region is unlikely to be normally on. Further, the single crystal oxide semiconductor has a low density of defect states and thus has a low density of trap states in some cases. Therefore, a transistor using the single crystal oxide semiconductor for a channel formation region has a small variation in electrical characteristics and a high reliability in some cases The oxide semiconductor has a high density if including few defects in some cases. The oxide semiconductor has a high density if having a high crystallinity in some cases. The oxide semiconductor has a high density if including a low-concentration impurity such as hydrogen. Further, the density of a single crystal oxide semiconductor is higher than that of a CAAC-OS in some cases. Further, the density of a CAAC-OS is higher than that of a microcrystalline oxide semiconductor in some cases. Further, the density of a polycrystalline oxide semiconductor is higher than that of a microcrystalline oxide semiconductor in some cases. Further, the density of a microcrystalline oxide semiconductor is higher than that of an amorphous oxide semiconductor in some cases.

The CAAC-OS is preferably deposited under the following conditions.

By reducing the amount of impurities entering the CAAC-OS during the deposition, the crystal state can be prevented from being broken by the impurities. For example, the concentration of impurities (e.g., hydrogen, water, carbon dioxide, or nitrogen) which exist in a deposition chamber may be reduced. Further, the concentration of impurities in a deposition gas may be reduced. Specifically, a deposition gas whose dew point is −80° C. or lower, preferably −100° C. or lower is used.

By increasing the heating temperature of the surface where the CAAC-OS is formed (e.g., the substrate heating temperature) during the deposition, migration of a sputtered particle occurs after the sputtered particle reaches the surface where the CAAC-OS is formed. Specifically, the temperature of the surface where the CAAC-OS is formed during the deposition is higher than or equal to 100° C. and lower than or equal to 740° C., preferably higher than or equal to 150° C. and lower than or equal to 500° C.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

An example of an In—Ga—Zn—O compound target as the sputtering target is described below.

The In—Ga—Zn-based metal oxide target, which is polycrystalline, is made by mixing $InO_x$ powder, $GaO_y$ powder, and $ZnO_z$ powder in a predetermined molar ratio, applying pressure, and performing heat treatment at a temperature higher than or equal to 1000° C. and lower than or equal to 1500° C. The pressure treatment may be performed while cooling is performed or may be performed while heating is performed. Note that X, Y, and Z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the sputtering target that is to be formed.

Table 1 shows the comparison between oxide semiconductors (OS) and silicon (Si) in a crystal state.

TABLE 1

|  |  | Amorphous | Micro-crystal | Polycrystal | Continuous crystal | Single crystal |
|---|---|---|---|---|---|---|
| OS |  | a-OS<br>a-OS:H | nc-OS<br>μc-OS | Polycrystalline OS | CAAC-OS | Single crystal OS |
|  | Nanobeam electron diffraction | Halo | Ring + Spot | Spot | Spot | Spot |
|  | Crystal part | — | nm-μm | Discontinuous | Continuously connected | — |
|  | DOS | High | Slightly low | — | Low | Extremely low |
|  | Density | Low | Medium | — | High | — |
| Si |  | a-Si<br>a-Si:H | nc-Si<br>μc-Si | Polycrystalline Si | CG silicon | Single crystal Si |

Examples of the crystal state of the oxide semiconductor include, as shown in Table 1, an amorphous oxide semiconductor (a-OS, a-OS: H), a microcrystalline oxide semiconductor (nc-OS, μac-OS), a polycrystalline oxide semiconductor (polycrystalline OS), a continuous crystal oxide semiconductor (CAAC-OS), and a single crystal oxide semiconductor (single crystal OS). Examples of the crystal state of silicon include, as shown in Table 1, amorphous silicon (a-Si, a-Si: H), microcrystalline silicon (nc-Si, μc-Si), polycrystalline silicon (polycrystalline Si), continuous crystal silicon (CG (continuous grain) silicon), and single crystal silicon (single crystal Si).

The oxide semiconductors in the above crystal states are subjected to electron diffraction using an electron beam with a diameter reduced to 10 nmϕ or less (nanobeam electron diffraction). Then, the following electron diffraction patterns (nanobeam electron diffraction patterns) are observed. A halo pattern (also called a halo ring or a halo) is observed in the amorphous oxide semiconductor. A spot or/and a ring pattern is/are observed in the microcrystalline oxide semiconductor. A spot is observed in the polycrystalline oxide semiconductor. A spot is observed in the continuous crystal oxide semiconductor. A spot is observed in the single crystal oxide semiconductor.

The nanobeam electron diffraction pattern shows that the microcrystalline oxide semiconductor includes a crystal part with a diameter of nanometers (nm) to micrometers (μm). The polycrystalline oxide semiconductor is found to have a grain boundary between crystal parts, that is, a discontinuous boundary. The continuous crystal oxide semiconductor is found to have no boundary between crystal parts, that is, a continuous boundary.

The density of the oxide semiconductor in each crystal state is as follows. The amorphous oxide semiconductor has a low density. The microcrystalline oxide semiconductor has a medium density. The continuous crystal oxide semiconductor has a high density. In other words, the density of the continuous crystal oxide semiconductor is higher than that of the microcrystalline oxide semiconductor, and the density of the microcrystalline oxide semiconductor is higher than that of the amorphous oxide semiconductor.

Density of states (DOS) in the oxide semiconductor in each crystal state is as follows. The amorphous oxide semiconductor has a high DOS. The microcrystalline oxide semiconductor has a rather low DOS. The continuous crystal oxide semiconductor has a low DOS. The single crystal oxide semiconductor has an extremely low DOS. In other words, the DOS of the single crystal oxide semiconductor is lower than that of the continuous crystal oxide semiconductor, the DOS of the continuous crystal oxide semiconductor is lower than that of the microcrystalline oxide semiconductor, and the DOS of the microcrystalline oxide semiconductor is lower than that of the amorphous oxide semiconductor.

The oxide semiconductor film may include a plurality of oxide semiconductor films stacked. For example, as in a transistor illustrated in FIG. 9A, a first oxide semiconductor film 188a and a second oxide semiconductor film 188b may be stacked to be used as the semiconductor film. The first oxide semiconductor film 188a and the second oxide semiconductor film 188b may include metal oxides having different atomic ratios. For example, one of the oxide semiconductor films may include one of an oxide containing two kinds of metals, an oxide containing three kinds of metals, and an oxide containing four kinds of metals, and the other of the oxide semiconductor films may include another one of the oxide containing two kinds of metals, the oxide containing three kinds of metals, and the oxide containing four kinds of metals.

Alternatively, the first oxide semiconductor film 188a and the second oxide semiconductor film 188b may include the same constituent elements with different atomic ratios. For example, one of the oxide semiconductor films may contain In, Ga, and Zn at an atomic ratio of 3:1:2, and the other of the oxide semiconductor films may contain In, Ga, and Zn at an atomic ratio of 1:1:1. Alternatively, one of the oxide semiconductor films may contain In, Ga, and Zn at an atomic ratio of 2:1:3, and the other of the oxide semiconductor films may contain In, Ga, and Zn at an atomic ratio of 1:3:2. Alternatively, one of the oxide semiconductor films may contain In, Ga, and Zn at an atomic ratio of 1:1:1, and the other of the oxide semiconductor films may contain In, Ga, and Zn at an atomic ratio of 1:3:2. Alternatively, one of the oxide semiconductor films may contain In, Ga, and Zn at an atomic ratio of 1:1:1, and the other of the oxide semiconductor films may contain In, Ga, and Zn at an atomic ratio of 1:6:4. Alternatively, one of the oxide semiconductor films may contain In, Ga, and Zn at an atomic ratio of 1:1:1, and the other of the oxide semiconductor films may contain In, Ga, and Zn at an atomic ratio of 1:9:6. Note that the proportion of each atom in the atomic ratio of the oxide semiconductor film varies within a range of ±20% as an error.

In the above, one of the first oxide semiconductor film and the second oxide semiconductor film, which is closer to the gate electrode (the oxide semiconductor film on the channel side), has an atomic ratio of In Ga; and the other oxide semiconductor film, which is farther from the gate electrode (the oxide semiconductor film on the back channel side), has an atomic ratio of In<Ga. In that case, a transistor with a high field-effect mobility can be manufactured. On the other hand, when the oxide semiconductor film on the channel side has an atomic ratio of In<Ga and the oxide semiconductor film on the back channel side has an atomic ratio of In Ga, it is possible to reduce the amount of change in the threshold voltage of a transistor due to change over time or a reliability test.

Further alternatively, the semiconductor film of the transistor may have a three-layer structure of a first oxide semiconductor film, a second oxide semiconductor film, and a third oxide semiconductor film. In that case, the first to third oxide semiconductor films may include the same constituent elements with different atomic ratios. A transistor including a three-layer semiconductor film will be described with reference to FIG. 9B.

Figure 9A:
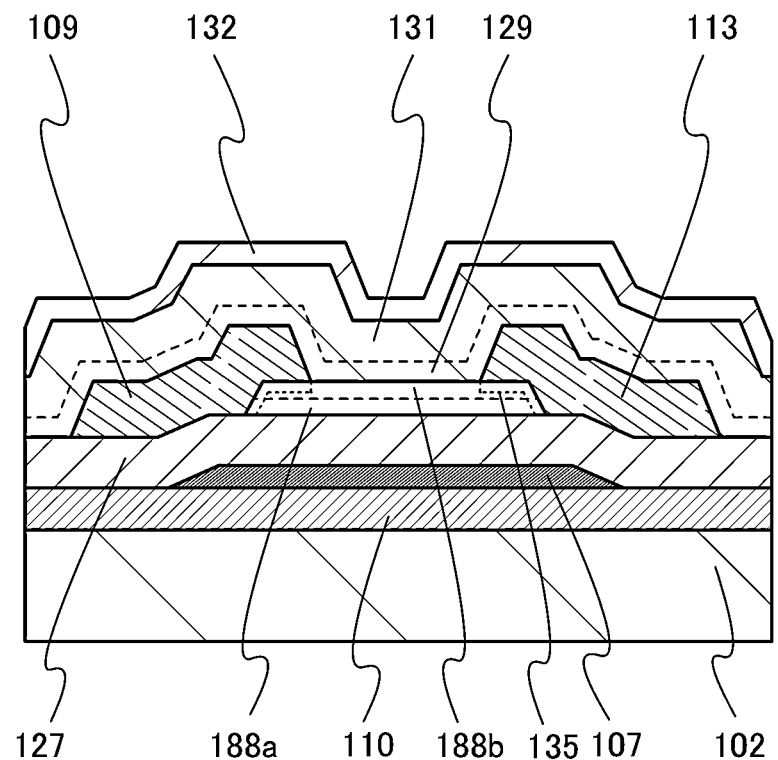
FIGS. 9A and 9B show cross-sectional views each illustrating a semiconductor device.
Figure 9B:
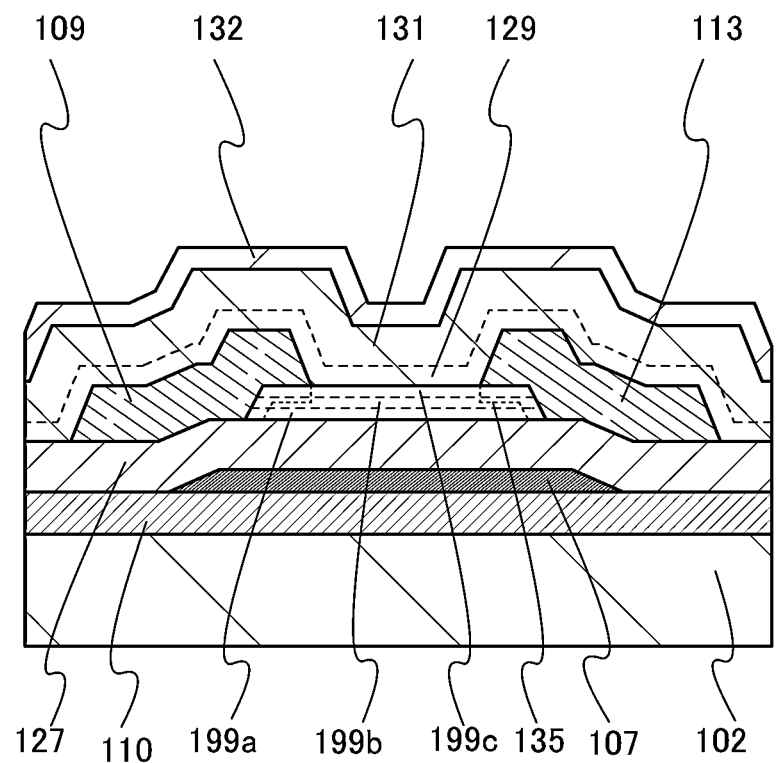

The transistor illustrated in FIG. 9B includes a first oxide semiconductor film 199a, a second oxide semiconductor film 199b, and a third oxide semiconductor film 199c which are stacked in this order from the gate insulating film 127 side. The first oxide semiconductor film 199a and the third oxide semiconductor film 199c are formed using a material represented by $InM_{1x}Zn_xZn_yO_z$ (x≥1, y>1, z>0, $M_1$ =Ga, Hf, or the like). Note that in the case where each of the first oxide semiconductor film 199a and the third oxide semiconductor film 199c contains Ga, a material containing a large proportion of Ga, specifically, a material which can be represented by $InM_{1x}Zn_yO_z$ where x is larger than 10 is unsuitable because powder might be generated in deposition.

The second oxide semiconductor film 199b is formed using a material which can be represented by $M_{2x}Zn_yO_z$ (x≥1, y≥x, z>0, $M_2$=Ga, Sn, or the like).

Materials of the first to third oxide semiconductor films 199a to 199c are selected as appropriate so as to form a well-shaped structure in which the bottom of the conduction band in the second oxide semiconductor film 199b is deeper from the vacuum level than the bottoms of the conduction band in the first and third oxide semiconductor films 199a and 199c.

Note that silicon and carbon, which are Group 14 elements, sometimes contribute to the formation of donor levels in an oxide semiconductor film. Therefore, silicon or carbon contained in the oxide semiconductor film makes an n-type oxide semiconductor film. Thus, the oxide semiconductor film is preferably formed so as to have a region where the concentration of each of silicon and carbon is less than or equal to $3\times10^{18}/cm^3$, preferably less than or equal to $3\times10^{17}/cm^3$. It is particularly preferable that the second oxide semiconductor film 199b serving as a carrier path be sandwiched between or surrounded by the first and third oxide semiconductor films 199a and 199c so that a large number of Group 14 elements do not enter the second oxide semiconductor film 199b. That is to say, the first and third oxide semiconductor films 199a and 199c can also be called barrier films which prevent Group 14 elements such as silicon and carbon from entering the second oxide semiconductor film 199b.

For example, the first oxide semiconductor film 199a and the third oxide semiconductor film 199c may each have an atomic ratio of In: Ga: Zn=1:3:2, 1:6:4, or 1:9:6; the second oxide semiconductor film 199b may have an atomic ratio of In: Ga: Zn=1:1:1 or 3:1:2.

Alternatively, the first oxide semiconductor film 199a may have an atomic ratio of In: Ga: Zn=1:3:2, the second oxide semiconductor film 199b may have an atomic ratio of In: Ga: Zn=1:1:1 or 3:1:2, and the third oxide semiconductor film 199c may have an atomic ratio of In: Ga: Zn=1:6:4 or 1:9:6.

Since the first to third oxide semiconductor films 199a to 199c include the same constituent elements, the second oxide semiconductor film 199b has few defect states (trap levels) at the interface with the first oxide semiconductor film 199a. Specifically, the defect states (trap levels) are fewer than those at the interface between the gate insulating film 127 and the first oxide semiconductor film 199a. For this reason, when the oxide semiconductor films are stacked in the above manner, the amount of change in the threshold voltage of a transistor due to a change over time or a reliability test can be reduced.

Further, materials of the first to third oxide semiconductor films 199a to 199c are selected as appropriate so as to form a well-shaped structure in which the bottom of the conduction band in the second oxide semiconductor film 199b is deeper from the vacuum level than the bottoms of the conduction band in the first and third oxide semiconductor films 199a and 199c. As a result, the field-effect mobility of the transistor can be increased and the amount of change in the threshold voltage of the transistor due to change over time or a reliability test can be reduced.

Further, the first to third oxide semiconductor films 199a to 199c may be formed using oxide semiconductors having different crystallinities. That is, the first to third oxide semiconductor films may be formed using a combination of any of a single crystal oxide semiconductor, a polycrystalline oxide semiconductor, a microcrystalline (nanocrystalline) oxide semiconductor, an amorphous oxide semiconductor, and a CAAC-OS. By using an amorphous oxide semiconductor for any one of the first to third oxide semiconductor films 199a to 199c, it is possible to relieve the internal stress or external stress of the oxide semiconductor film, reduce a variation in the characteristics of a transistor, and reduce a variation in the threshold voltage of the transistor due to a change over time or a reliability test.

At least the second oxide semiconductor film 199b, which can serve as a channel formation region, is preferably a CAAC-OS film.

When the oxide semiconductor film is in contact with a conductive material which is easily bonded to oxygen (e.g., a metal used for the source electrode or the drain electrode), oxygen in the oxide semiconductor film is diffused into the conductive material which is easily bonded to oxygen. Such phenomenon occurs more frequently as the temperature is raised. Some heating steps are included in the manufacturing process of the transistor; thus, owing to the phenomenon, oxygen vacancies are generated in and around the region of the oxide semiconductor layer which is in contact with the source electrode or the drain electrode, so that the region becomes an n-type region. Accordingly, the n-type region can serve as a source or drain of the transistor.

The above n-type region is illustrated in FIGS. 9A and 9B. A boundary 135 indicated by a dotted line in the semiconductor film is the boundary between an intrinsic semiconductor region and the n-type semiconductor region. In the oxide semiconductor, a region near and in contact with the source electrode or the drain electrode becomes the n-type region. The boundary 135 is schematically illustrated here, but actually the boundary is not clearly seen in some cases. The position of the boundary 135 is also different in some cases.

Note that this embodiment can be combined with any of the other embodiments shown in this specification.

Embodiment 3

Described in this embodiment are the electron diffraction pattern and localized states of a nanocrystalline oxide semiconductor film that can be used in one embodiment of the present invention.

When a nanocrystalline oxide semiconductor film is observed with electron diffraction (nanobeam electron diffraction) with a beam diameter of 10 nmϕ or less, spots without directionality are found in the electron diffraction pattern thereof. This electron diffraction pattern of the nanocrystalline oxide semiconductor film is neither a halo pattern indicating an amorphous state nor a pattern with regular spots indicating a crystal state in which crystals are aligned in a specific surface.

Figure 13A:
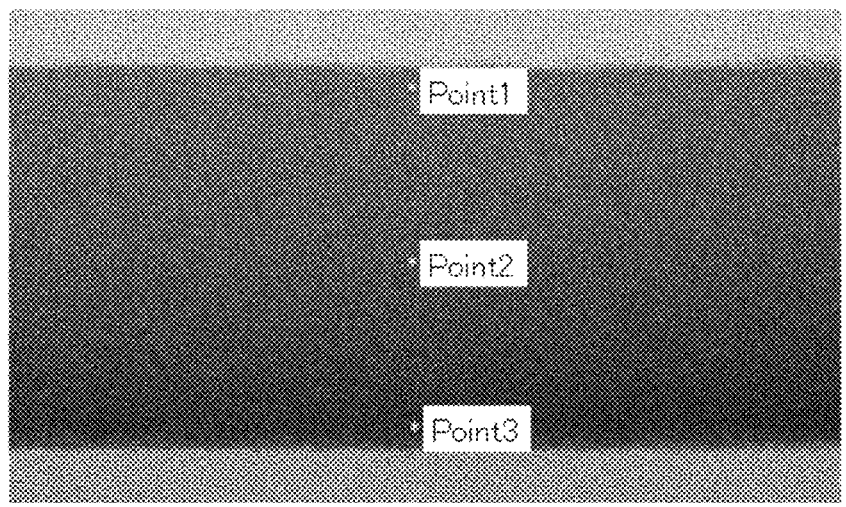
FIG. 13A shows a cross-sectional TEM image of an oxide semiconductor film and FIGS. 13B to 13D show nanobeam electron diffraction patterns.
Figure 13B:
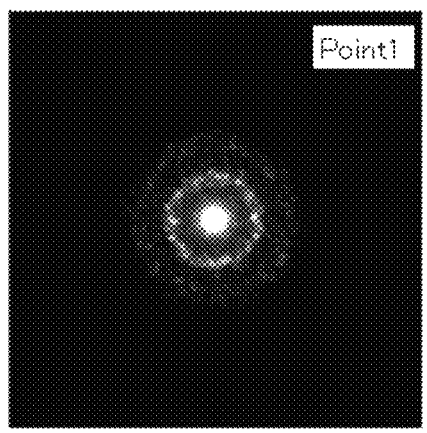
Figure 13C:
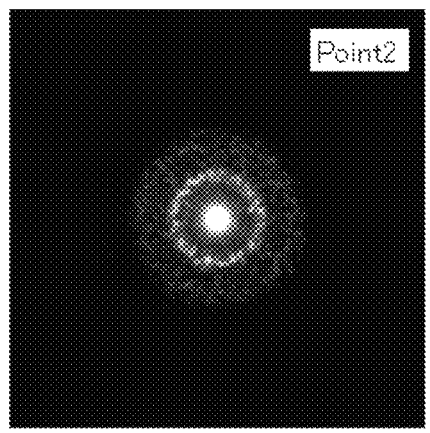
Figure 13D:
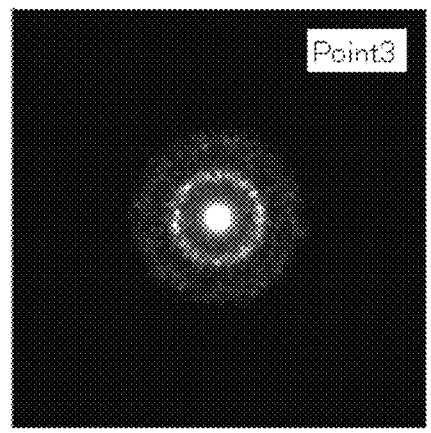

FIG. 13A shows a cross-sectional transmission electron microscopy (TEM) image of the nanocrystalline oxide semiconductor film. FIGS. 13B, 13C, and 13D show electron diffraction patterns on points 1, 2, and 3 in FIG. 13A, respectively, which are observed by nanobeam electron diffraction.

In FIGS. 13A to 13D, as an example of the nanocrystalline oxide semiconductor film, a 50-nm-thick In—Ga—Zn-based oxide film was formed over a quartz glass substrate. The nanocrystalline oxide semiconductor film was formed under the following conditions: an oxide target containing In, Ga, and Zn at an atomic ratio of 1:1:1 was used; an oxygen atmosphere (flow rate of 45 sccm) was used; the pressure was 0.4 Pa; a direct-current (DC) power of 0.5 kW was applied; and the substrate temperature was room temperature. Then, the width of the formed nanocrystalline oxide semiconductor film was reduced to less than or equal to 100 nm (e.g., 40 nm±10 nm) and a cross-sectional TEM image and nanobeam electron diffraction patterns were observed.

FIG. 13A shows the cross-sectional TEM image of the nanocrystalline oxide semiconductor film which was taken with a transmission electron microscope ("H-9000NAR" manufactured by Hitachi High-Technologies Corporation) at an acceleration voltage of 300 kV and a magnification of 2,000,000 times. FIGS. 13B to 13D show electron diffraction patterns obtained by nanobeam electron diffraction with a beam diameter of about 1 nmϕ, which was observed with a transmission electron microscope ("HF-2000" manufactured by Hitachi High-Technologies Corporation) at an acceleration voltage of 200 kV. Note that the measurement area of the nanobeam electron diffraction with a beam diameter of about 1 nmϕ was greater than or equal to 5 nmϕ and less than or equal to 10 nmϕ.

As shown in FIG. 13B, when the nanocrystalline oxide semiconductor film is observed with the nanobeam electron diffraction, an electron diffraction pattern including circumferentially arranged spots (bright points) is obtained. In other words, in the nanocrystalline oxide semiconductor film, a plurality of circumferentially (concentrically) distributed spots are observed, or a plurality of circumferentially distributed spots form a plurality of concentric circles.

A plurality of circumferentially distributed spots are observed not only in FIG. 13B, but also in FIG. 13C which shows the center of the nanocrystalline oxide semiconductor film in the thickness direction and in FIG. 13D which shows the vicinity of the interface with the quartz glass substrate. In FIG. 13C, the distance from a main spot to the circumferentially distributed spots is in a range from 3.88/nm to 4.93/nm, or from 0.203 nm to 0.257 nm when converted into interplanar spacing.

The nanobeam electron diffraction patterns in FIGS. 13A to 13D show that the nanocrystalline oxide semiconductor film includes a plurality of crystal parts with irregular surface orientations and different sizes.

Figure 14A:
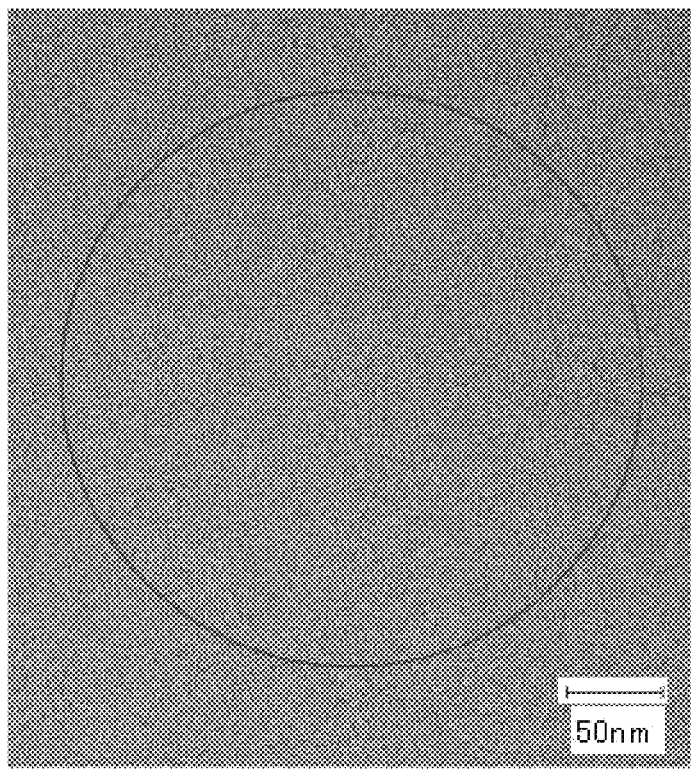
FIG. 14A shows a plane TEM image of an oxide semiconductor film and FIG. 14B shows a selected-area electron diffraction pattern.
Figure 14B:
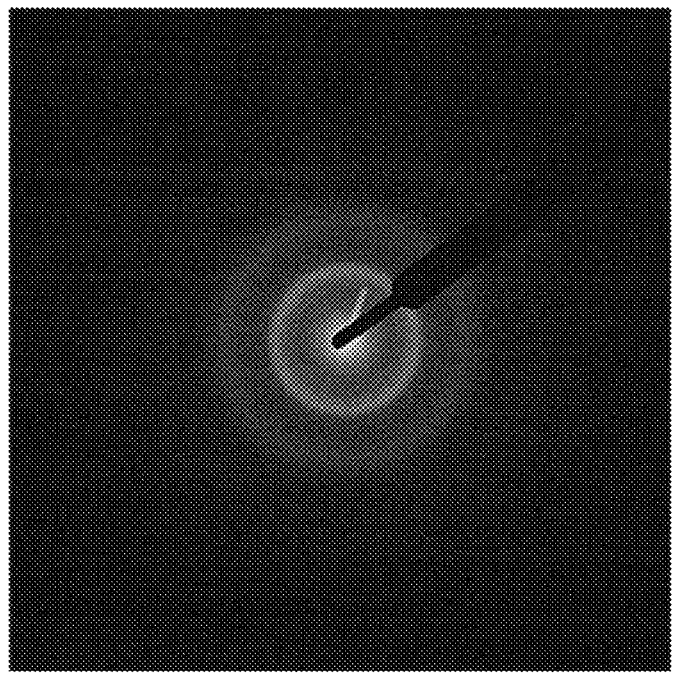

FIG. 14A shows a plane TEM image of the nanocrystalline oxide semiconductor film. FIG. 14B shows an electron diffraction pattern of a region surrounded by a circle in FIG. 14A, which is observed by selected-area electron diffraction.

In FIGS. 14A and 14B, as an example of the nanocrystalline oxide semiconductor film, a 30-nm-thick In—Ga—Zn-based oxide film was formed over a quartz glass substrate. The nanocrystalline oxide semiconductor film in FIGS. 14A and 14B was formed under the following conditions: an oxide target containing In, Ga, and Zn at an atomic ratio of 1:1:1 was used; an oxygen atmosphere (flow rate of 45 sccm) was used; the pressure was 0.4 Pa; a direct-current (DC) power of 0.5 kW was applied; and the substrate temperature was room temperature. Then, the sample was thinned, and a plane TEM image and a selected-area electron diffraction pattern of the nanocrystalline oxide semiconductor film were observed.

FIG. 14A shows the plane TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 500,000 times. FIG. 14B shows the electron diffraction pattern obtained by electron diffraction with a selected area of 300 nmϕ. Note that the measurement area in FIG. 14B is greater than or equal to 300 nmϕ in consideration of electron beam expansion (about several nanometers).

As shown in FIG. 14B, when the nanocrystalline oxide semiconductor film is observed by selected-area electron diffraction the measurement area of which is wider than that of the nanobeam electron diffraction, the plurality of spots observed by nanobeam electron diffraction are not observed in the electron diffraction pattern and a halo pattern is observed.

Figure 15A:
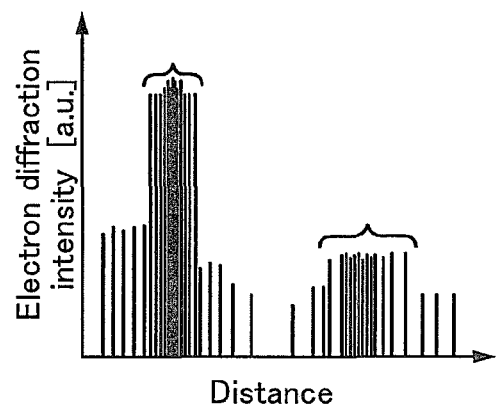
FIGS. 15A to 15C show conceptual diagrams of electron diffraction intensity distribution.
Figure 15B:
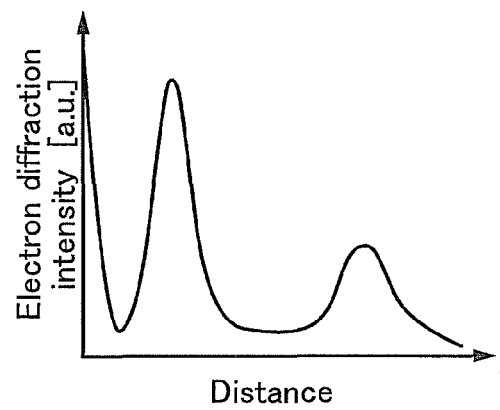
Figure 15C:
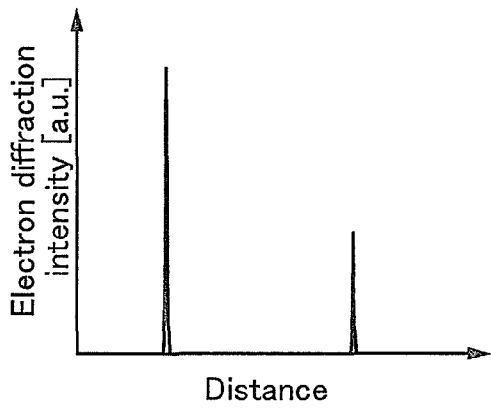

FIGS. 15A to 15C conceptually show diffraction intensity distribution in the electron diffraction patterns in FIGS. 13A to 13D and FIGS. 14A and 14B. FIG. 15A shows a conceptual diagram of diffraction intensity distribution in the nanobeam electron diffraction patterns in FIGS. 13B to 13D. FIG. 15B shows a conceptual diagram of diffraction intensity distribution in the selected-area electron diffraction pattern in FIG. 14B. FIG. 15C shows a conceptual diagram of diffraction intensity distribution in an electron diffraction pattern of a single crystal structure or a polycrystalline structure.

In each of FIGS. 15A to 15C, the vertical axis represents electron diffraction intensity (arbitrary unit) indicating distribution of spots or the like and the horizontal axis represents the distance from a main spot.

In the single crystal structure or the polycrystalline structure in FIG. 15C, peaks are observed at a specific distance from the main spot, which is based on the interplanar spacing (d value) between planes with which crystal parts are aligned.

On the other hand, as shown in FIGS. 13B to 13D, a circumferential region formed by the plurality of spots observed in the nanobeam electron diffraction pattern of the nanocrystalline oxide semiconductor film has a relatively large width. Thus, FIG. 15A shows discrete distribution. Further, in the nanobeam electron diffraction pattern, a region with high luminance formed by spots which are not clear is observed in a region between concentric circles.

As for the selected-area electron diffraction pattern of the nanocrystalline oxide semiconductor film, the electron diffraction intensity distribution is continuous as shown in FIG. 15B. Since FIG. 15B can approximate to the result obtained by widely observing the electron diffraction intensity distribution shown in FIG. 15A, the continuous intensity distribution can be considered to result from the overlapping and connection of the plurality of spots.

FIGS. 15A to 15C indicate that the nanocrystalline oxide semiconductor film includes a plurality of crystal parts with irregular surface orientations and different sizes, and the crystal parts are so minute that spots are not observed in the selected-area electron diffraction patterns.

In FIGS. 13A to 13D where the plurality of spots are observed, the width of the nanocrystalline oxide semiconductor film is reduced to less than or equal to 50 nm Further, since the diameter of an electron beam is reduced to 1 nmϕ or less, the measurement area is greater than or equal to 5 nm and less than or equal to 10 nm. It is thus assumed that the crystal part included in the nanocrystalline oxide semiconductor film has a size of 50 nm or less, for example, 10 nm or less, or 5 nm or less.

Figure 16:
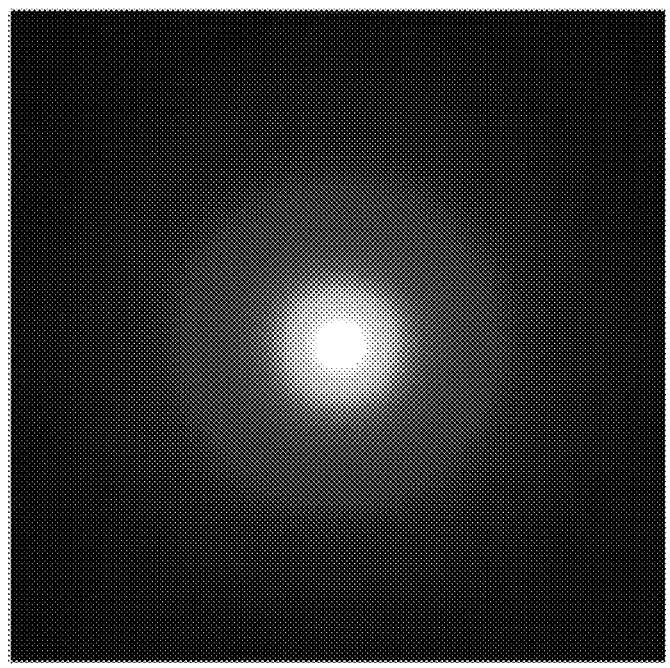
FIG. 16 shows a nanobeam electron diffraction pattern of a quartz glass substrate.

FIG. 16 shows a nanobeam electron diffraction pattern of a quartz glass substrate. The measurement conditions in FIG. 16 were similar to those in FIGS. 13B to 13D.

As shown in FIG. 16, in the quartz glass substrate having an amorphous structure, specific spots are not included and a halo pattern in which luminance is gradually changed from a main spot is observed. This means that a plurality of circumferentially distributed spots like those observed in the nanocrystalline oxide semiconductor film are not observed in a film having an amorphous structure even when electron diffraction is performed on a minute region. This indicates that the plurality of circumferentially distributed spots observed in FIGS. 13B to 13D are unique to the nanocrystalline oxide semiconductor film.

Figure 17:
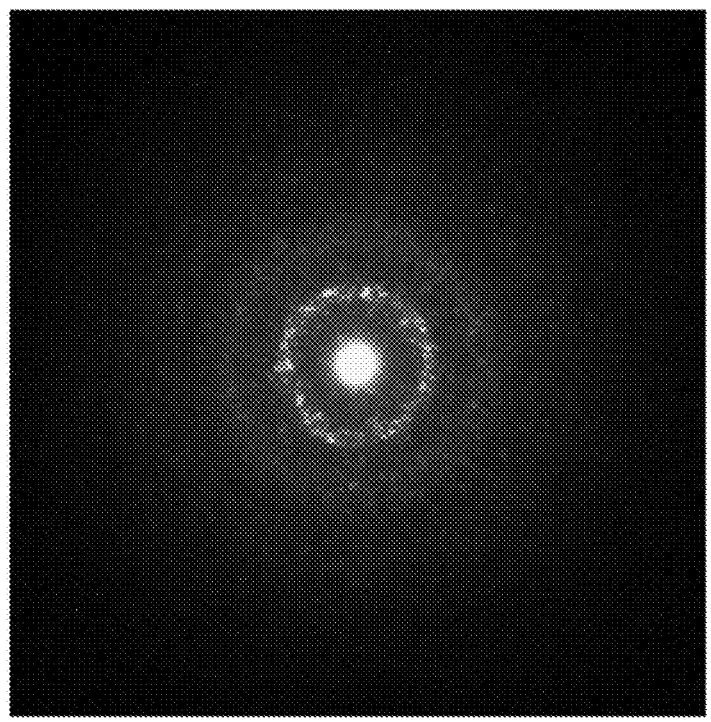
FIG. 17 shows a nanobeam electron diffraction pattern of an oxide semiconductor film.

FIG. 17 shows an electron diffraction pattern that is observed after the point 2 in FIG. 13A is irradiated for one minute with an electron beam whose diameter was reduced to about 1 nmϕ.

As in the electron diffraction pattern shown in FIG. 13C, a plurality of circumferentially distributed spots are observed in the electron diffraction pattern shown in FIG. 17, and there is no significant difference between the measurement results in FIG. 13C and FIG. 17. This means that the crystal part observed in the electron diffraction pattern in FIG. 13C exists at the time of the deposition of the nanocrystalline oxide semiconductor film, and does not result from the irradiation with an electron beam with reduced diameter.

Figure 18A:
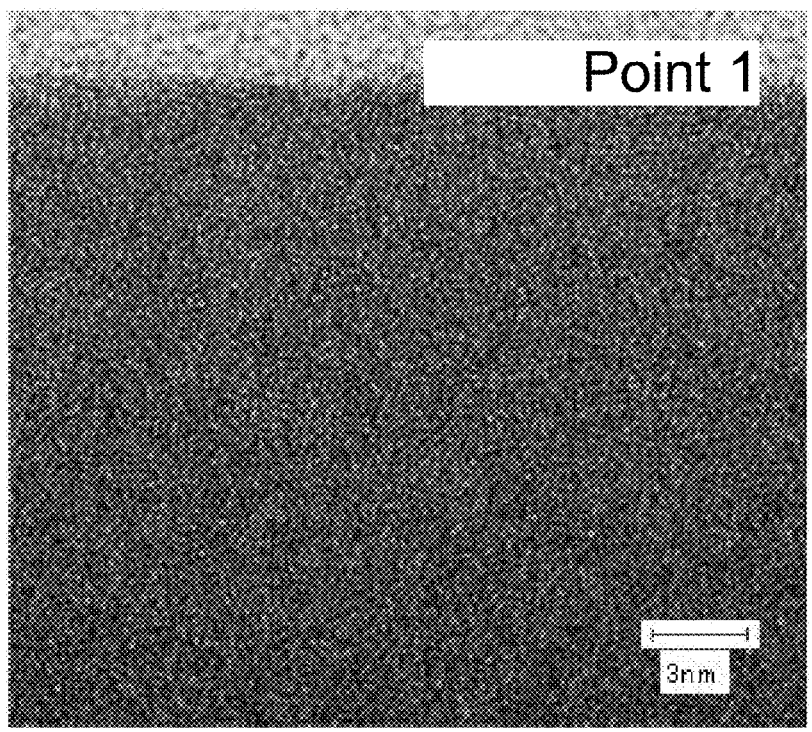
FIGS. 18A and 18B show cross-sectional TEM images of an oxide semiconductor film.
Figure 18B:
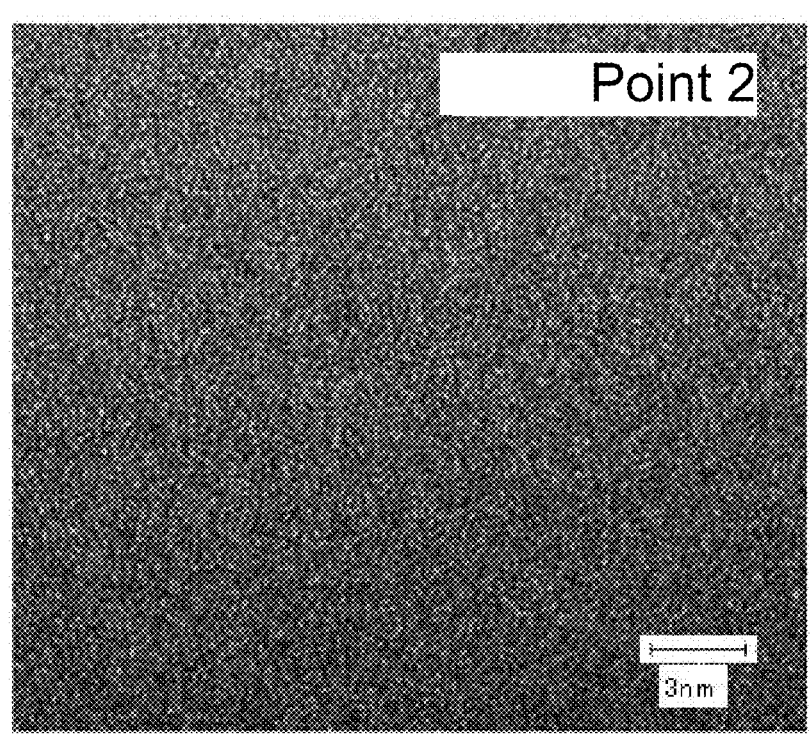

FIGS. 18A and 18B show enlarged views of part of the cross-sectional TEM image of FIG. 13A. FIG. 18A shows a cross-sectional TEM image of the vicinity of the point 1 (a surface of the nanocrystalline oxide semiconductor film) in FIG. 13A, which is observed at a magnification of 8000000 times. FIG. 18B shows a cross-sectional TEM image of the vicinity of the point 2 (the center of the nanocrystalline oxide semiconductor film in the thickness direction) in FIG. 13A, which is observed at a magnification of 8,000,000 times.

In the cross-sectional TEM images of the nanocrystalline oxide semiconductor film in FIGS. 18A and 18B, a crystal structure is not clearly observed.

Figure 19:
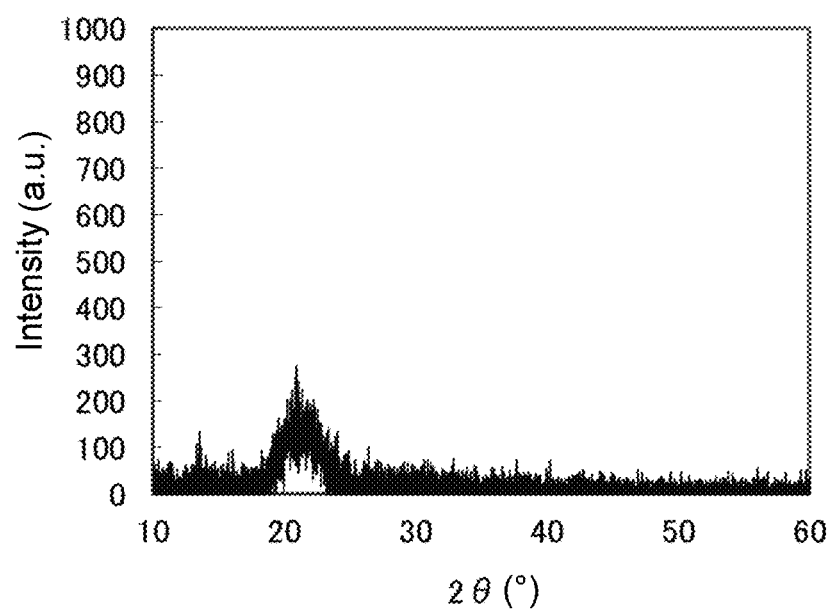
FIG. 19 shows the result of X-ray diffraction analysis of an oxide semiconductor film.

The sample used in FIGS. 13A to 13D and FIGS. 14A and 14B, in which the nanocrystalline oxide semiconductor film of this embodiment is deposited over the quartz glass substrate, was analyzed by X-ray diffraction (XRD). FIG. 19 shows an XRD spectrum measured by an out-of-plane method.

In FIG. 19, the vertical axis represents the X-ray diffraction intensity (arbitrary unit) and the horizontal axis represents the diffraction angle 2θ (degree). Note that the XRD spectra were measured with an X-ray diffractometer, D8 ADVANCE manufactured by Bruker AXS.

As shown in FIG. 19, a peak corresponding to quartz appears at around 2θ=20° to 23°; however, a peak corresponding to the crystal part included in the nanocrystalline oxide semiconductor film cannot be found.

The results of FIGS. 18A and 18B and FIG. 19 indicate that the crystal part in the nanocrystalline oxide semiconductor film is a minute crystal part.

As described above, in the nanocrystalline oxide semiconductor film of this embodiment, a peak showing alignment is not found by X-ray diffraction analysis with a wide measurement range, while a halo pattern is observed in a selected-area electron diffraction pattern with a limited measurement range. This indicates that the nanocrystalline oxide semiconductor film of this embodiment is macroscopically equivalent to a film having disordered atomic arrangement. However, when the nanocrystalline oxide semiconductor film is observed by nanobeam electron diffraction with a sufficiently small beam diameter (e.g., less than or equal to 10 nmφ), spots (bright points) can be found in the obtained nanobeam electron diffraction pattern. It is thus assumed that the nanocrystalline oxide semiconductor film of this embodiment is formed by the aggregation of minute crystal parts (e.g., a particle diameter of 10 nm or less, 5 nm or less, or 3 nm or less) with random surface orientations. A nanocrystal region including minute crystal parts is included in all the area of the nanocrystalline oxide semiconductor film in the thickness direction.

Here, localized states of the nanocrystalline oxide semiconductor film will be described. Description is made on the measurement results of the nanocrystalline oxide semiconductor film with a constant photocurrent method (CPM).

First, a structure of a measurement sample will be described.

The measurement sample includes an oxide semiconductor film over a glass substrate, a pair of electrodes in contact with the oxide semiconductor film, and an insulating film covering the oxide semiconductor film and the pair of electrodes.

Next, description will be made on a method for forming the oxide semiconductor film included in the measurement sample.

A first oxide semiconductor film was formed by a sputtering method under the following conditions: an In—Ga—Zn-oxide target (In: Ga: Zn=1: 1: 1 [atomic ratio]) was used; argon with a flow rate of 30 sccm and oxygen with a flow rate of 15 sccm were used as a deposition gas; the pressure was 0.4 Pa; the substrate temperature was room temperature; and a direct-current power of 0.5 kW was applied. Note that the first oxide semiconductor film is a nanocrystalline oxide semiconductor film.

The first oxide semiconductor film was heated for one hour in a nitrogen atmosphere at 450° C. and then heated for one hour in an oxygen atmosphere at 450° C., whereby hydrogen was removed from the first oxide semiconductor film and oxygen was supplied to the first oxide semiconductor film; thus, a second oxide semiconductor film was obtained. Note that the second oxide semiconductor film is a nanocrystalline oxide semiconductor film.

Next, CPM measurement was performed on a sample including the first oxide semiconductor film and a sample including the second oxide semiconductor film. Specifically, the amount of light entering a surface of the sample between terminals is adjusted so that a photocurrent value is kept constant in the state where voltage is applied between a pair of electrodes provided in contact with the oxide semiconductor film, and then an absorption coefficient is derived from the amount of the irradiation light in an intended wavelength range.

Figure 11A:
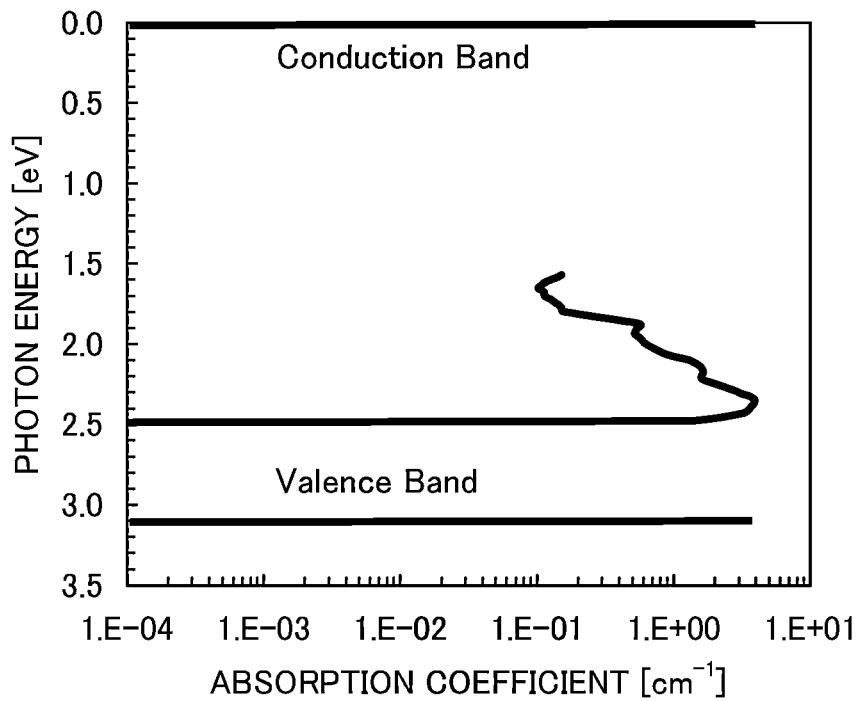
FIGS. 11A and 11B show the results of CPM measurement of an oxide semiconductor film.
Figure 11B:
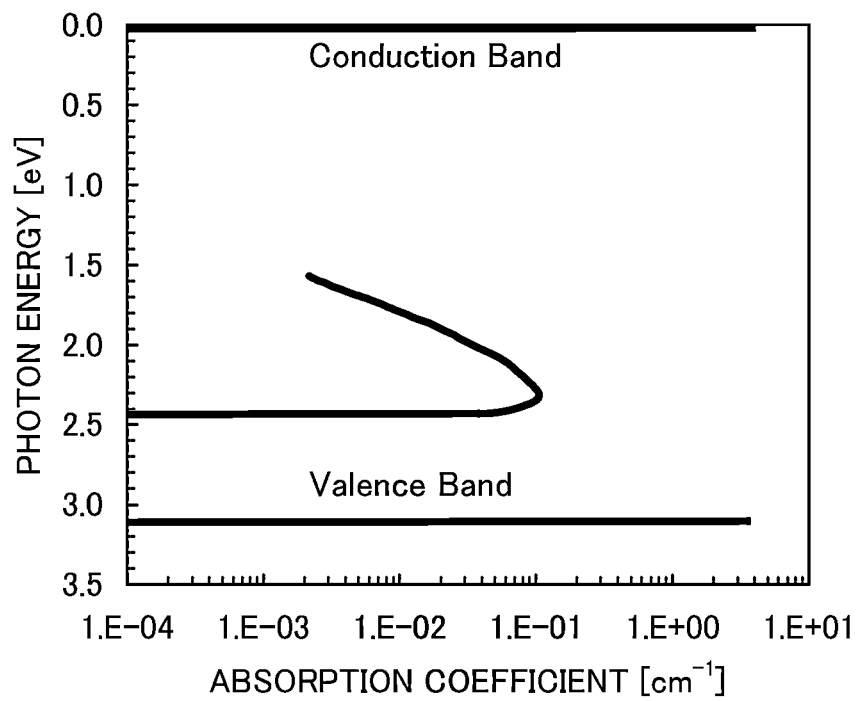

The absorption coefficient shown in each of FIGS. 11A and 11B was obtained by removing an absorption coefficient due to the band tail from an absorption coefficient obtained by CPM measurement of the samples. That is, FIGS. 11A and 11B show the absorption coefficient due to defects. In FIGS. 11A and 11B, the horizontal axis indicates the absorption coefficient, and the vertical axis indicates the photon energy. On the vertical axis in FIGS. 11A and 11B, the bottom of the conduction band of the oxide semiconductor film is set to 0 eV, and the top of the valence band is set to 3.15 eV. Each curve in FIGS. 11A and 11B represents the relation between the absorption coefficient and photon energy, which corresponds to defect states.

FIG. 11A shows a measurement result of the sample including the first oxide semiconductor film, and the absorption coefficient indicating defect states was $5.28 \times 10^{-1}$ cm$^{-1}$. FIG. 11B shows a measurement result of the sample including the second oxide semiconductor film, and the absorption coefficient indicating defect states was $1.75 \times 10^{-2}$ cm$^{-1}$.

The above shows that defects in the oxide semiconductor film can be reduced by heat treatment.

The film densities of the first oxide semiconductor film and the second oxide semiconductor film were measured by X-ray reflectometry (XRR). The first oxide semiconductor film has a film density of 5.9 g/cm$^3$ and the second oxide semiconductor film has a film density of 6.1 g/cm$^3$.

This indicates that the film density of the oxide semiconductor film can be increased by heat treatment.

In other words, the oxide semiconductor film with higher film density includes fewer defects.

This embodiment can be combined with any of the other embodiments shown in this specification.

Embodiment 4

Described in this embodiment are electron diffraction patterns and localized states of a CAAC-OS film which can be used for one embodiment of the present invention.

The CAAC-OS film used in this embodiment is an In—Ga—Zn-based oxide film which is formed by a sputtering method using a deposition gas containing oxygen and a target of an In—Ga—Zn oxide (having an atomic ratio of In: Ga: Zn=1:1:1). Embodiments 1 and 2 can be referred to for the details of a manufacturing method and the like of the CAAC-OS film.

Figure 20:
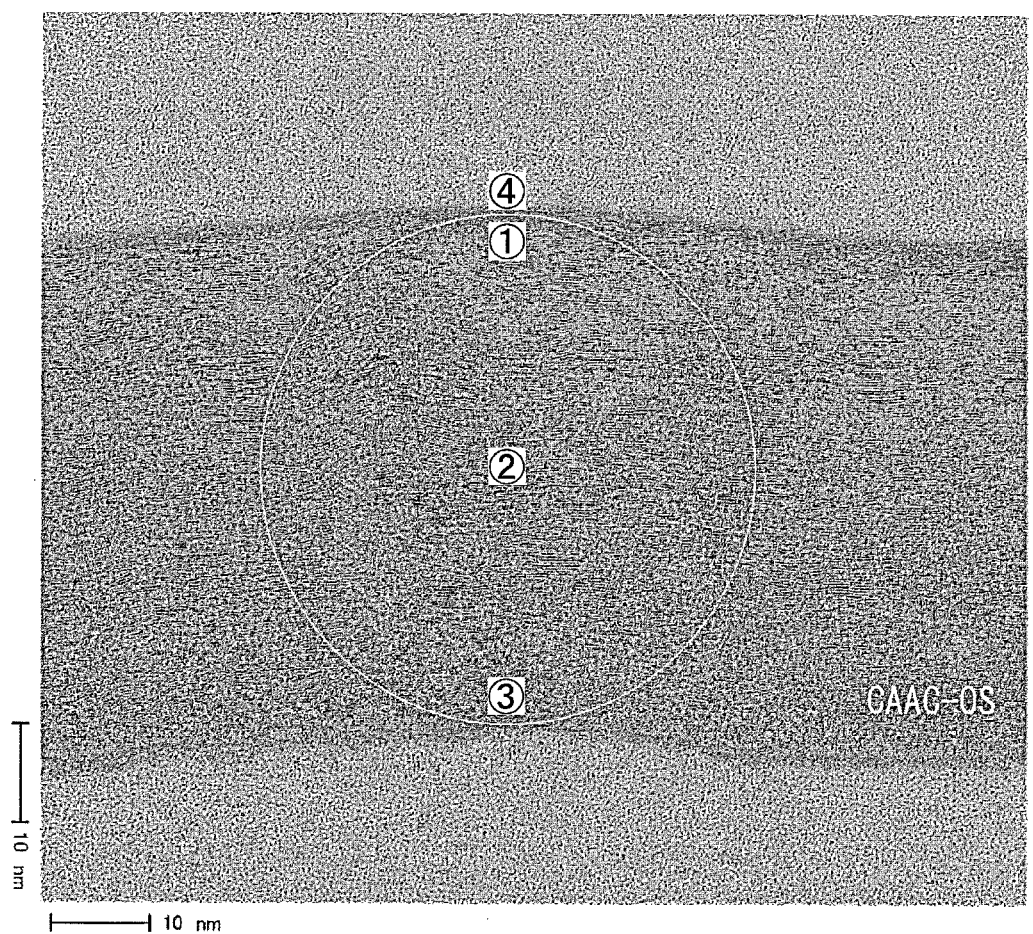
FIG. 20 shows a cross-sectional TEM image of a CAAC-OS film.

FIG. 20 shows a cross-sectional transmission electron microscopy (TEM) image of the CAAC-OS film. FIGS. 21A to 21D show electron diffraction patterns which were obtained by measurement of points 1 to 4 in FIG. 20 using electron diffraction.

The cross-sectional TEM image shown in FIG. 20 was taken with a transmission electron microscope ("H-9000NAR" manufactured by Hitachi High-Technologies Corporation) at an acceleration voltage of 300 kV and at a magnification of 2,000,000 times. The electron diffraction patterns shown in FIGS. 21A to 21D were obtained with a transmission electron microscope ("HF-2000" manufactured by Hitachi High-Technologies Corporation) at an acceleration voltage of 200 kV and beam diameters of about 1 nmϕ or about 50 nmϕ. Note that electron diffraction with a beam diameter of 10 nmϕ or less is particularly referred to as nanobeam electron diffraction in some cases. Further, a measurement area of the electron diffraction with a beam diameter of about 1 nmϕ is greater than or equal to 5 nmϕ and less than or equal to 10 nmϕ.

Figure 21A:
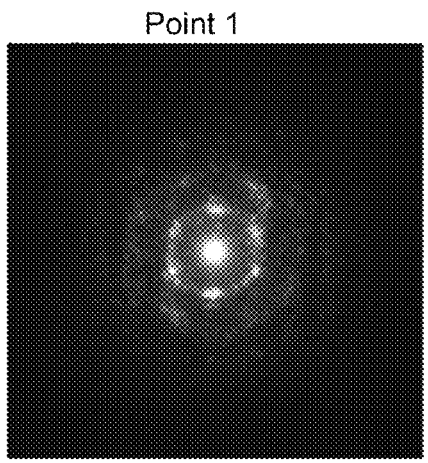
FIGS. 21A to 21D show electron diffraction patterns of a CAAC-OS film.
Figure 21B:
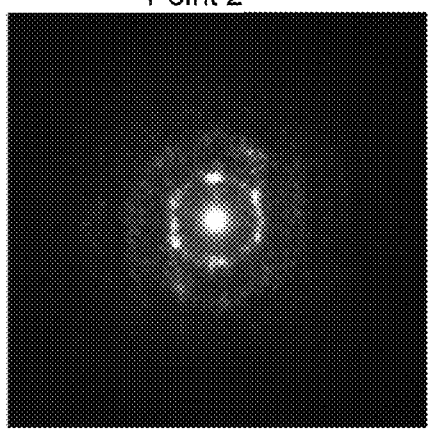
Figure 21C:
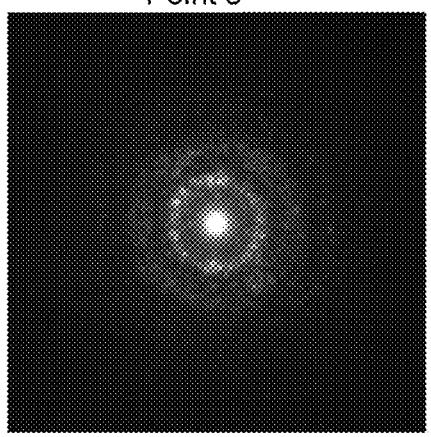
Figure 21D:
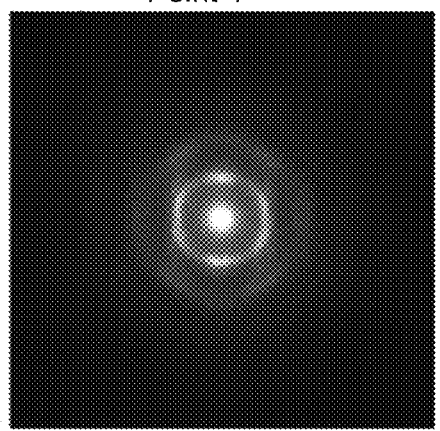

Electron diffraction patterns on point 1 (the surface side of the film), point 2 (the center of the film), and point 3 (the base side of the film) shown in FIG. 20 correspond to FIGS. 21A, 21B, and 21C, respectively and are obtained with an electron-beam diameter of about 1 nmϕ. An electron diffraction pattern on point 4 (the whole film) shown in FIG. 20 corresponds to FIG. 21D and is obtained with an electron-beam diameter of about 50 nmϕ.

A pattern formed by spots (bright points) is observed in each of the electron diffraction patterns of point 1 (on the surface side of the film) and point 2 (the center of the film), and a slightly broken pattern is observed in point 3 (on the base side of the film). This indicates that the crystal state varies in the thickness direction in the CAAC-OS film. Note that a pattern formed by spots (bright points) is observed in point 4 (the whole film), which indicates that the whole film is a CAAC-OS film or a film including a CAAC-OS film.

Figure 22:
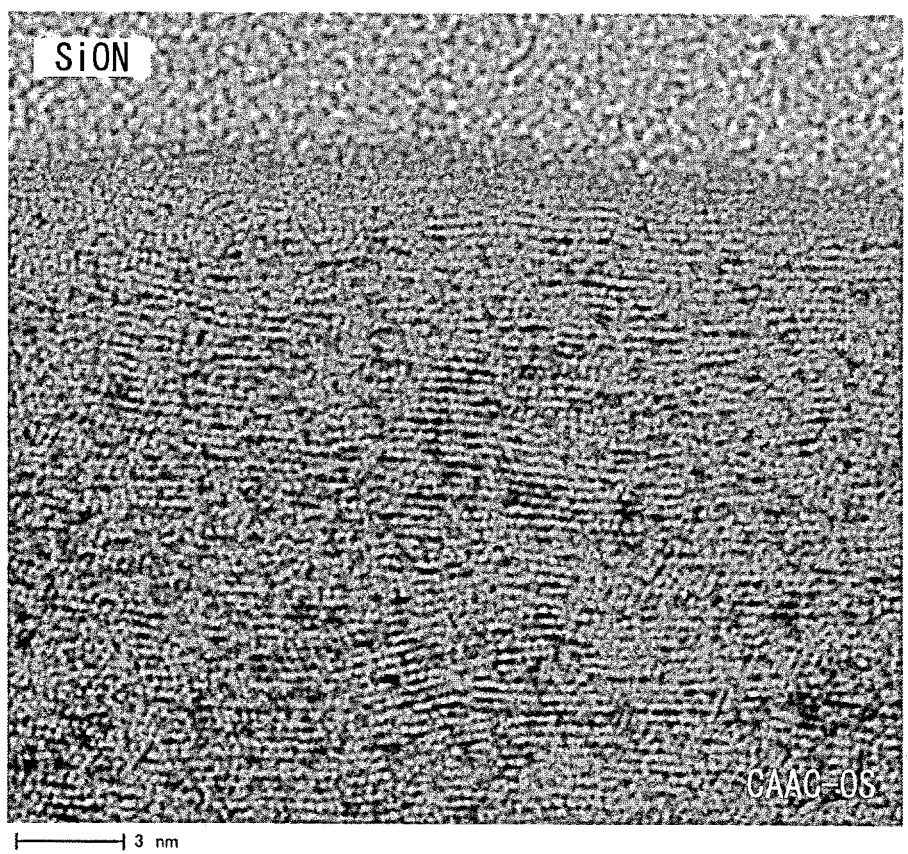
FIG. 22 shows a cross-sectional TEM image of a CAAC-OS film.

FIG. 22 shows an enlarged view of a portion in the vicinity of point 1 (on the surface side of the film) in FIG. 20. In FIG. 22, a clear lattice image which shows alignment of the CAAC-OS film extends to the interface with an SiON film that is an interlayer insulating film.

Figure 23A:
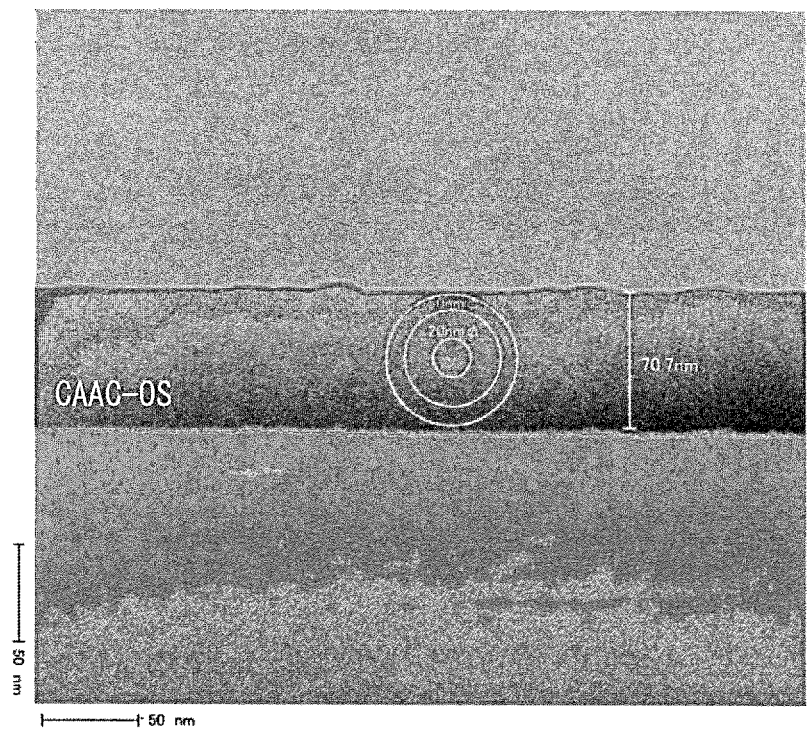
FIG. 23A shows a cross-sectional TEM image of a CAAC-OS film and FIG. 23B shows an X-ray diffraction spectrum thereof.
Figure 23B:
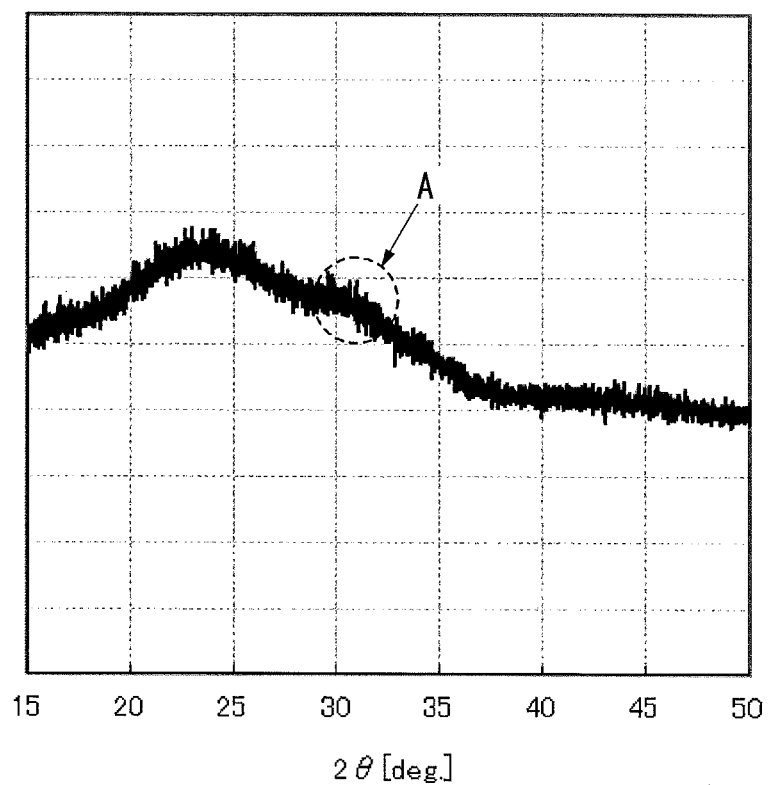
Figure 24A:
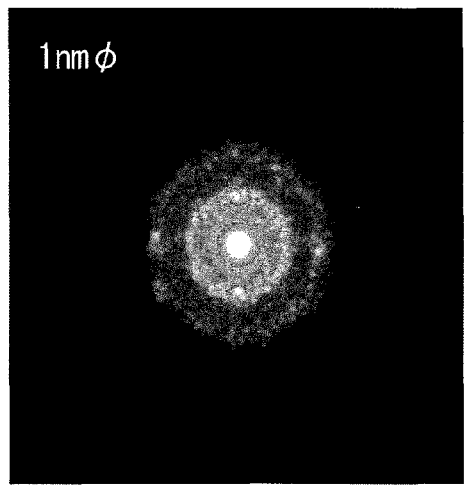
FIGS. 24A to 24D show electron diffraction patterns of a CAAC-OS film.
Figure 24B:
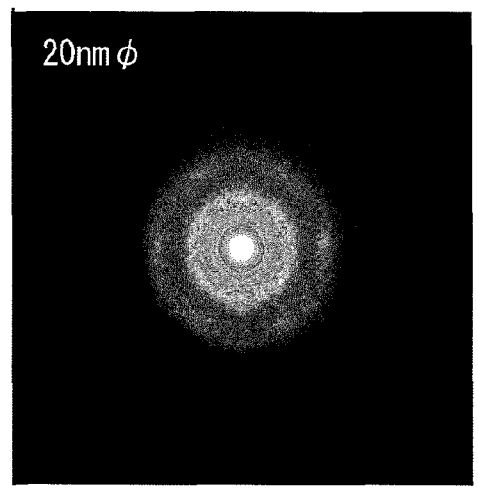
Figure 24C:
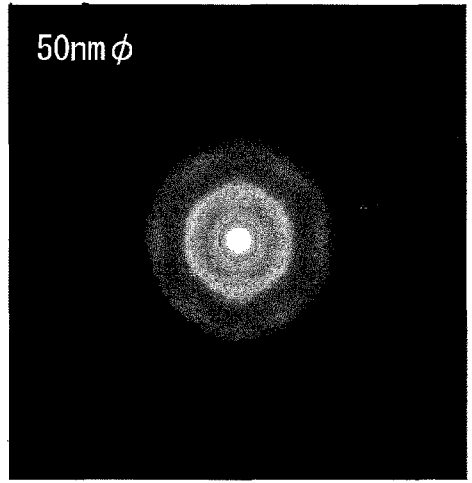
Figure 24D:
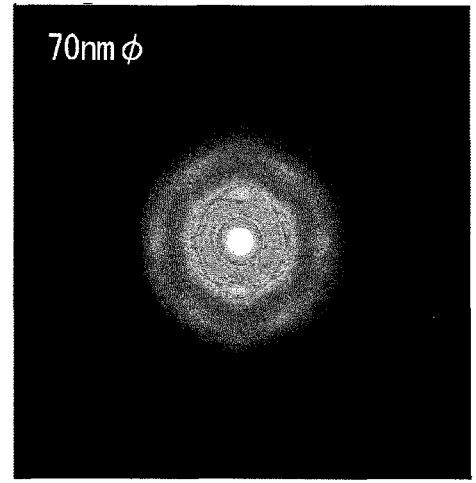

FIGS. 23A and 23B show a cross-sectional TEM photograph and an X-ray diffraction spectrum of a CAAC-OS film different from the CAAC-OS film used for the cross-sectional TEM image of FIG. 20. A CAAC-OS film may have a variety of forms, and Peak A which indicates a crystal component appears around 2θ=31° as shown in FIG. 23B, but the peak does not appear clearly in some cases.

FIGS. 24A to 24D show results of electron diffraction in regions in the CAAC-OS film with electron-beam diameters of 1 nmϕ, 20 nmϕ, 50 nmϕ, and 70 nmϕ. The regions are indicated by concentric circles in FIG. 23A. In the case of an electron-beam diameter of 1 nmϕ, a pattern formed by clear spots (bright points) can be observed as in FIGS. 21A and 21B. As the electron-beam diameter is increased, the spots (bright points) become unclear but a diffraction pattern can be observed; therefore, the whole film is a CAAC-OS film or a film including a CAAC-OS film.

Figure 25A:
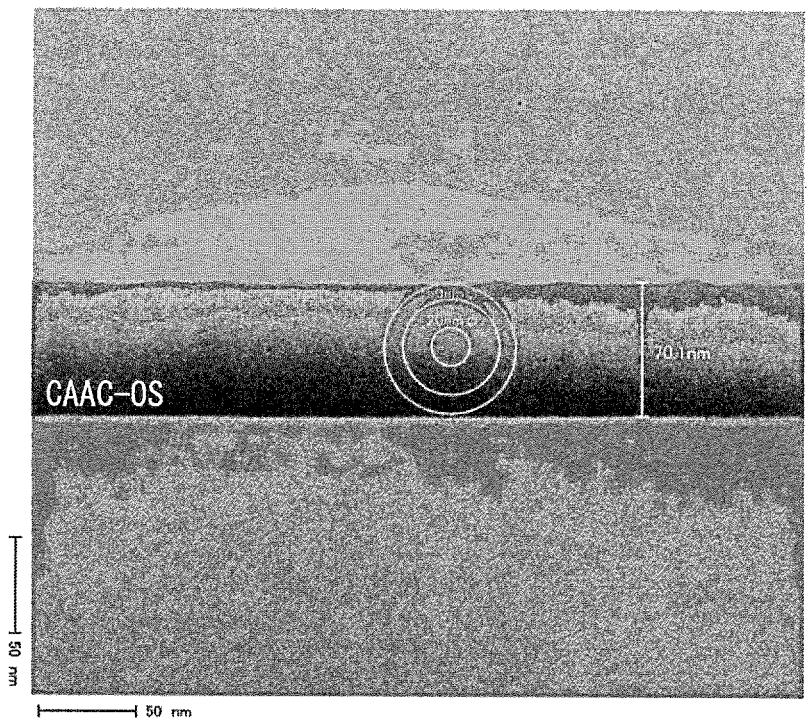
FIG. 25A shows a cross-sectional TEM image of a CAAC-OS film and FIG. 25B shows an X-ray diffraction spectrum thereof.
Figure 25B:
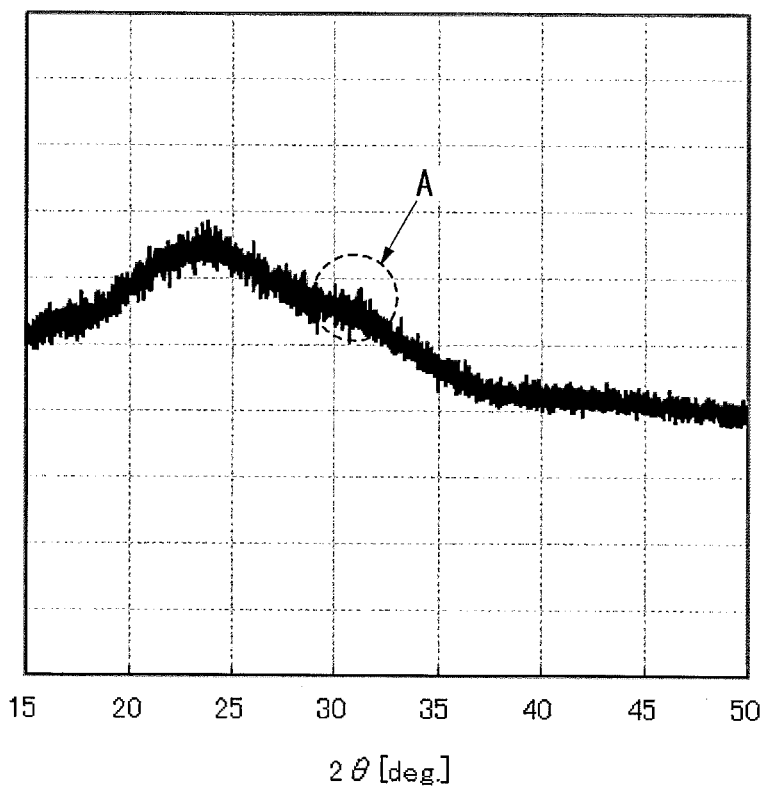
Figure 26A:
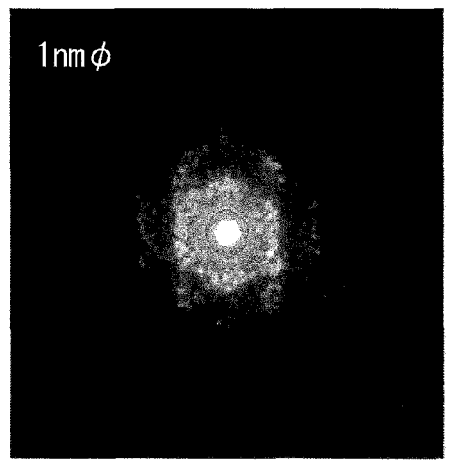
FIGS. 26A to 26D show electron diffraction patterns of a CAAC-OS film.
Figure 26B:
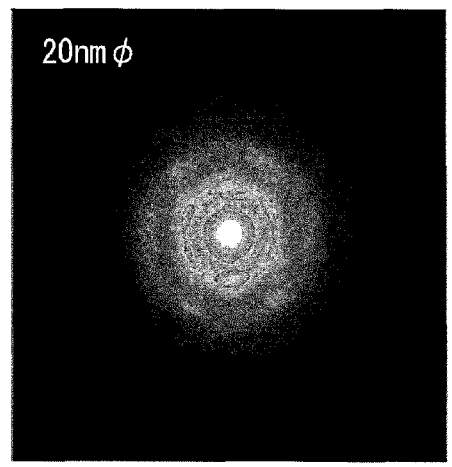
Figure 26C:
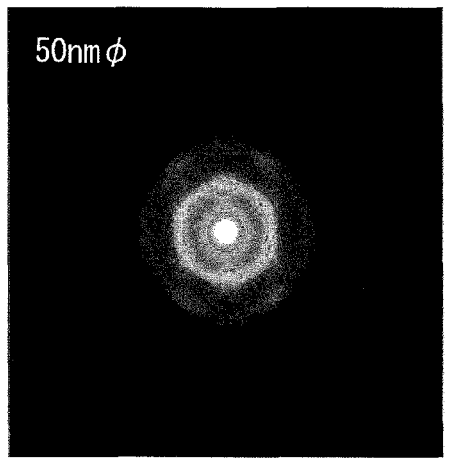
Figure 26D:
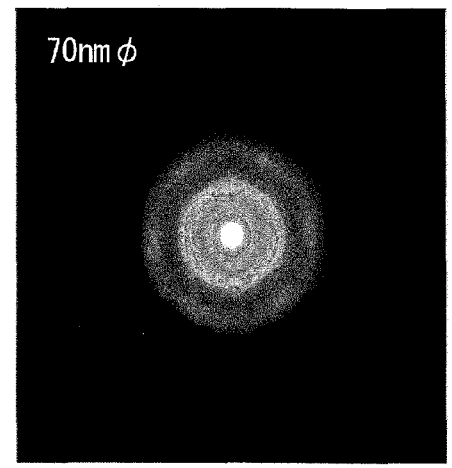

FIGS. 25A and 25B show a cross-sectional TEM image and an X-ray diffraction spectrum of the CAAC-OS film used for the cross-sectional TEM observation in FIG. 23A, which are obtained after annealing at 450° C.

FIGS. 26A to 26D show results of electron diffraction in regions in the CAAC-OS film with electron-beam diameters of 1 nmϕ, 20 nmϕ, 50 nmϕ, and 70 nmϕ. The regions are indicated by concentric circles in FIG. 25A. In the case of an electron-beam diameter of 1 nmϕ, a pattern formed by clear spots (bright points) can be observed as in the results shown in FIGS. 24A to 24D. As the electron-beam diameter is increased, the spots (bright points) become unclear but a diffraction pattern can be observed; therefore, the whole film is a CAAC-OS film or a film including a CAAC-OS film.

Figure 27A:
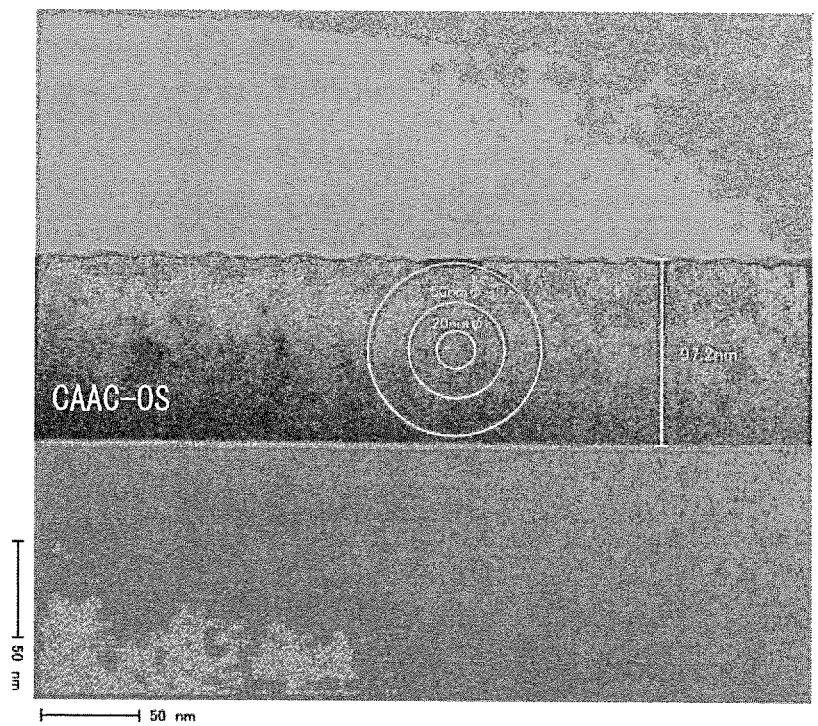
FIG. 27A shows a cross-sectional TEM image of a CAAC-OS film and FIG. 27B shows an X-ray diffraction spectrum thereof.
Figure 27B:
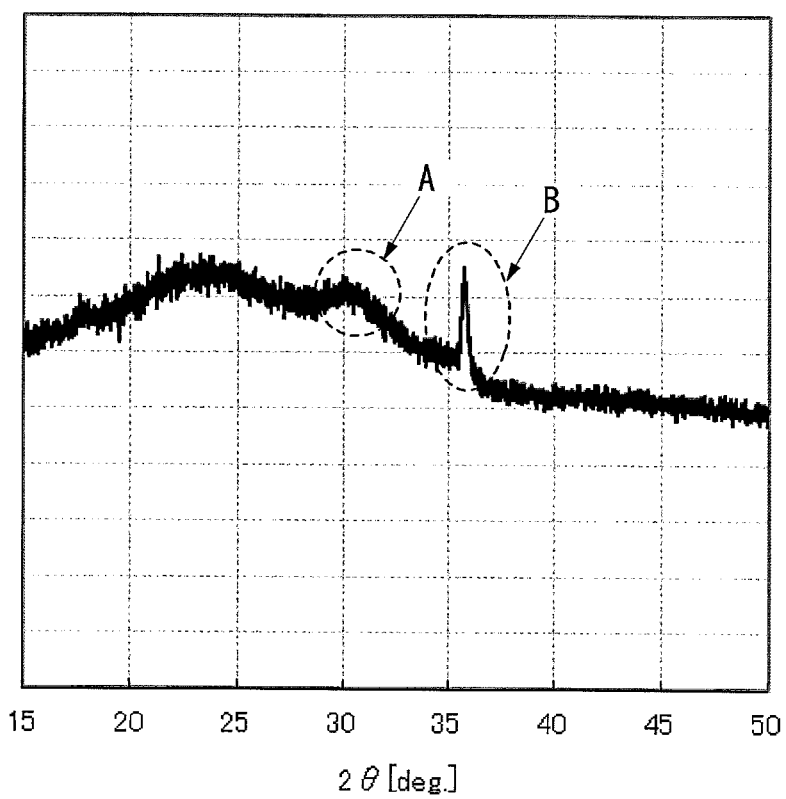
Figure 28A:
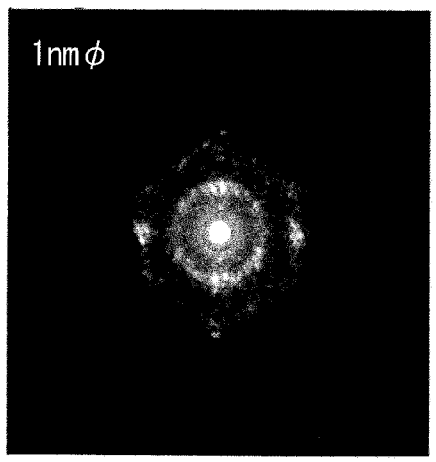
FIGS. 28A to 28D show electron diffraction patterns of a CAAC-OS film.
Figure 28B:
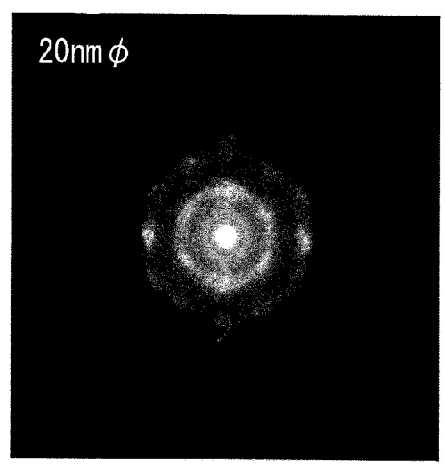
Figure 28C:
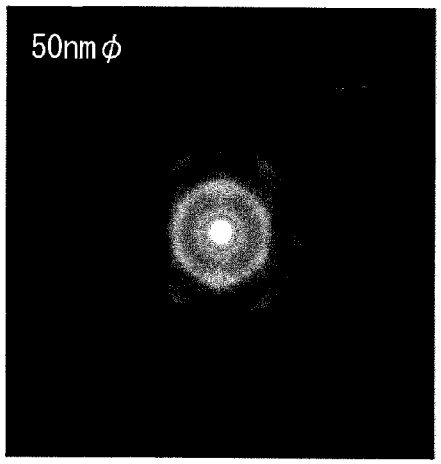
Figure 28D:
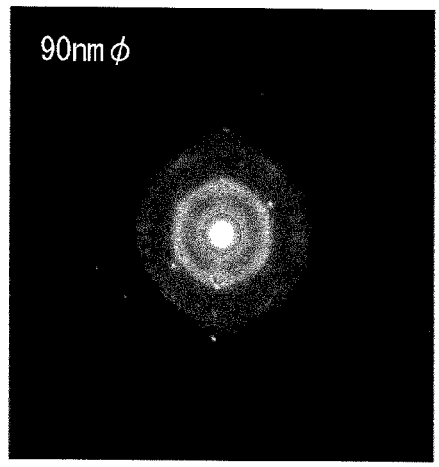

FIGS. 27A and 27B show a cross-sectional TEM image and an X-ray diffraction spectrum of a CAAC-OS film different from the CAAC-OS film used for the cross-sectional TEM image of FIG. 20 and the cross-sectional TEM observation of FIG. 23A. The CAAC-OS film has a variety of forms, and as shown in FIG. 27B, as well as Peak A indicating a crystal component around 2θ=31°, Peak B which is derived from a spinel crystal structure appears in some cases.

FIGS. 28A to 28D show results of electron diffraction in regions in the CAAC-OS film with electron-beam diameters of 1 nmϕ, 20 nmϕ, 50 nmϕ, and 90 nmϕ. The regions are indicated by concentric circles in FIG. 27A. In the case of an electron-beam diameter of 1 nmϕ, a pattern formed by clear spots (bright points) can be observed. As the electron-beam diameter is increased, the spots (bright points) become unclear but a diffraction pattern can be observed. Further, in the case of a beam diameter of 90 nmϕ, clearer spots (bright points) can be observed. Accordingly, the whole film is a CAAC-OS film or a film including a CAAC-OS film.

Here, localized states of the CAAC-OS film will be described. Description is made on the measurement results of the CAAC-OS film with a constant photocurrent method (CPM).

First, a structure of a sample subjected to CPM measurement will be described.

The measurement sample includes an oxide semiconductor film over a glass substrate, a pair of electrodes in contact with the oxide semiconductor film, and an insulating film covering the oxide semiconductor film and the pair of electrodes.

Next, description will be made on a method for forming the oxide semiconductor film included in the measurement sample.

An oxide semiconductor film was formed by a sputtering method under the following conditions: an In—Ga—Zn-oxide target (In: Ga: Zn=1: 1: 1 [atomic ratio]) was used; argon with a flow rate of 30 sccm and oxygen with a flow rate of 15 sccm were used as a deposition gas; the pressure was 0.4 Pa; the substrate temperature was 400° C.; and a direct-current power of 0.5 kW was applied. Then, the oxide semiconductor film was heated for one hour in a nitrogen atmosphere at 450° C. and then heated for one hour in an oxygen atmosphere at 450° C., whereby hydrogen was removed from the oxide semiconductor film and oxygen was supplied to the oxide semiconductor film. Note that this oxide semiconductor film is a CAAC-OS film.

Next, CPM measurement was performed on the sample including the oxide semiconductor film. Specifically, the amount of light entering a surface of the sample between terminals is adjusted so that a photocurrent value is kept constant in the state where voltage is applied between a pair of electrodes provided in contact with the oxide semiconductor film, and then an absorption coefficient is derived from the amount of the irradiation light in an intended wavelength range.

Figure 12:
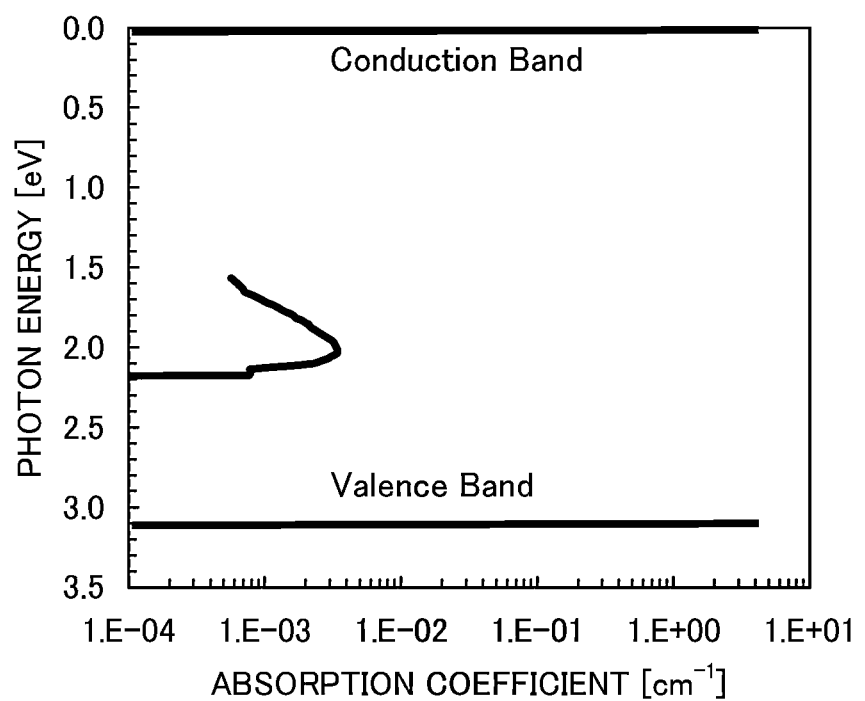
FIG. 12 shows the result of CPM measurement of a CAAC-OS film.

FIG. 12 shows the absorption coefficient that was obtained by removing an absorption coefficient due to the band tail from an absorption coefficient obtained by CPM measurement of the sample. That is, FIG. 12 shows the absorption coefficient due to defects. In FIG. 12, the horizontal axis indicates the absorption coefficient, and the vertical axis indicates the photon energy. On the vertical axis in FIG. 12, the bottom of the conduction band of the oxide semiconductor film is set to 0 eV, and the top of the valence band is set to 3.15 eV. The curve in FIG. 12 represents the relation between the absorption coefficient and photon energy, which corresponds to defect states.

In FIG. 12, the absorption coefficient indicating defect states was $5.86 \times 10^{-4}$ cm$^{-1}$. That is to say, the CAAC-OS film has an absorption coefficient due to defect states of less than $1 \times 10^{-3}$ /cm, preferably less than $1 \times 10^{-4}$ /cm, namely, has a low density of defect states.

The film density of the oxide semiconductor film was measured by X-ray reflectometry (XRR). The oxide semiconductor film has a film density of 6.3 g/cm$^3$. That is, the CAAC-OS film has a high film density.

This embodiment can be combined with any of the other embodiments shown in this specification.

Embodiment 5

A semiconductor device (display device) having a display function can be fabricated using a transistor and a capacitor examples of which are described in the above embodiments. Moreover, some or all of the driver circuits which include the transistor can be formed over a substrate where the pixel portion is formed, whereby a system-on-panel can be obtained. In this embodiment, an example of a display device using the transistor examples of which are shown in the above embodiments will be described with reference to FIGS. 29A to 29C, FIG. 30, and FIGS. 31A to 31C. FIG. 30 is a cross-sectional view taken along dashed-dotted line M-N in FIG. 29B. Note that FIG. 30 illustrates only part of the structure of the pixel portion.

Figure 29A:
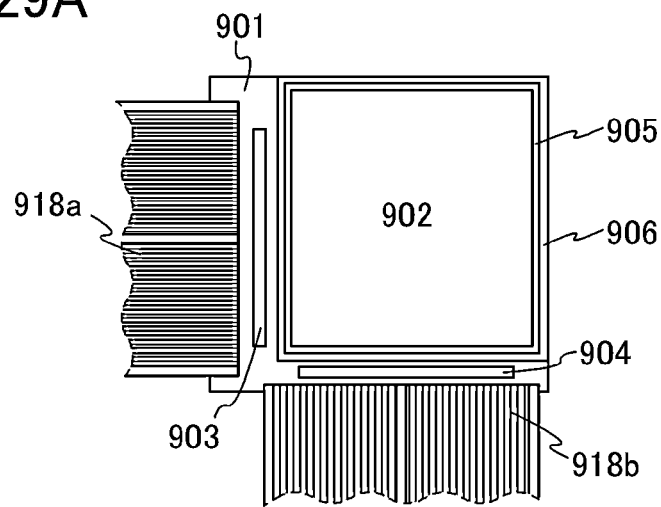
FIGS. 29A to 29C show top views each illustrating a semiconductor device.
Figure 30:
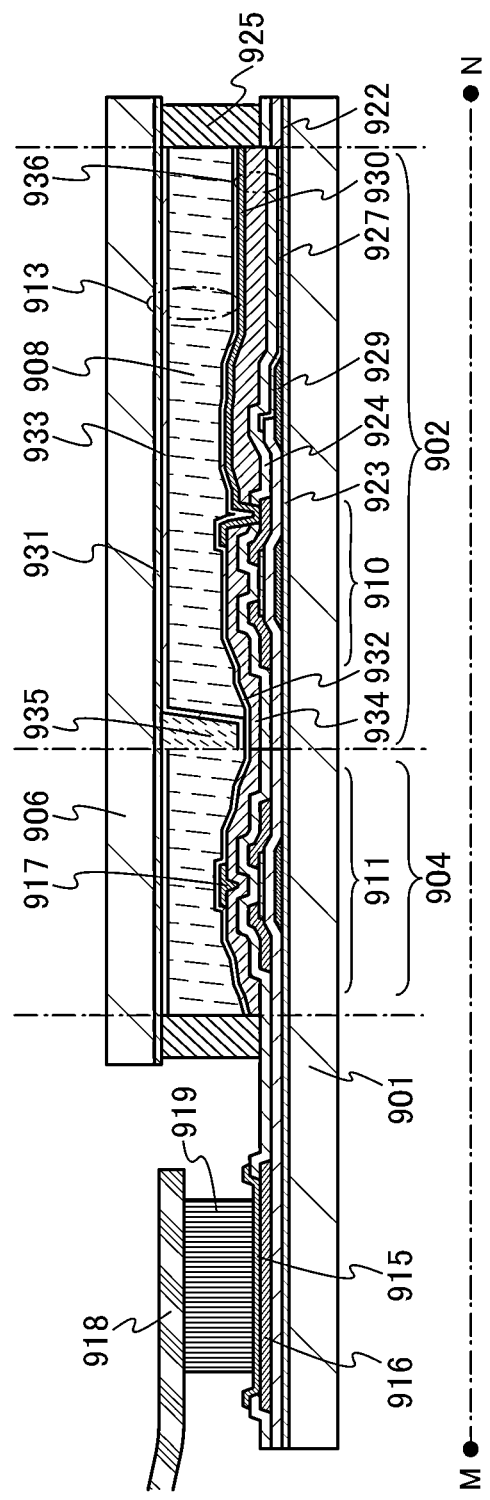
FIG. 30 shows a cross-sectional view illustrating a semiconductor device.

In FIG. 29A, a sealant 905 is provided so as to surround a pixel portion 902 over a first substrate 901, and the pixel portion 902 is sealed with a second substrate 906. In FIG. 29A, a second driver circuit 903 and a first driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the second driver circuit 903, the first driver circuit 904, and the pixel portion 902 from flexible printed circuits (FPCs) 918*a* and 918*b*.

The first driver circuit 904 functions as a scan line drive circuit, and the second driver circuit 903 functions as a signal line driver circuit.

Figure 29B:
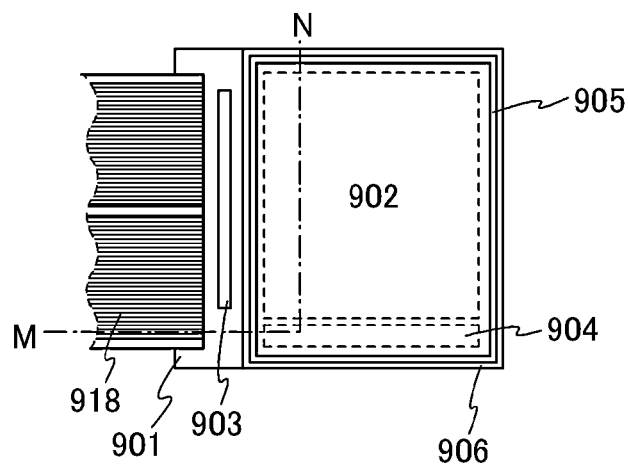
Figure 29C:
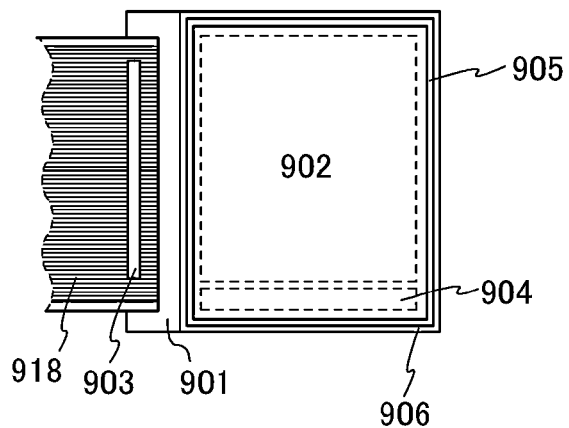

In FIGS. 29B and 29C, the sealant 905 is provided so as to surround the pixel portion 902 and the first driver circuit 904 which are provided over the first substrate 901. The second substrate 906 is provided over the pixel portion 902 and the first driver circuit 904. Thus, the pixel portion 902 and the first driver circuit 904 are sealed together with a display element by the first substrate 901, the sealant 905, and the second substrate 906. In FIGS. 29B and 29C, the second driver circuit 903 which is formed using a single crystal semiconductor or a polycrystalline semiconductor is provided over a substrate separately prepared and is mounted in a region different from the region surrounded by the sealant 905 over the first substrate 901. In FIGS. 29B and 29C, various signals and potentials are supplied to the second driver circuit 903, the first driver circuit 904, and the pixel portion 902 from the FPC 918.

Although FIGS. 29B and 29C each illustrate an example in which the second driver circuit 903 is formed separately and mounted on the first substrate 901, one embodiment of the present invention is not limited to this structure. The first driver circuit may be separately formed and then mounted, or only part of the second driver circuit or part of the first driver circuit may be separately formed and then mounted.

A connection method of a separately formed driver circuit is not particularly limited; for example, a chip on glass (COG) method, a wire bonding method, or a method of mounting a tape carrier package (TCP) or the like can be used. FIG. 29A shows an example in which the second driver circuit 903 and the first driver circuit 904 are mounted by a COG method; FIG. 29B shows an example in which the second driver circuit 903 is mounted by a COG method; and FIG. 29C shows an example in which the second driver circuit 903 is mounted as a TCP.

The display device includes, in its category, a panel in which a display element is sealed, and a module in which an IC or the like including a controller is mounted on the panel.

Note that the display device in this specification refers to an image display device or a display device. The display device may serve as a light source (including a lighting device). Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the first driver circuit provided over the first substrate include a plurality of transistors and any of the transistors which are described in the above embodiments can be used.

Examples of the display element provided in the display device include a liquid crystal element and a light-emitting element. An example of the liquid crystal element is an element that controls transmission or non-transmission of light by optical modulation action of liquid crystals. The element can be formed by a pair of electrodes and a liquid crystal layer. The optical modulation action of a liquid crystal is controlled by an electric field applied to the liquid crystal (including a horizontal electric field, a vertical electric field, and an oblique electric field). Note that specific examples of the liquid crystal element include the following: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, and a banana-shaped liquid crystal. Examples of the method for driving a liquid crystal include a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned micro-cell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue-phase mode. Note that one embodiment of the present invention is not limited thereto, and various liquid crystal elements and driving methods can be used. A light-emitting element includes, in its category, an element whose luminance is controlled by current or voltage, and specifically includes an inorganic electroluminescent (EL) element and an organic EL element. Further, a display medium whose contrast is changed by an electric effect, such as electronic ink, can be used. FIG. 30 illustrates an example of a liquid crystal display device using a liquid crystal element as a display element.

FIG. 30 shows a cross-sectional view of a vertical electric field mode liquid crystal display device. The liquid crystal display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930. The terminal electrode 916 is formed using the same conductive film as source and drain electrodes of transistors 910 and 911.

The pixel portion 902 and the first driver circuit 904 which are provided over the first substrate 901 each include a plurality of transistors, and the transistor 910 included in the pixel portion 902 and the transistor 911 included in the first driver circuit 904 are illustrated as an examples. An insulating film 924 corresponding to the insulating films 129, 131, and 132 shown in Embodiment 1 is provided over the transistors 910 and 911. Further, an insulating film 934 is provided over the insulating film 924 in order to improve planarity. An insulating film 923 is a nitride insulating film.

In this embodiment, the transistor provided in the pixel 101 shown in Embodiment 1 can be used as the transistor 910. Further, the transistor provided in the first driver circuit 104 shown in Embodiment 1 can be used as the transistor 911. Although the transistor 911 includes a conductive film 917, the conductive film 917 is not necessarily provided.

A capacitor 936 is formed using an oxide semiconductor film 927, the insulating films 924 and 934, and the first electrode 930. The oxide semiconductor film 927 is electrically connected to a capacitor line 929. The capacitor line 929 is formed using the same conductive film as gate electrodes of the transistors 910 and 911. Although the capacitor described in Embodiment 1 is illustrated as the capacitor 936, any of the capacitors in the other embodiments may be used as appropriate.

The transistor 910 provided in the pixel portion 902 is electrically connected to the display element to form a display panel. There is no particular limitation on the kind of the display element as long as display can be performed, and various kinds of display elements can be employed.

A liquid crystal element 913 is a display element including the first electrode 930, a second electrode 931, and a liquid crystal layer 908. An insulating film 932 and an insulating film 933 which serve as alignment films are provided so that the liquid crystal layer 908 is interposed therebetween. The second electrode 931 is provided on the second substrate 906 side. The second electrode 931 overlaps with the first electrode 930 with the liquid crystal layer 908 provided therebetween.

The first electrode 930 and the second electrode 931 (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using materials similar to those of the pixel electrode 121 shown in Embodiment 1 as appropriate.

A spacer 935 is a columnar spacer obtained by selective etching of an insulating film and is provided in order to control the distance between the first electrode 930 and the second electrode 931 (a cell gap). Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. Note that the alignment film is formed using an organic resin containing hydrogen, water, or the like, which might degrade the electrical characteristics of the transistor in the semiconductor device of one embodiment of the present invention. Thus, the use of liquid crystal which exhibits a blue phase for the liquid crystal layer allows the semiconductor device of one embodiment of the present invention to be fabricated without an organic resin, so that a highly reliable semiconductor device can be obtained.

The first substrate 901 and the second substrate 906 are fixed in place by a sealant 925. As the sealant 925, an organic resin such as a thermosetting resin or a photocurable resin can be used. The sealant 925 is in contact with the insulating film 924. Note that the sealant 925 corresponds to the sealant 905 illustrated in FIGS. 29A to 29C.

The sealant 925 is provided over the insulating film 924. The insulating film 934 is provided on the inner side of the sealant 925. The uppermost layer of the insulating film 924 is a nitride insulating film, and can suppress the entry of impurities such as hydrogen and water from the outside. In contrast, the insulating film 934 has a high moisture permeability. Thus, when the insulating film 934 is provided on the inner side of the sealant 925 and the sealant 925 is provided over the insulating film 924, it is possible to suppress the entry of impurities such as hydrogen and water from the outside, and thus to reduce variation in the electrical characteristics of the transistors 910 and 911.

In the liquid crystal display device, a black matrix (a light-blocking film); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

Since the transistor is easily broken owing to static electricity or the like, a protective circuit for protecting the driver circuit is preferably provided. The protection circuit is preferably formed using a nonlinear element.

Figure 31A:
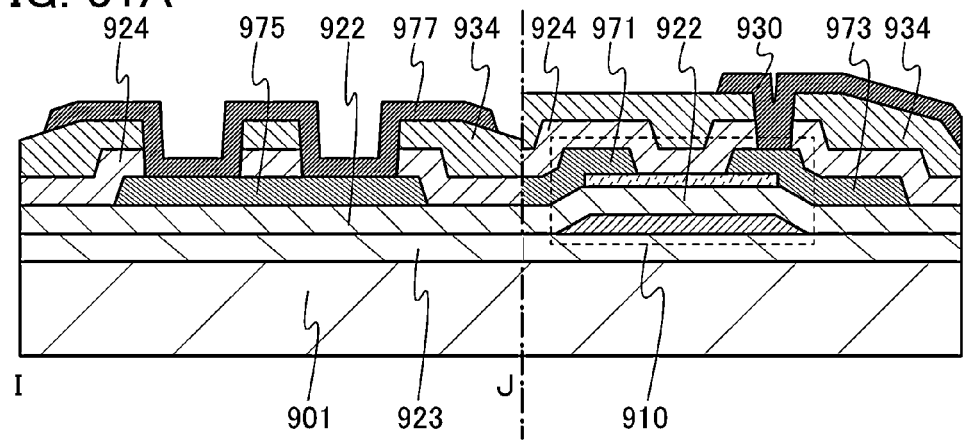
FIGS. 31A and 31C show cross-sectional views and FIG. 31B shows a top view illustrating a semiconductor device.
Figure 31B:
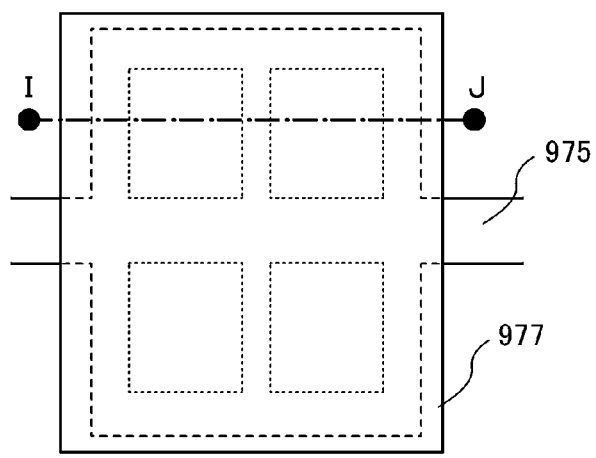
Figure 31C:
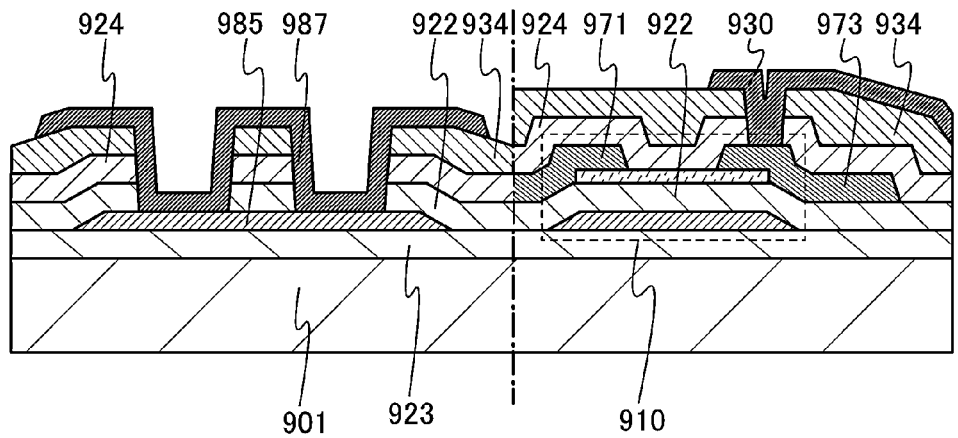

FIGS. 31A to 31C illustrate an example of the liquid crystal display device in FIG. 30 in which a common connection portion (pad portion) for being electrically connected to the second electrode 931 provided on the substrate 906 is formed over the substrate 901.

The common connection portion is provided in a position overlapping with the sealant for bonding the substrate 901 and the substrate 906, and is electrically connected to the second electrode 931 through conductive particles contained in the sealant. Alternatively, the common connection portion is provided in a position not overlapping with the sealant (except for the pixel portion) and a paste including conductive particles is provided separately from the sealant so as to overlap with the common connection portion, whereby the common connection portion is electrically connected to the second electrode 931.

The right side of FIG. 31A shows a cross-sectional view of the transistor 910 in the pixel portion, and the left side of FIG. 31A is a cross-sectional view of the common connection portion which can be formed through the same steps as the transistor 910. The common connection portion in FIG. 31A corresponds to the cross section along I-J in the top view of the common connection portion illustrated in FIG. 31B.

A common potential line 975 is provided over a gate insulating film 922 and formed using the same material and through the same steps as a source electrode 971 and a drain electrode 973 of the transistor 910.

Further, the common potential line 975 is covered with the insulating films 924 and 934, and a plurality of openings are formed in the insulating films 924 and 934 so as to overlap with the common potential line 975. These openings are formed through the same steps as a contact hole which connects the first electrode 930 and one of the source electrode 971 and the drain electrode 973 of the transistor 910.

Further, the common potential line 975 is connected to a common electrode 977 through the openings provided in the insulating films 924 and 934. The common electrode 977 is provided over the insulating film 934 and formed using the same material and through the same steps as the connection terminal electrode 915 and the first electrode 930 in the pixel portion.

In this manner, the common connection portion can be manufactured in the same process as the switching element in the pixel portion 902.

The common electrode 977 is an electrode in contact with the conductive particles contained in the sealant, and is electrically connected to the second electrode 931 of the second substrate 906.

As illustrated in FIG. 31C, a common potential line 985 may be formed using the same material and through the same steps as the gate electrode of the transistor 910.

In the common connection portion in FIG. 31C, the common potential line 985 is provided under the gate insulating film 922 and the insulating films 924 and 934, and a plurality of openings are formed in the gate insulating film 922 and the insulating films 924 and 934 so as to overlap with the common potential line 985. These openings are formed by etching the insulating films 924 and 934 through the same steps as a contact hole which connects the first electrode 930 and one of the source electrode 971 and the drain electrode 973 of the transistor 910, and further selectively etching the gate insulating film 922.

Further, the common potential line 985 is connected to a common electrode 987 through the openings provided in the gate insulating film 922 and the insulating films 924 and 934. The common electrode 987 is provided over the insulating film 934 and formed using the same material and through the same steps as the connection terminal electrode 915 and the first electrode 930 in the pixel portion.

As described above, when the transistor and the capacitor shown in the above embodiment are used, a semiconductor device including the capacitor with increased charge capacity can be manufactured while the aperture ratio is improved. As a result, the semiconductor device with excellent display quality can be obtained.

Furthermore, the oxide semiconductor film that is the semiconductor film in the transistor includes reduced oxygen vacancies and impurities such as hydrogen; accordingly, the semiconductor device of one embodiment of the present invention has good electrical characteristics.

Note that this embodiment can be combined with any of the other embodiments shown in this specification.

Embodiment 6

In this embodiment, a structure of an information processor capable of image processing and displaying, to which the semiconductor device of one embodiment of the present invention can be applied, will be described with reference to FIG. 32 and FIGS. 33A-1, 33A-2, 33B-1, and 33B-2.

Specifically, description is made on an information processor which has a first mode in which a G signal for selecting a pixel is output at a rate of 30 Hz (30 times per second) or more, preferably more than or equal to 60 Hz (60 times per second) and less than 960 Hz (960 times per second) and a second mode in which the G signal is output at a rate of more than or equal to 11.6 µHz (once per day) and less than 0.1 Hz (0.1 times per second), preferably more than or equal to 0.28 µHz (once per hour) and less than 1 Hz (once per second).

When a still image is displayed with the information processor of one embodiment of the present invention, the refresh rate can be set to less than 1 Hz, preferably less than or equal to 0.2 Hz. This enables eye-friendly display, i.e., display which causes less eye fatigue of a user or display which does not put strain on the user's eyes. Further, a display image can be refreshed at an optimal rate in accordance with the quality of the image displayed on the display portion. Specifically, in displaying a still image, the refresh rate can be set lower than that in displaying a smooth moving image; thus, a still image with less flicker can be displayed and power consumption can be reduced.

Figure 32:
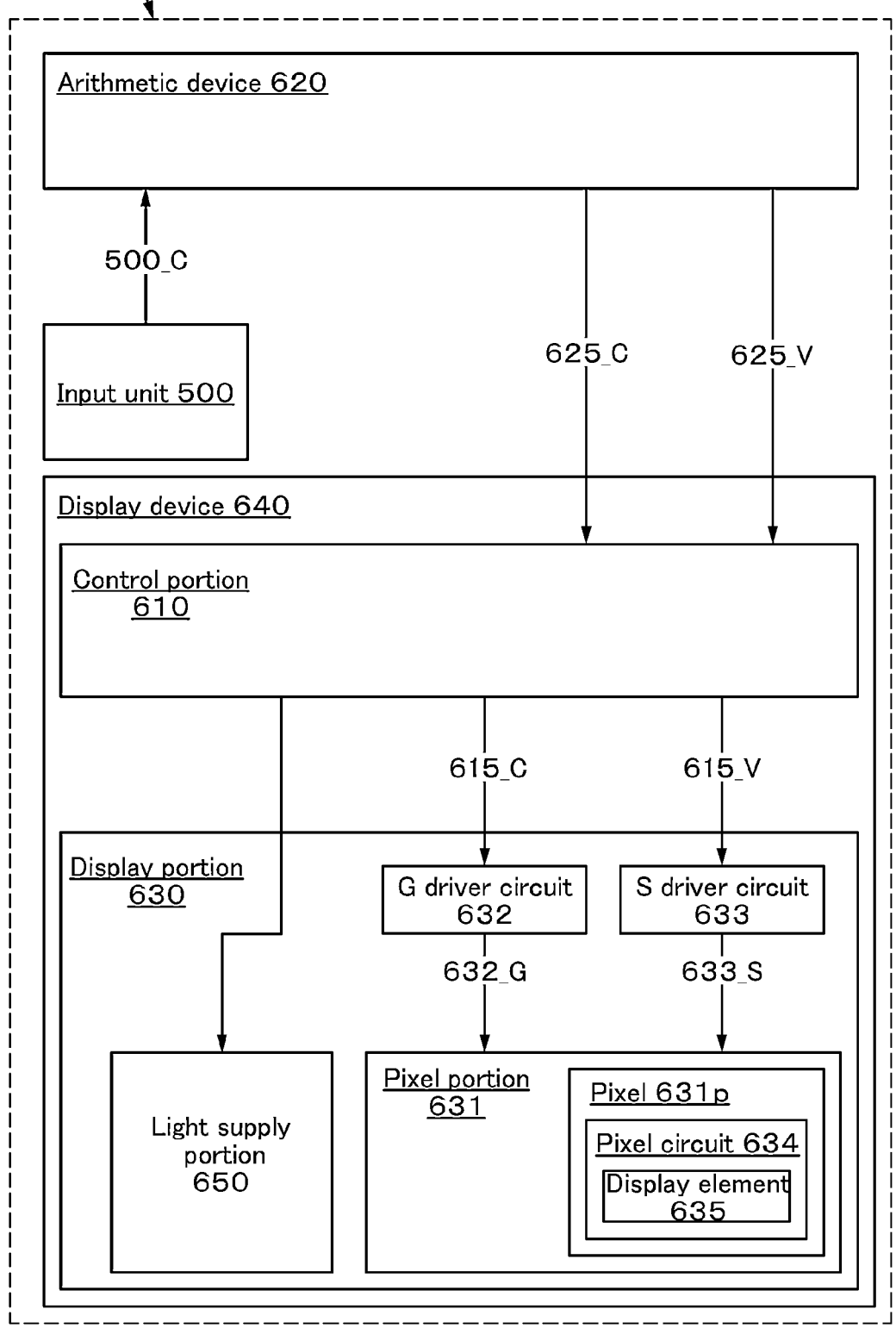
FIG. 32 shows a block diagram illustrating a configuration of an information processor having a display function.

FIG. 32 shows a block diagram of a structure of an information processor with a display function of one embodiment of the present invention.

FIGS. 33A-1 and 33A-2 show block diagrams each showing a structure of a display portion of a display device of one embodiment of the present invention.

An information processor 600 with a display function, which is described in this embodiment, includes a display device 640, an arithmetic device 620, and an input unit 500 (see FIG. 32).

The display device 640 includes a display portion 630 and a control portion 610 (see FIG. 32). A primary image signal 625_V and a primary control signal 625_C can be input to the display device 640. In the display device 640, image information can be displayed on the display portion 630.

The primary image signal 625_V includes grayscale information (also can be referred to as luminance information) and chromaticity information on an image, for example.

The primary control signal 625_C includes a signal for controlling the timing of scan operation of the display device 640, for example.

Note that a power supply potential or the like is supplied to the control portion 610 and the display portion 630 in the display device 640.

The control portion 610 has a function of controlling the display portion 630. For example, a secondary image signal 615_V and/or a secondary control signal 615_C are generated in the control portion 610.

The control portion 610 may include a polarity determination circuit. The polarity determination circuit allows the polarity of a signal to be inverted every frame.

The polarity determination circuit may notify the timing at which the polarity of the secondary image signal 615_V is to be inverted, and the control portion 610 may be configured to invert the polarity of the secondary image signal 615_V at the notified timing. Note that the polarity of the secondary image signal 615_V may be inverted in the control portion 610, or may be inverted in the display portion 630 in accordance with an instruction from the control portion 610.

The polarity determination circuit may include a counter and a signal generation circuit, so that the timing of inverting the polarity of the secondary image signal 615_V is determined by using a synchronization signal.

The counter has a function of counting the number of frame periods by using the pulse of a horizontal synchronizing signal. The signal generation circuit has a function of notifying the timing of inverting the polarity of the secondary image signal 615_V to the control portion 610. This enables the polarity of the secondary image signal 615_V to be inverted every several consecutive frame periods by using information on the number of frame periods obtained by the counter.

Image information can be included in the secondary image signal 615_V.

For example, the secondary image signal 615_V may be generated from the primary image signal 625_V in the control portion 610, and then output from the control portion 610.

Alternatively, in the control portion 610, the secondary image signal 615_V can be generated so as to have a polarity inverted every frame and an amplitude equal to the difference between the potential of the primary image signal 625_V and a reference potential Vsc.

The secondary control signal 615_C can include a signal for controlling a first driver circuit (also referred to as a G driver circuit 632) of the display portion 630 or a signal for controlling a second driver circuit (also referred to as an S driver circuit 633) of the display portion 630.

For example, the control portion 610 may generate the secondary control signal 615_C from the primary control signal 625_C including a synchronizing signal such as a vertical synchronizing signal or a horizontal synchronizing signal.

The secondary control signal 615_C includes, for example, a start pulse signal SP, a latch signal LP, a pulse width control signal PWC, and a clock signal CK.

Specifically, the secondary control signal 615_C includes an S driver circuit start pulse signal SP, an S driver circuit clock signal CK, a latch signal LP, and the like that control the operation of the S driver circuit 633. The secondary control signal 615_C can also include a G driver circuit start pulse signal SP, a G driver circuit clock signal CK, a pulse width control signal PWC, and the like that control the operation of the G driver circuit 632.

The display portion 630 includes a pixel portion 631, a first driver circuit (also referred to as the G driver circuit 632), and a second driver circuit (also referred to as the S driver circuit 633).

The pixel portion 631 does not include light with a wavelength shorter than 420 nm as display light and includes a plurality of pixels 631p arranged at a resolution of 150 ppi or more and wirings that connect the plurality of pixels 631p. Each of the plurality of pixels 631p is connected to at least one of scan lines G and at least one of signal lines S. Note that the kinds and number of the wirings depend on the structure, number, and position of the pixel 631p.

For example, in the case where the pixels 631p are arranged in a matrix of x columns and y rows in the pixel portion 631, the signal lines S1 to Sx and scan lines G1 to Gy are provided in the pixel portion 631 (see FIG. 33A-1). The plurality of scan lines (G1 to Gy) can supply G signals to the respective rows. The plurality of signal lines (S1 to Sx) can supply S signals to the plurality of pixels.

The G driver circuit 632 can control the supply of a G signal 632_G and select the scan line G (see FIG. 32).

For example, the pixel portion 631 may be divided into a plurality of regions (specifically, a first region 631a, a second region 631b, and a third region 631c) to be driven (see FIG. 33A-2).

Each region can be provided with the plurality of pixels 631p, the plurality of scan lines G for selecting the pixels 631p row by row, and the plurality of signal lines S for supplying S signals 633_S to the selected pixels 631p.

In addition, a plurality of G driver circuits (specifically, a first G driver circuit 632a, a second G driver circuit 632b, and a third G driver circuit 632c) may be provided.

The G driver circuit can control the supply of a G signal 632_G and select the scan lines G in each region (specifically, the scan lines G1 to Gj in the first G driver circuit 632a, the scan lines Gj+1 to G2j in the second G driver circuit 632b, and the scan line G2j+1 to Gy in the third G driver circuit 632c).

The G driver circuit outputs the first driving signal (G signal) 632_G for selecting the pixel circuit 634 to the pixel circuit 634. The G driver circuit 632 has a first mode of outputting the G signal 632_G for selecting a scan line to each scan line at a rate of 30 Hz (30 times per second) or more, preferably more than or equal to 60 Hz (60 times per second) and less than 960 Hz (960 times per second) and a second mode of outputting the G signal 632_G to each scan line at a rate of more than or equal to 11.6 µHz (once per day) and less than 0.1 Hz (0.1 times per second), preferably more than or equal to 0.28 µHz (once per hour) and less than 1 Hz (once per second).

The G driver circuit 632 can be switched between the first mode and the second mode to be operated. For example, the G driver circuit 632 can be switched between the first mode and the second mode with the use of the secondary control signal 615_C including a mode switching signal or the G driver circuit start pulse signal included in the secondary control signal 615_C. Specifically, the frequency of output of the G driver circuit start pulse signal from the control portion 610 may be controlled.

The G signal 632_G is generated by the G driver circuit 632. The G signals 632_G are output to the pixels 631p in each row, whereby the pixels 631p are selected row by row.

The display portion 630 may include the S driver circuit 633. The S driver circuit generates a second driver signal (also referred to as an S signal 633_S) from the secondary image signal 615_V and controls the supply of the S signals 633_S to the signal lines S (specifically S1 to Sx).

The S signal 633_S includes grayscale information on an image and the like. The S signal 633_S is supplied to the pixel 631p selected by the G signal 632_G.

The pixel portion 631 includes the plurality of pixels 631p.

The pixel 631p includes a display element 635 and a pixel circuit 634 including the display element 635 (see FIG. 32).

The pixel circuit 634 holds the S signal 633_S supplied and displays some image data in the display element 635. The structure of the pixel circuit 634 can be selected in accordance with the kind or the driving method of the display element 635.

FIG. 33B-1 illustrates, as an example of the pixel circuit 634, a structure in which a liquid crystal element 635LC is used as the display element 635.

The pixel circuit 634 includes a transistor 634t including a gate electrode to which the G signal 632_G is input and a first electrode to which the S signal is input, and the liquid crystal element 635LC including a first electrode electrically connected to a second electrode of the transistor 634*t* and a second electrode to which a common potential is supplied.

The pixel circuit 634 includes the transistor 634*t* for controlling the supply of the S signal 633_S to the display element 635.

A gate of the transistor 634*t* is connected to any one of the scan lines G1 to Gy. One of a source and a drain of the transistor 634*t* is connected to any one of the signal lines S1 to Sx. The other of the source and the drain of the transistor 634*t* is connected to the first electrode of the display element 635.

In the pixel 631*p*, one transistor 634*t* is used as a switching element for controlling the input of the S signal 633_S to the pixel 631*p*. Alternatively, a plurality of transistors which serve as one switching element may be used in the pixel 631*p*. In that case, the plurality of transistors serving as one switching element may be connected to each other in parallel, in series, or in combination of parallel connection and series.

Note that the pixel 631*p* may further include a capacitor 634*c* for holding voltage between the first electrode and a second electrode of the liquid crystal element 635LC and another circuit element such as a transistor, a diode, a resistor, a capacitor, or an inductor as needed. A predetermined common potential Vcom is applied to the second electrode of the display element 635.

The capacitance of the capacitor 634*c* may be adjusted as appropriate. For example, in the second mode described later, the capacitor 634*c* is provided in the case where the S signal 633_S is held for a relatively long period (specifically, 1/60 sec or longer). The capacitance of the pixel circuit 634 can also be adjusted with a structure in which the capacitor 634*c* is not provided. Further, a virtual capacitor may be formed by a structure in which the first electrode and the second electrode of the liquid crystal element 635LC are provided to overlap with each other.

FIG. 33B-2 illustrates, as another example of the pixel circuit, a structure in which an EL element 635EL is used as the display element 635.

A pixel circuit 634EL includes a first transistor 634*t*_1 including a gate electrode to which the G signal 632_G is input, a first electrode to which the S signal is input, and a second electrode which is electrically connected to a first electrode of the capacitor 634*c*. The pixel circuit 634EL also includes a second transistor 634*t*_2 including a gate electrode electrically connected to a second electrode of the first transistor 634t_1, a first electrode electrically connected to a second electrode of the capacitor 634*c*, and a second electrode electrically connected to a first electrode of the EL element 635EL. A power supply potential is supplied to the second electrode of the capacitor 634*c* and the first electrode of the second transistor 634*t*_2, and a common potential is supplied to a second electrode of the EL element 635EL. Note that the difference between the power supply potential and the common potential is larger than the voltage at which the EL element 635EL starts to emit light.

In the pixel circuit 634, the transistor 634*t* controls whether to apply the potential of the signal line S to the first electrode of the display element 635.

Note that a transistor including an oxide semiconductor can be suitably used as the transistor in the display device of one embodiment of the present invention.

Embodiments 1 and 2 can be referred to for the details of the transistor including an oxide semiconductor.

A transistor including an oxide semiconductor film can have leakage current between a source and a drain in an off state (off-state current) much lower than that of a conventional transistor including silicon. By using a transistor with extremely low off-state current in a pixel portion of a display portion, frame frequency can be lowered while flicker is reduced.

Besides the liquid crystal element 635LC, any of a variety of display elements such as an OLED element generating electroluminescence when voltage is applied thereto and electronic ink utilizing electrophoresis can be used as the display element 635.

For example, the polarized light transmittance of the liquid crystal element 635LC can be controlled by the potential of the S signal 633_S; thus, gradation can be expressed.

For example, in the case where a transmissive liquid crystal element is used as the display element 635, a light supply portion 650 can be provided in the display portion 630. The light supply portion 650 includes a light source. The control portion 610 controls driving of the light source in the light supply portion 650. The light supply portion 650 supplies light to the pixel portion 631 including the liquid crystal element, and functions as a backlight.

The light source in the light supply portion 650 can be a cold cathode fluorescent lamp, a light-emitting diode (LED), an OLED element, or the like.

In particular, the intensity of blue light emitted from the light source is preferably weakened compared to that of light of any other color. Since blue light included in light emitted from the light source is not absorbed by the cornea and lens of the eye and reaches the retina, it is possible to reduce long-term effects of blue light on the retina (e.g., age-related macular degeneration), adverse effects of exposure to blue light until midnight on the circadian rhythm, and the like. Specifically, the light source preferably emits light that does not include light with a wavelength of 400 nm or shorter, preferably 420 nm or shorter, and more preferably 440 nm or shorter.

The pixel in the semiconductor device of one embodiment of the present invention absorbs and hardly transmits light with the above wavelength. Accordingly, even when a light source emits light with the above wavelength, the light with the above wavelength can be reduced or blocked by using the semiconductor device of one embodiment of the present invention.

The arithmetic device 620 generates the primary image signal 625_V and the primary control signal 625_C including a mode switching signal.

The mode switching signal may be generated by the order of a user of the information processor 600.

The user of the information processor 600 can give an order to switch display by using the input unit 500. The arithmetic device 620 may be configured to be supplied with an image switching signal 500_C and to output the primary control signal 625_C including the mode switching signal.

The primary control signal 625_C including a mode switching signal is supplied to the control portion 610 in the display device 640, and the secondary control signal 625_C including the mode switching signal is output from the control portion.

For example, when the primary control signal 625_C including the mode switching signal for switching the G driver circuit 632 from the second mode to the first mode is supplied to the G driver circuit 632, the G driver circuit 632 is switched from the second mode to the first mode. After that, the G driver circuit 632 outputs the G signal for at least one frame, and then switched to the second mode.

Specifically, the input unit 500 may be configured to output the image switching signal 500_C to the arithmetic device 620 when sensing a page turning operation.

The arithmetic device 620 generates the primary image signal 625_V including the page turning operation and outputs the primary image signal 625_V as well as the primary control signal 625_C including a mode switching signal.

The control portion 610 supplied with the primary image signal 625_V and the primary control signal 625_C supplies the secondary control signal 615_C including the mode switching signal and the secondary image signal 615_V for executing the page turning operation.

The G driver circuit 632 supplied with the secondary control signal 615_C including the mode switching signal is switched from the second mode to the first mode and outputs the G signal 632_G at a high rate.

The S driver circuit 633 supplied with the secondary image signal 615_V including the page turning operation outputs the S signal 633_S generated from the secondary image signal 615_V to the pixel circuit 634.

In this manner, many frame images including the page turning operation can be rewritten at high rate by the pixels 631p. As a result, images based on the secondary image signals 615_V for executing the page turning operation can be displayed smoothly.

The arithmetic device 620 may be configured to determine whether an image based on the primary image signal 625_V output to the display portion 630 is a moving image or a still image and to output the primary control signal 625_C including the mode switching signal in accordance with the determination result.

Specifically, the arithmetic device 620 outputs a switching signal for selecting the first mode when the image based on the primary image signal 625_V is a moving image, and outputs a switching signal for selecting the second mode when the image based on the primary image signal 625_V is a still image.

A method for determining whether the image based on the primary image signal is a moving image or a still image is as follows. Signals for one frame included in the primary image signal 625_V are compared with signals for the previous frame and the next frame. It is determined that the image is a moving image when the difference between the signals is greater than a predetermined difference, and it is determined that the image is a still image in other cases.

When the control portion 610 switches the operating mode of the G driver circuit from one mode to another mode (e.g., from the second mode to the first mode), the G driver circuit may be configured to output the G signals 632_G one or more predetermined times, and then be switched to the other mode.

As the input unit 500, a touch panel, a touch pad, a mouse, a finger joystick, a trackball, a data glove, or an imaging device can be used, for example. In the arithmetic device 620, an electric signal output from the input unit 500 can be associated with coordinates of a display portion. Accordingly, a user can input an instruction for processing information displayed on the display portion.

Examples of information input with the input unit 500 by a user are instructions for dragging an image displayed on the display portion to another position; for swiping a screen for turning a displayed image and displaying the next image; for scrolling a continuous image; for selecting a specific image; for pinching a screen for changing the size of a displayed image; and for inputting handwritten characters.

Note that illuminance is the amount of light incident on an irradiation surface per unit area and unit time, in which the spectral sensitivity of the eye is taken into consideration.

Note that this embodiment can be combined with any of the other embodiments shown in this specification.

Embodiment 7

In this embodiment, an information processing method of an information processor using the semiconductor device of one embodiment of the present invention will be described with reference to FIGS. 34A and 34B.

Specifically, description is made on a method for generating an image that can be displayed on the display portion of the information processor using the semiconductor device of one embodiment of the present invention. In particular, description is made on a method of switching images in an eye-friendly way when an image displayed on the display portion is changed into another image, that is, a method of switching images with less eye fatigue given to a user or a method of switching images without strain on the eyes of a user.

Figure 34A:
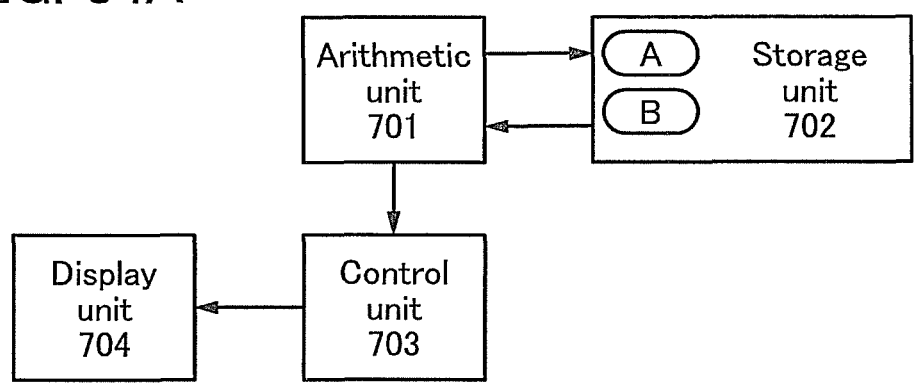
FIG. 34A shows a block diagram illustrating a structure of an information processor and FIG. 34B is a schematic view showing image data.
Figure 34B:
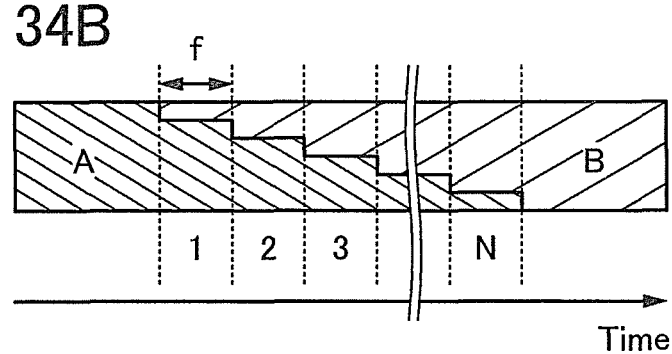

FIG. 34A shows a block diagram illustrating a structure of the information processor using the semiconductor device of one embodiment of the present invention, and FIG. 34B is a schematic view illustrating image data.

In one embodiment of the present invention, display images are smoothly switched in a display portion of the information processor.

The above structure reduces the strain put on the user's eyes when display images are switched. It is thus possible to provide a novel information processing method which enables eye-friendly display of an image including information processed by an arithmetic unit.

A user may feel eye fatigue when images are rapidly switched and displayed, for example, when scenes are switched frequently in a moving image or when a still image is switched to a different still image.

When an image is switched to a different image, it is preferable that the images be switched not instantaneously but gradually (smoothly) and naturally.

For example, when a first still image is switched to a second still image, it is preferable to insert a moving image of the first still image fading out and/or a moving image of the second still image fading in between the first still image and the second still image. Alternatively, a moving image obtained by overlapping the first still image and the still second image may be inserted so that the second still image fades in at the same time when the first still image fades out (this technique is also referred to as cross-fading). Further alternatively, a moving image for displaying the process in which the first still image gradually changes into the second still image may be inserted (this technique is also referred to as morphing).

Note that a first still image may be displayed at a low refresh rate, followed by the display of an image for image switching at a high refresh rate, and then a second still image may be displayed at a low refresh rate.

An example of a method for switching between different images A and B will be described below.

FIG. 34A shows a block diagram illustrating a structure of a display portion in which images can be switched. The display portion illustrated in FIG. 34A includes an arithmetic unit 701, a storage unit 702, a control unit 703, and a display unit 704.

In a first step, data of the image A and data of the image B input from an external memory device or the like are stored in the storage unit 702 by the arithmetic unit 701.

In a second step, the arithmetic unit 701 sequentially generates new image data based on the data of the image A and the data of the image B in accordance with a predetermined number by which the image data is divided.

In a third step, the generated image data is output to the control unit 703. The control unit 703 makes the input image data be displayed on the display unit 704.

FIG. 34B shows a schematic view illustrating image data generated when images are gradually switched from the image A to the image B.

FIG. 34B shows the case where N pieces of image data (N is a natural number) are generated to be displayed between the image A and the image B and each piece of the image data is displayed for f frame periods (f is a natural number). Thus, it takes fxN frames to switch display from the image A to the image B.

Here, it is preferable that the above parameters such as N and f can be set freely by a user. The arithmetic unit 701 obtains these parameters in advance and generates image data in accordance with the parameters.

Image data generated for the i-th time (i is an integer of 1 to N) can be generated by weighting the data of the image A and the data of the image B and adding the weighted data. For example, when the luminance (gray level) of a pixel displaying the image A is denoted by a and that of the pixel displaying the image B is denoted by b, the luminance (gray level) c of the pixel displaying the image data generated for the i-th time is represented by Formula 1. Note that the gray level means a level of gradation displayed on the display portion. An image with gradation of only two levels, white and black, can be referred to as a two-level image. For example, a display portion of a conventional personal computer includes subpixels which display red, green, and blue. Signals for expressing gradation of 256 levels are input to the subpixels.

[FORMULA 1]

$$c = \frac{(N-i)a + ib}{N} \quad (1)$$

When the image data generated by the above method is used for switching the display from the image A to the image B, a discontinuous image can be switched gradually (smoothly) and naturally.

Note that in Formula 1, the case where a=0 in all the pixels corresponds to fade-in by which a black image is gradually switched to the image B. Moreover, the case where b=0 in all the pixels corresponds to fade-out by which the image A is gradually switched to a black image.

Although the method of switching images by temporarily overlapping two images is described above, a method without overlapping operation may be employed.

In the case where the image A is switched to the image B without overlapping the two images, a black image may be inserted between the image A and the image B. At this time, the above method of switching images may be employed when the image A changes into a black image and/or when a black image changes into the image B. Further, an image inserted between the image A and the image B is not limited to a black image, and may be a single-color image such as a white image or a multi-color image different from the image A and the image B.

When an image, particularly a single-color image such as a black image is inserted between the image A and the image B, the timing of image switching can be perceived by a user without causing a feeling of discomfort, so that images can be switched without making the user feel stress.

Note that this embodiment can be combined with any of the other embodiments shown in this specification.

Embodiment 8

In this embodiment, a structure of an information processor using the semiconductor device of one embodiment of the present invention will be described with reference to FIGS. 35A-1, 35A-2, 35B-1, and 35B-2, and FIG. 36.

FIGS. 35A-1, 35A-2, 35B-1, and 35B-2 show an effect of the information processor.

Figure 36:
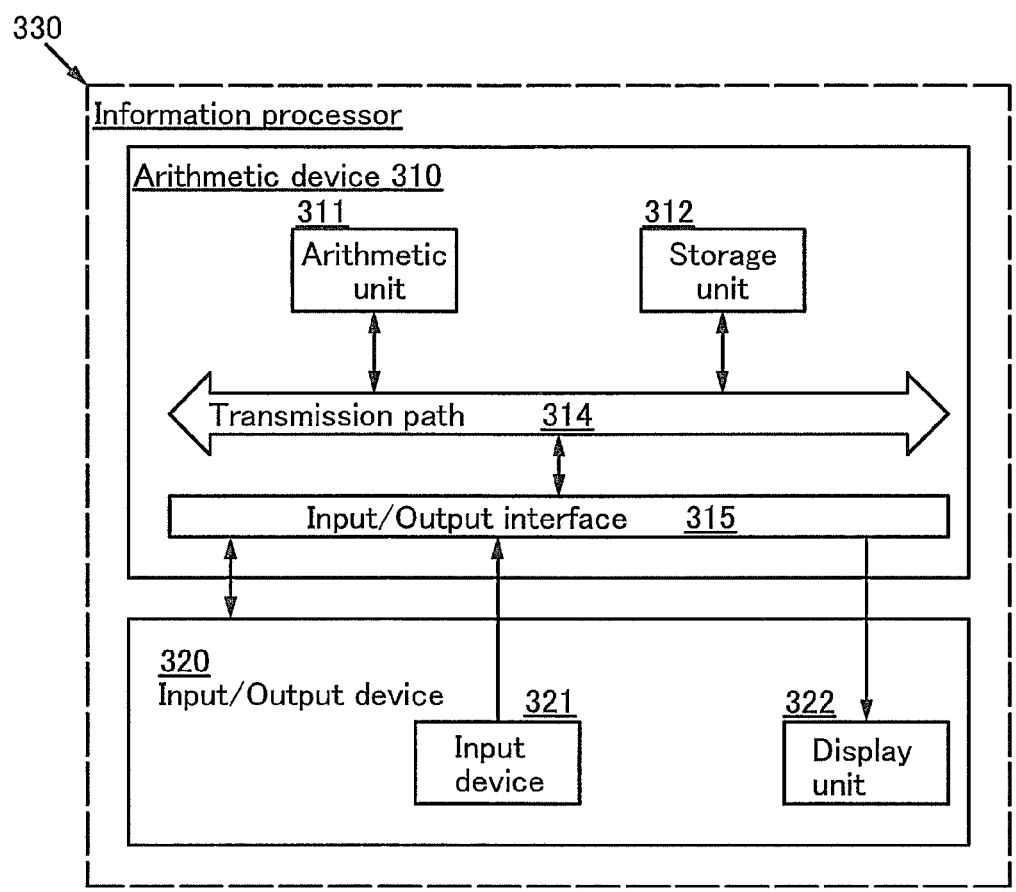
FIG. 36 shows a block diagram illustrating an information processor.

FIG. 36 shows a block diagram illustrating the structure of the information processor.

Eye fatigue is classified into two categories: nervous asthenopia and muscular asthenopia. The eye fatigue is explained using the schematic views of FIGS. 35A-1 and 35A-2.

Nervous asthenopia is caused when a user keeps looking at continuous or blinking light emitted from a display portion for a long time. This is because the brightness stimulates and fatigues the retina or nerve of the eye or the brain. Frequent blinking of fluorescent light or a display portion of a conventional display device, which is called flicker, causes nervous asthenopia.

Muscular asthenopia is fatigue caused by overuse of the ciliary muscle, which is used to adjust the focus.

FIG. 35A-1 shows a schematic view illustrating display on a conventional display portion. An image is rewritten 60 times per second in display on the conventional display portion. When a user keeps looking at such display for a long time, the retina or nerve of the eye or the brain may be stimulated and eye fatigue might be caused as a result.

In addition, as shown in FIG. 35A-2, when the size of each pixel is large (for example, when the resolution is less than 150 ppi), the outline of a character or the like displayed on the display portion is blurred. When a user keeps looking at the character or the like with a blurred outline displayed on the display portion for a long time, it remains difficult to focus the eye on the character even though the ciliary muscle constantly moves in order to focus the eye, which might put strain on the eye.

Methods for quantitatively measuring eye fatigue have been studied. For example, critical flicker (fusion) frequency (CFF) is known as an indicator for evaluating nervous asthenopia. Further, accommodation time, near point distance, and the like are known as indicators for evaluating muscular asthenopia.

Other methods for evaluating eye fatigue include electroencephalography, thermography, counting the number of times of blinking, measuring tear volume, measuring the speed of contractile response of the pupil, and questionnaires for surveying subjective symptoms.

In order to solve the above problem, one embodiment of the present invention focuses on the illuminance of working environment and the gray level of a background of image information displayed in a display device. The following embodiment includes one embodiment of the present invention which is made by focusing on the illuminance information of working environment and the gray level information of a background of image information.

A method for processing and displaying image information of one embodiment of the present invention includes the step of acquiring information on the illuminance of environment and information on the gray level of a background of image information displayed on a display portion; and the step of displaying, with use of the acquired information, the image information on a display portion which includes a plurality of pixels with a resolution of 150 ppi or more and emits light with a wavelength of 420 nm or longer. As a result, the image information can be displayed in accordance with the illuminance of environment. It is thus possible to provide a novel method for processing and displaying image information, which is capable of image information processing and eye-friendly display.

FIG. 36 shows an example of a block diagram of an information processor capable of employing the method for processing and displaying image information of one embodiment of the present invention.

An information processor 330 includes an arithmetic unit 311, a storage unit 312, and a transmission path 314. The transmission path 314 connects the arithmetic unit 311, the storage unit 312, and an input/output interface 315 to each other and transmits information. Note that these units can not be clearly distinguished and one unit also serves as another unit or include part of another unit in some cases. For example, a touch panel is an input unit as well as a display unit.

An input/output device 320 is connected to the transmission path 314 via the input/output interface 315. The input/output device 320 is a device for inputting information to an arithmetic device 310 from the outside or outputting information from the arithmetic device 310.

Examples of the input/output device 320 include a communication device, a network connection device, and a writable external memory device such as a hard disk or a removable memory.

Examples of an input device 321 include a human interface device such as a keyboard, a pointing device (e.g., a mouse), or a touch panel, a camera such as a digital camera or a digital video camera, a scanner, and a read-only external memory device such as a CD-ROM or a DVD-ROM. For example, a user of the information processor 330 can input a page turning instruction or the like with use of the input device 321.

A display unit 322, a speaker, a printer, and the like can be connected as the output device.

The information processor 330 of one embodiment of the present invention includes the display unit 322. In particular, display light of the display unit 322 does not include light with a wavelength shorter than 420 nm, preferably shorter than 440 nm A display portion includes a plurality of pixels with a resolution of 150 ppi or more, preferably 200 ppi or more. This enables eye-friendly display. Note that in this specification, the display light refers to light emitted from or reflected on a display unit of an information processor so that a user can see displayed images.

The display light of the display unit of one embodiment of the present invention is not absorbed by the cornea and lens of the eye and reaches the retina, and therefore does not include light having long-term effects on the retina or adverse effects on the circadian rhythm. Specifically, light for displaying images does not include light with a wavelength of 400 nm or shorter, preferably 420 nm or shorter, and more preferably 440 nm or shorter.

The semiconductor device of one embodiment of the present invention can be used for the information processor 330 of one embodiment of the present invention. The pixel in the semiconductor device absorbs and hardly transmits light with the above wavelength. Accordingly, even when a light source emits light with the above wavelength, the light with the above wavelength can be reduced or blocked by using the semiconductor device of one embodiment of the present invention.

In addition, the display portion of one embodiment of the present invention includes pixels with a resolution of 150 ppi or more, preferably 200 ppi or more, that is, each pixel has a small size. This allows muscular asthenopia of the user's eyes to be reduced.

FIGS. 35B-1 and 35B-2 show schematic views illustrating an effect of reducing the eye fatigue in the information processor of one embodiment of the present invention.

In the information processor of one embodiment of the present invention, the rate at which a signal for selecting a pixel is output can be changed. In particular, when a transistor with extremely low off-state current is used in a pixel portion of a display portion, frame frequency can be lowered while flicker is reduced. For example, an image can be rewritten as less frequently as once every five seconds. This enables the user to see the same one image as long as possible, so that flicker on the screen recognized by the user is reduced. Thus, stimuli to the retina or nerve of the eye or the brain of the user are reduced, and nervous asthenopia is reduced accordingly (see FIG. 35B-1).

Note that a transistor including an oxide semiconductor, particularly a transistor including a CAAC-OS is suitably used as a transistor with extremely low off-state current.

Each pixel in the information processor of one embodiment of the present invention has a small size. Specifically, resolution as high as 150 ppi or more, preferably 200 ppi or more can be achieved. It is also possible to display precise and smooth images with a clear outline, which allows ciliary muscles to adjust the focus more easily, and reduces muscular asthenopia of users (see FIG. 35B-2). Note that resolution can be expressed by pixel density (pixel per inch (ppi)). Pixel density is the number of pixels per inch. A pixel is a unit composing an image.

Note that this embodiment can be combined with any of the other embodiments shown in this specification.

Embodiment 9

The semiconductor device of one embodiment of the present invention can be applied to a variety of electronic devices (including game machines). Examples of the electronic devices include a television device, a monitor of a computer or the like, a digital camera, a digital video camera, a digital photo frame, a mobile phone, a game console, a portable game machine, a portable information terminal, an audio reproducing device, and a game machine (e.g., a pachinko machine or a slot machine). Examples of such electronic devices are illustrated in FIGS. 37A to 37C and FIGS. 38A and 38B.

Figure 37A:
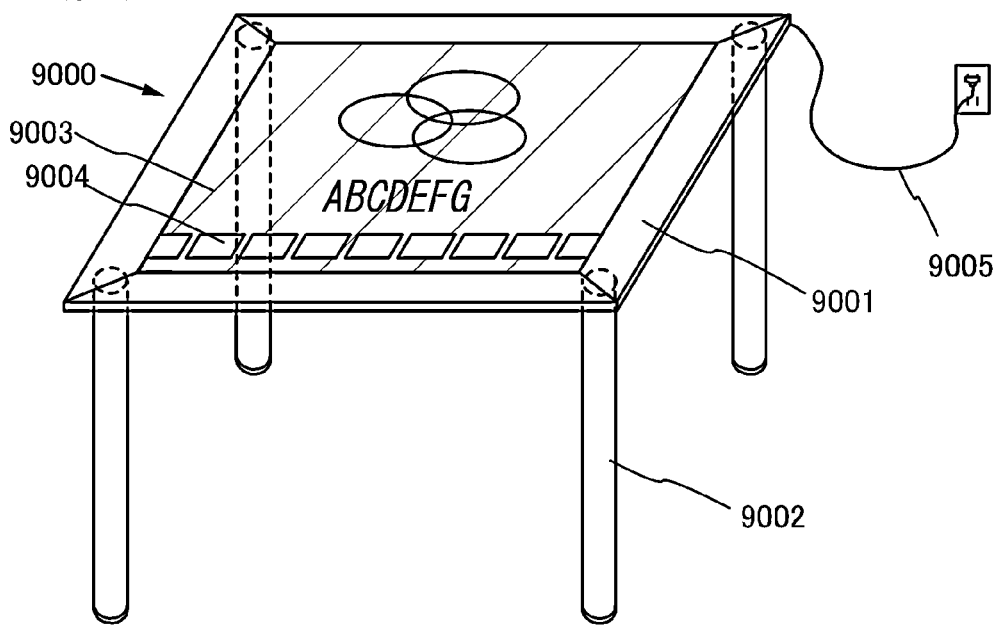
FIGS. 37A to 37C show electronic devices using a semiconductor device.

FIG. 37A illustrates a table having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003. Thus, the display portion 9003 can have high display quality.

The display portion 9003 has a touch-input function. When a user touches buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of a semiconductor device having a touch sensor function or an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 37B:
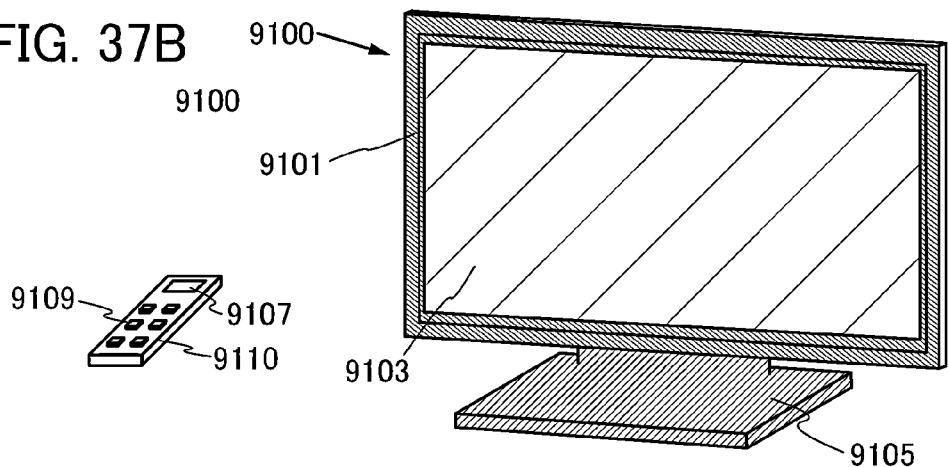

FIG. 37B illustrates a television device. In a television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 37B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

The semiconductor device described in any of the above embodiments can be used for the display portions 9103 and 9107. Thus, the television set can have high display quality.

Figure 37C:
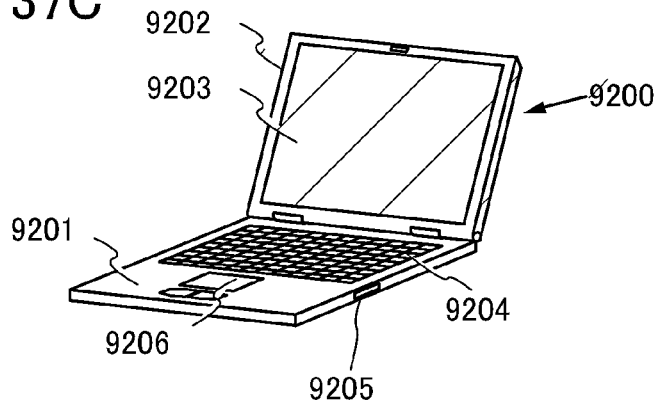

FIG. 37C illustrates a computer 9200, which includes a main body 9201, a housing 9202, a display portion 9203, a keyboard 9204, an external connection port 9205, a pointing device 9206, and the like.

The semiconductor device described in any of the above embodiments can be used for the display portion 9203. Thus, the computer 9200 can have high display quality.

The display portion 9203 has a touch-input function. When a user touches buttons and the like which are displayed on the display portion 9203 with his/her fingers or the like, the user can carry out operation on the screen and input of information. Furthermore, information can be input using a keyboard or voice input.

Figure 38A:
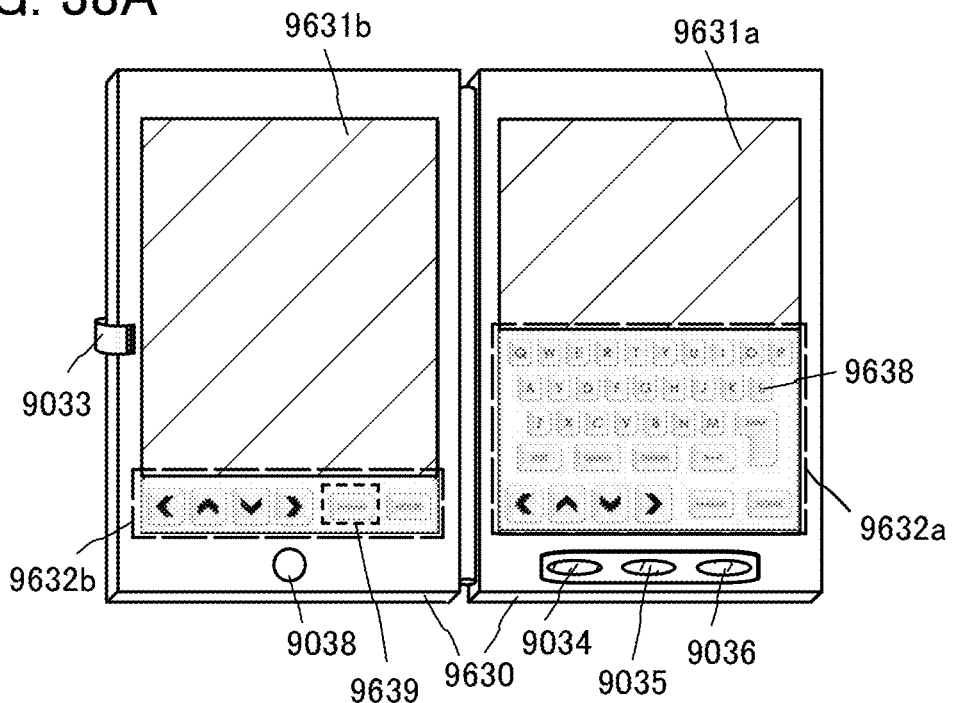
FIGS. 38A and 38B show an electronic device using a semiconductor device.
Figure 38B:
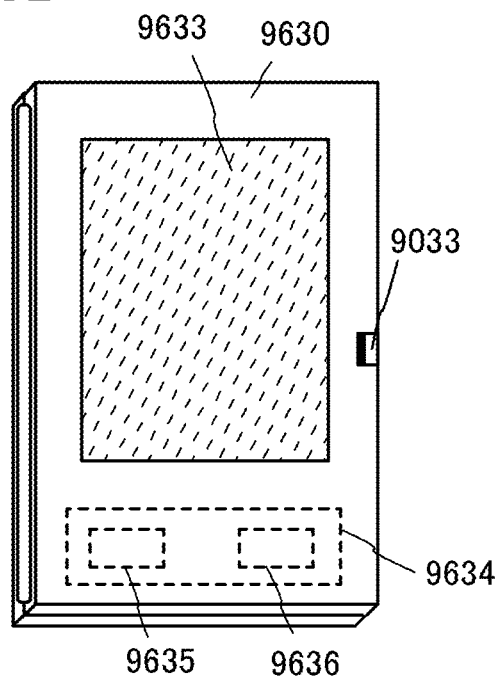

FIGS. 38A and 38B illustrate a foldable tablet terminal. In FIG. 38A, the tablet terminal is opened and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used for the display portion 9631a and the display portion 9631b. Thus, the display quality of the tablet terminal can be improved.

Part of the display portion 9631a can be a touch panel region 9632a and data can be input when a displayed operation key 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch panel function. For example, the whole area of the display portion 9631a can display keyboard buttons and serve as a touch screen while the display portion 9631b can be used as a display screen.

Like the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed concurrently on the touch panel regions 9632a and 9632b.

The display-mode switching button 9034 can switch display orientation (e.g., between landscape mode and portrait mode) and select a display mode (switch between monochrome display and color display), for example. The power-saving-mode switching button 9036 can control display luminance in accordance with the amount of external light in use of the tablet terminal detected by an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 38A, one embodiment of the present invention is not limited to this example. The display portion 9631a and the display portion 9631b may have different areas or different display quality. For example, one of them may be a display panel that can display higher-definition images than the other.

In FIG. 38B, the tablet terminal is folded and includes the housing 9630, a solar cell 9633, and a charge and discharge control circuit 9634. Note that FIG. 38B illustrates an example in which the charge and discharge control circuit 9634 includes the battery 9635 and the DCDC converter 9636.

Since the tablet terminal can be folded in two, the housing 9630 can be closed when not in use. Thus, the display portions 9631a and 9631b can be protected, thereby providing a tablet with high endurance and high reliability for long-term use.

In addition, the tablet terminal illustrated in FIGS. 38A and 38B can have a function of displaying various kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch screen, a display portion, an image signal processor, and the like. Note that the solar cell 9633 can be provided on one or both surfaces of the housing 9630, so that the battery 9635 can be charged efficiently. The use of a lithium ion battery as the battery 9635 is advantageous in downsizing or the like.

Figure 39A:
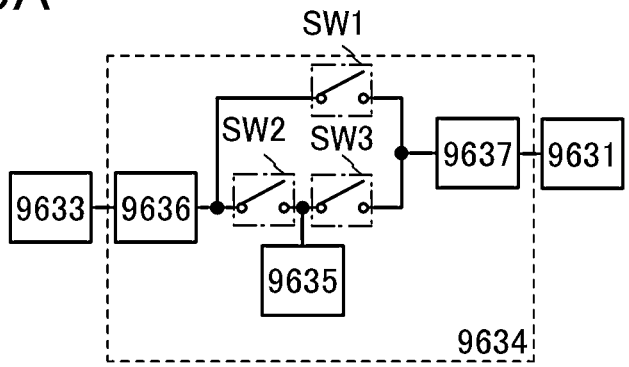
FIGS. 39A to 39C show electronic devices using a semiconductor device.

The structure and operation of the charge and discharge control circuit 9634 illustrated in FIG. 38B are described with reference to block diagrams of FIGS. 39A to 39C. FIG. 39A illustrates the solar cell 9633, the battery 9635, the DCDC converter 9636, a DCDC converter 9637, switches SW1 to SW3, and a load (e.g., the display portion 9631), and the battery 9635, the DCDC converter 9636, the DCDC converter 9637, and the switches SW1 to SW3 correspond to the charge/discharge control circuit 9634 in FIG. 38B.

First, an example of the operation in which power is generated by the solar cell 9633 will be described. The voltage of power generated by the solar cell 9633 is raised or lowered by the DCDC converter 9636 so that a voltage for charging the battery 9635 is obtained. When the load (e.g., the display portion 9631) is operated with the power from the solar cell 9633, the switch SW1 is turned on and the voltage of the power is raised or lowered by the DCDC converter 9637 to a voltage needed for operating the load (e.g., the display portion 9631). In addition, when no power is supplied to the load (e.g., the display portion 9631), the switch SW1 is turned off and the switch SW2 is turned on so that the battery 9635 is charged.

Figure 39B:
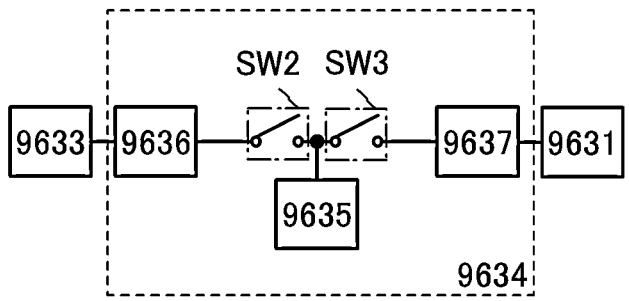

In the case where power is always supplied to the load (e.g., the display portion 9631) through the battery 9635, the switch SW1 may be omitted as illustrated in FIG. 39B.

Figure 39C:
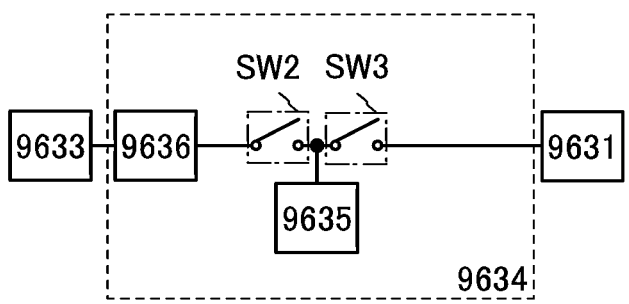

Further, in the case where the voltage supplied to the load is in the range equivalent to the voltage of the battery 9635, the DCDC converter 9637 may also be omitted as illustrated in FIG. 39C.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Note that this embodiment can be combined with any of the other embodiments shown in this specification.

This application is based on Japanese Patent Application serial No. 2012-288968 filed with Japan Patent Office on Dec. 28, 2012, and Japanese Patent Application serial No. 2013-049065 filed with Japan Patent Office on Mar. 12, 2013, the entire contents of which are hereby incorporated by reference.

What is claimed is:

1. A semiconductor device comprising a capacitor element, comprising:
   a first insulating layer including nitrogen;
   a gate electrode layer over the first insulating layer;
   a second insulating layer over the gate electrode layer;
   a first oxide semiconductor layer over the second insulating layer, the first oxide semiconductor layer overlapping with the gate electrode layer;
   a second oxide semiconductor layer over and in contact with the first insulating layer;
   a source electrode layer and a drain electrode layer electrically connected to the first oxide semiconductor layer;
   a third insulating layer over and in contact with the first oxide semiconductor layer and the second oxide semiconductor layer; and
   a transparent conductive layer over the third insulating layer, the transparent conductive layer overlapping with the second oxide semiconductor layer,
   wherein one of electrodes of the capacitor element is the second oxide semiconductor layer.

2. The semiconductor device according to claim 1, wherein the other of the electrodes of the capacitor element is the transparent conductive layer.

3. The semiconductor device according to claim 1, wherein the first oxide semiconductor layer and the second oxide semiconductor layer include the same material.

4. The semiconductor device according to claim 1, wherein the first oxide semiconductor layer and the second oxide semiconductor layer have an energy gap of 2.0 eV or more.

5. The semiconductor device according to claim 1, wherein the first insulating layer includes a nitride insulating material selected from silicon nitride oxide, silicon nitride, aluminum nitride, and aluminum nitride oxide.

6. The semiconductor device according to claim 1, wherein the first insulating layer further includes hydrogen.

7. The semiconductor device according to claim 1, wherein the third insulating layer includes an oxide insulating material selected from silicon oxide, silicon oxynitride, aluminum oxide, hafnium oxide, gallium oxide, and a Ga—Zn-based metal oxide.

8. The semiconductor device according to claim 1, further comprising a fourth insulating layer over the third insulating layer,
   wherein the fourth insulating layer includes a nitride insulating material selected from silicon nitride oxide, silicon nitride, aluminum nitride, and aluminum nitride oxide.

9. The semiconductor device according to claim 1, further comprising a wiring electrically connected to the second oxide semiconductor layer,
   wherein the wiring includes the same material as the gate electrode layer.

10. The semiconductor device according to claim 1, wherein the transparent conductive layer is electrically connected to one of the source electrode layer and the drain electrode layer.

11. A method for manufacturing a semiconductor device comprising a capacitor element, comprising the steps of:
   forming a first insulating layer including nitrogen;
   forming a gate electrode layer over the first insulating layer;
   forming a second insulating layer over the gate electrode layer;
   forming a first oxide semiconductor layer over the second insulating layer so as to overlap with the gate electrode layer;
   forming a second oxide semiconductor layer over and in contact with the first insulating layer;
   forming a source electrode layer and a drain electrode layer so as to be electrically connected to the first oxide semiconductor layer;
   forming a third insulating layer over and in contact with the first oxide semiconductor layer and the second oxide semiconductor layer; and
   forming a transparent conductive layer over the third insulating layer so as to overlap with the second oxide semiconductor layer,
   wherein one of electrodes of the capacitor element is the second oxide semiconductor layer.

12. The method for manufacturing a semiconductor device, according to claim 11, wherein the other of the electrodes of the capacitor element is the transparent conductive layer.

13. The method for manufacturing a semiconductor device, according to claim 11, wherein the first oxide semiconductor layer and the second oxide semiconductor layer include the same material.

14. The method for manufacturing a semiconductor device, according to claim 11, wherein the first oxide semiconductor layer and the second oxide semiconductor layer have an energy gap of 2.0 eV or more.

15. The method for manufacturing a semiconductor device, according to claim 11, wherein the first insulating layer includes a nitride insulating material selected from silicon nitride oxide, silicon nitride, aluminum nitride, and aluminum nitride oxide.

16. The method for manufacturing a semiconductor device, according to claim 11, wherein the first insulating layer further includes hydrogen.

17. The method for manufacturing a semiconductor device, according to claim 11, wherein the third insulating layer includes an oxide insulating material selected from silicon oxide, silicon oxynitride, aluminum oxide, hafnium oxide, gallium oxide, and a Ga—Zn-based metal oxide.

18. The method for manufacturing a semiconductor device, according to claim 11, further comprising the step of forming a fourth insulating layer over the third insulating layer,
    wherein the fourth insulating layer includes a nitride insulating material selected from silicon nitride oxide, silicon nitride, aluminum nitride, and aluminum nitride oxide.

19. The method for manufacturing a semiconductor device, according to claim 11, further comprising the step of forming a wiring over the first insulating layer,
    wherein the wiring is electrically connected to the second oxide semiconductor layer,
    wherein the wiring includes the same material as the gate electrode layer.

20. The method for manufacturing a semiconductor device, according to claim 11, wherein the transparent conductive layer is electrically connected to one of the source electrode layer and the drain electrode layer.

* * * * *

UNITED STATES PATENT AND TRADEMARK OFFICE
CERTIFICATE OF CORRECTION

PATENT NO. : 9,196,639 B2  
APPLICATION NO. : 14/134371  
DATED : November 24, 2015  
INVENTOR(S) : Yuta Endo Page 1 of 1

It is certified that error appears in the above-identified patent and that said Letters Patent is hereby corrected as shown below:

Specification

At column 13, line 37, "bather" should be --barrier--;

At column 16, line 21, "30 nm" should be --30 nm.--;

At column 17, line 66, "600 nm" should be --600 nm.--;

At column 27, line 7, "40 nm" should be --40 nm.--;

At column 29, line 22, "10 nm" should be --10 nm.--;

At column 29, line 62, "40 nm," should be --40 nm.--;

At column 32, line 66, "(nc-OS, µac-OS)," should be --(nc-OS, µc-OS),--;

At column 34, line 23, "In Ga;" should be --In $\geq$ Ga;--;

At column 34, line 30, "In Ga," should be --In $\geq$ Ga,--;

At column 38, line 30, "50 nm" should be --50 nm.--;

At column 55, line 13, "fxN" should be --f × N--;

At column 57, line 43, "440 nm" should be --440 nm.--.

Signed and Sealed this  
Seventeenth Day of May, 2016

Michelle K. Lee  
*Director of the United States Patent and Trademark Office*